United States Patent
Yamamoto

(10) Patent No.: US 10,658,524 B2
(45) Date of Patent: May 19, 2020

(54) SCHOTTKY BARRIER DIODE

(71) Applicant: ROHM CO., LTD., Kyoto (JP)

(72) Inventor: Hiroki Yamamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 135 days.

(21) Appl. No.: 15/823,206

(22) Filed: Nov. 27, 2017

(65) Prior Publication Data
US 2018/0151756 A1    May 31, 2018

(30) Foreign Application Priority Data

Nov. 29, 2016 (JP) ................................. 2016-231798
Nov. 29, 2016 (JP) ................................. 2016-231799
Oct. 25, 2017 (JP) ................................. 2017-206209

(51) Int. Cl.
| | |
|---|---|
| *H01L 29/872* | (2006.01) |
| *H01L 29/06* | (2006.01) |
| *H01L 29/417* | (2006.01) |
| *H01L 29/66* | (2006.01) |

(52) U.S. Cl.
CPC ........ *H01L 29/872* (2013.01); *H01L 29/0657* (2013.01); *H01L 29/417* (2013.01); *H01L 29/66143* (2013.01); *H01L 29/0619* (2013.01)

(58) Field of Classification Search
CPC ....... H01L 29/872; H01L 29/87; H01L 29/06; H01L 29/0657; H01L 29/417; H01L 29/66; H01L 29/66143

USPC ......................................................... 257/471
See application file for complete search history.

(56) References Cited

U.S. PATENT DOCUMENTS

2009/0065888 A1*  3/2009  Kato ................... H01L 27/0629
                                                        257/476

FOREIGN PATENT DOCUMENTS

JP         2004-087555 A      3/2004

* cited by examiner

*Primary Examiner* — Fazli Erdem
(74) *Attorney, Agent, or Firm* — Rabin & Berdo, P.C.

(57) ABSTRACT

A Schottky barrier diode includes a semiconductor layer having a major surface, a diode region of a first conductivity type formed in a surface layer portion of the semiconductor layer, a first conductivity type impurity region formed in the surface layer portion of the semiconductor layer and electrically connected to the diode region, a first electrode layer formed on the major surface of the semiconductor layer and forming a Schottky junction with the diode region, a second electrode layer formed on the major surface of the semiconductor layer and forming an ohmic junction with the first conductivity type impurity region, and a contact electrode layer formed on a peripheral region of the major surface of the semiconductor layer surrounding the first electrode layer so as to be electrically connected to the diode region via the semiconductor layer and being electrically connected to the second electrode layer.

28 Claims, 46 Drawing Sheets

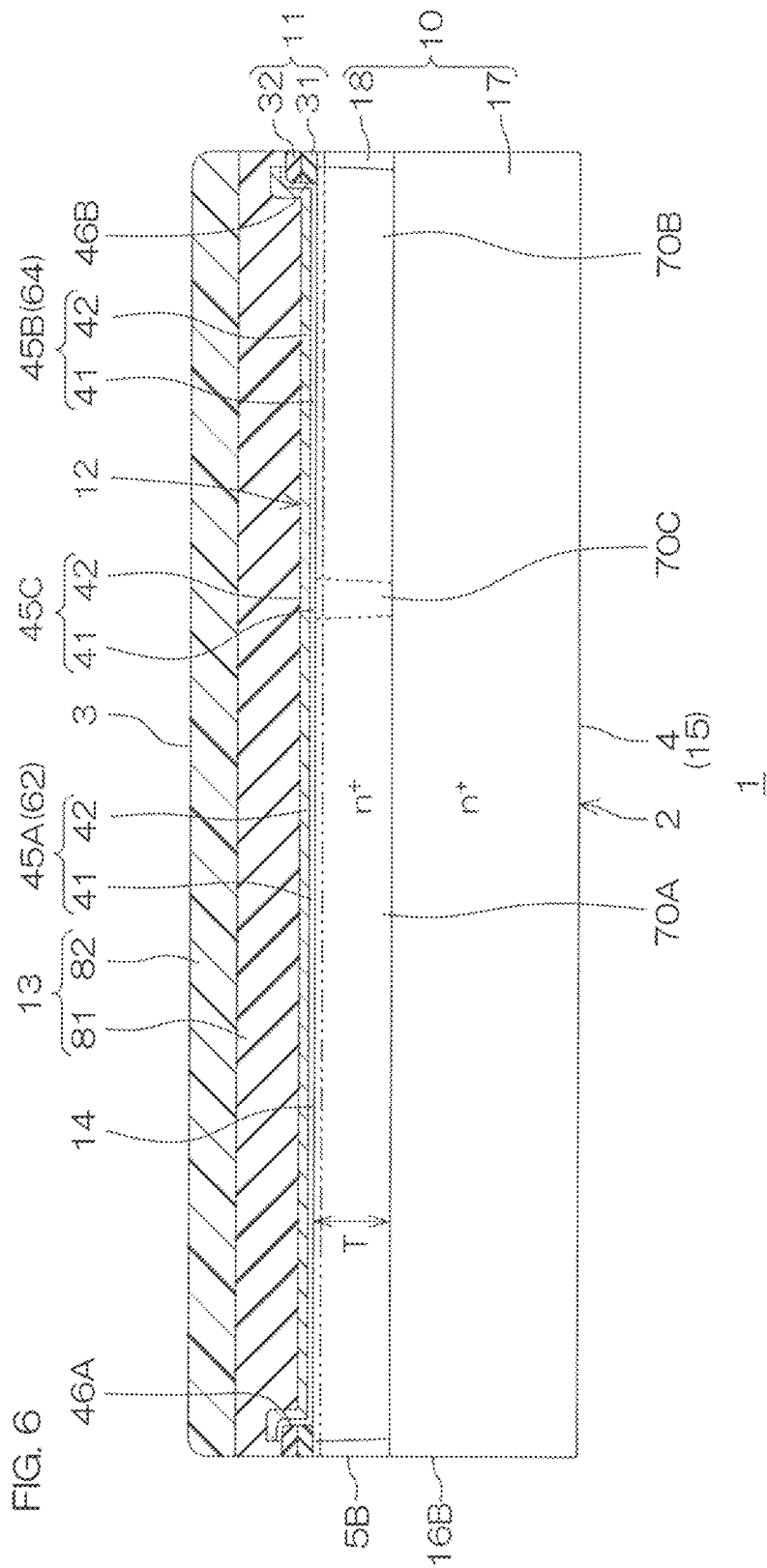

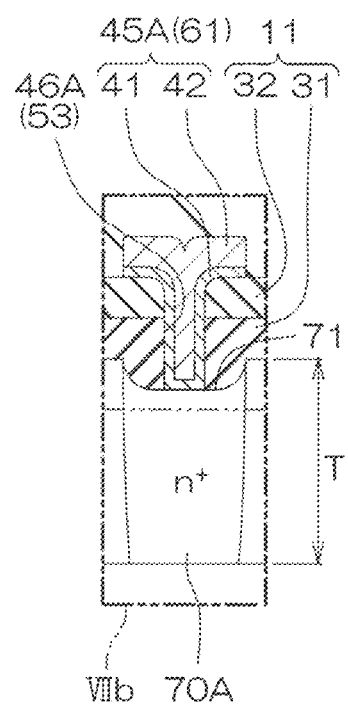

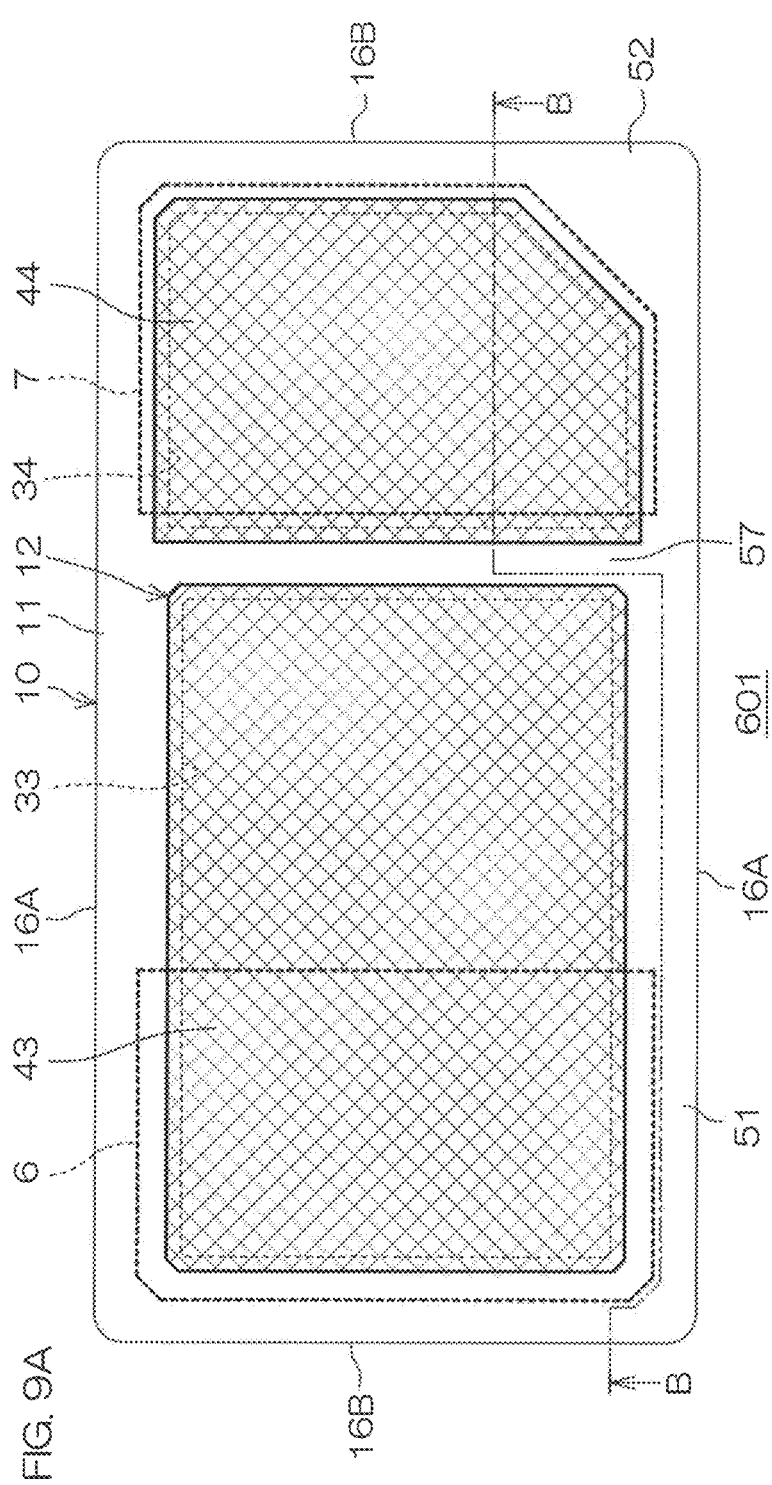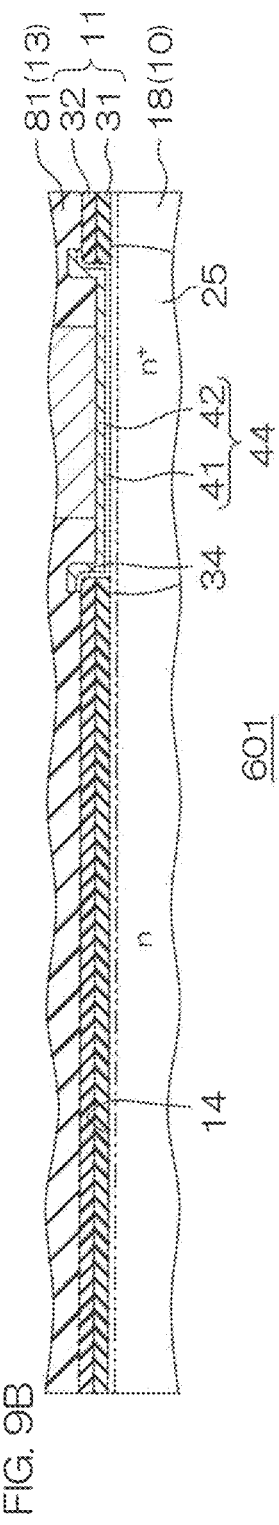

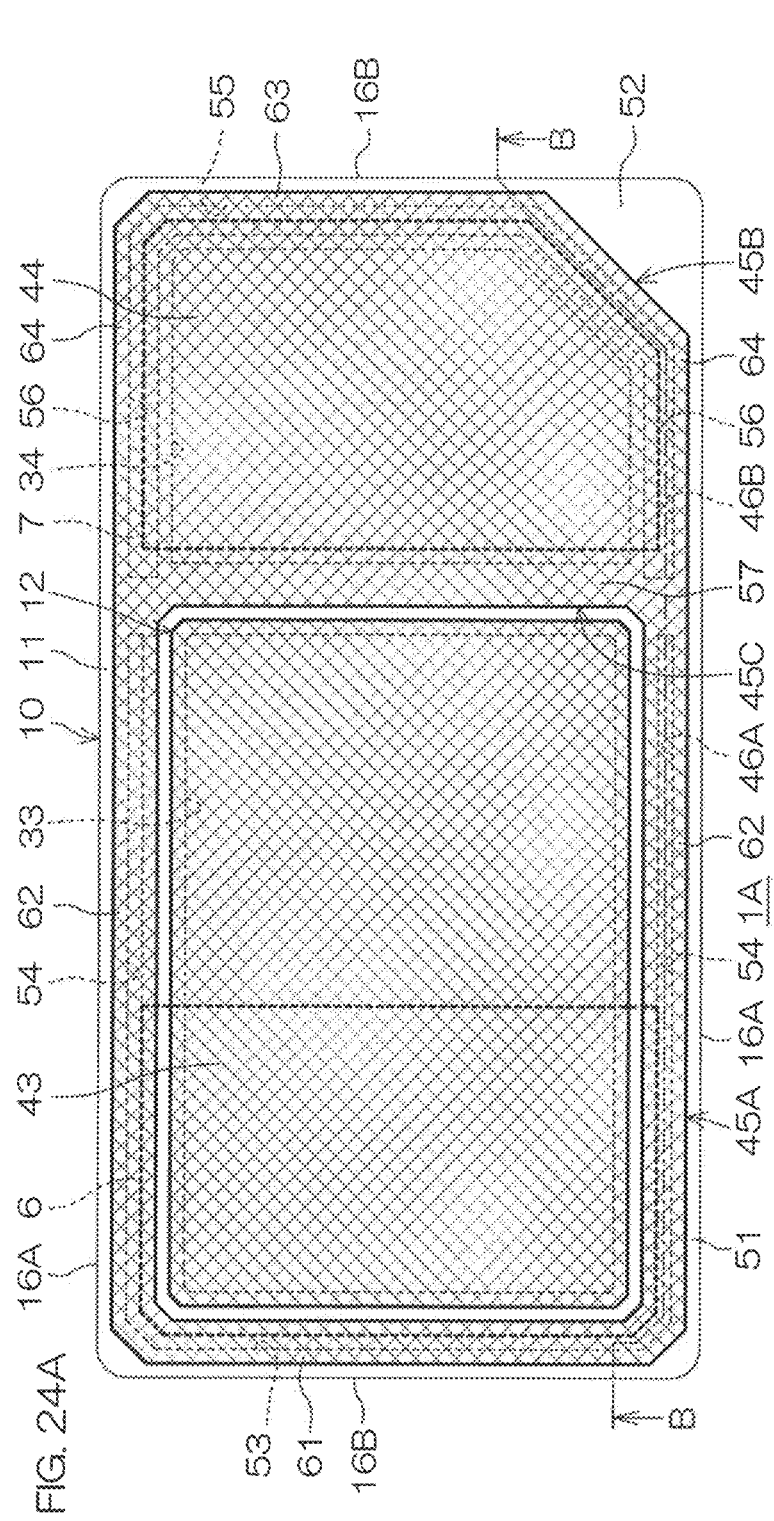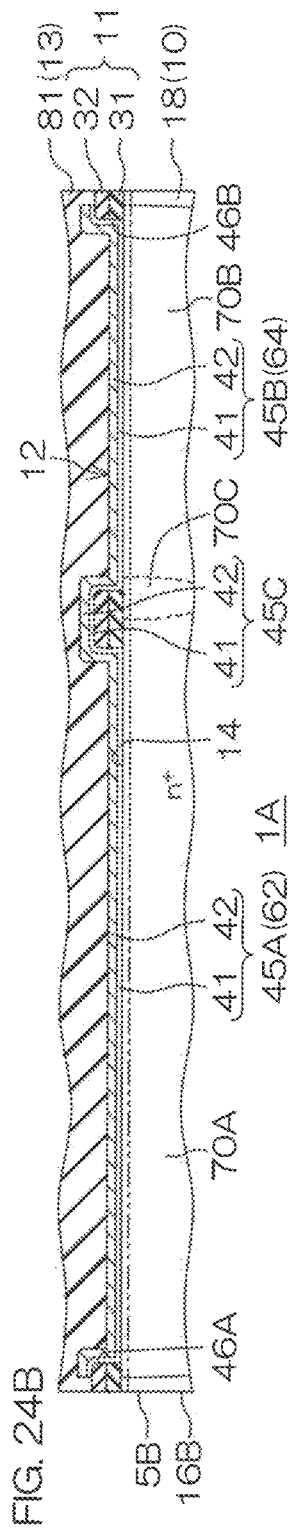

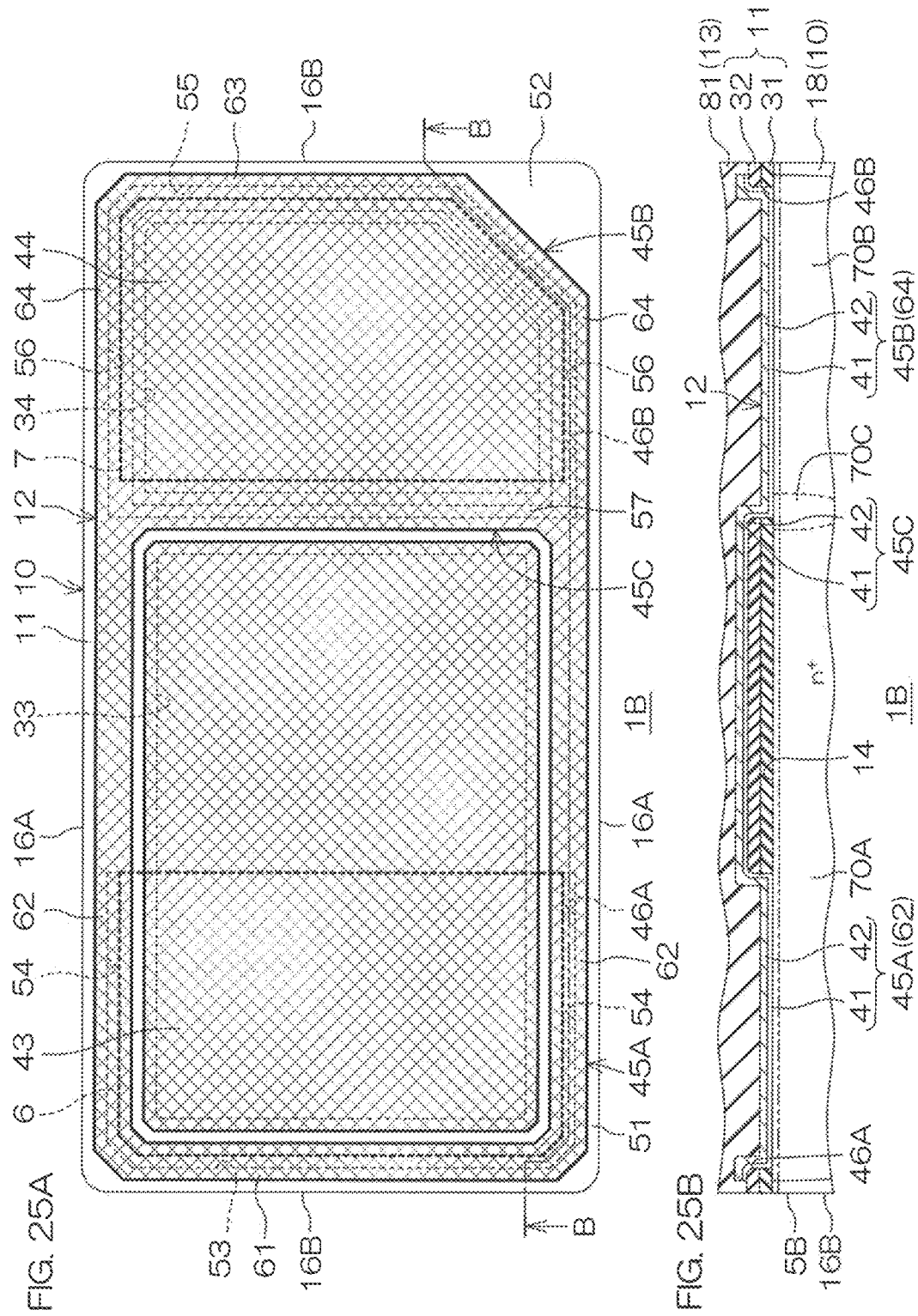

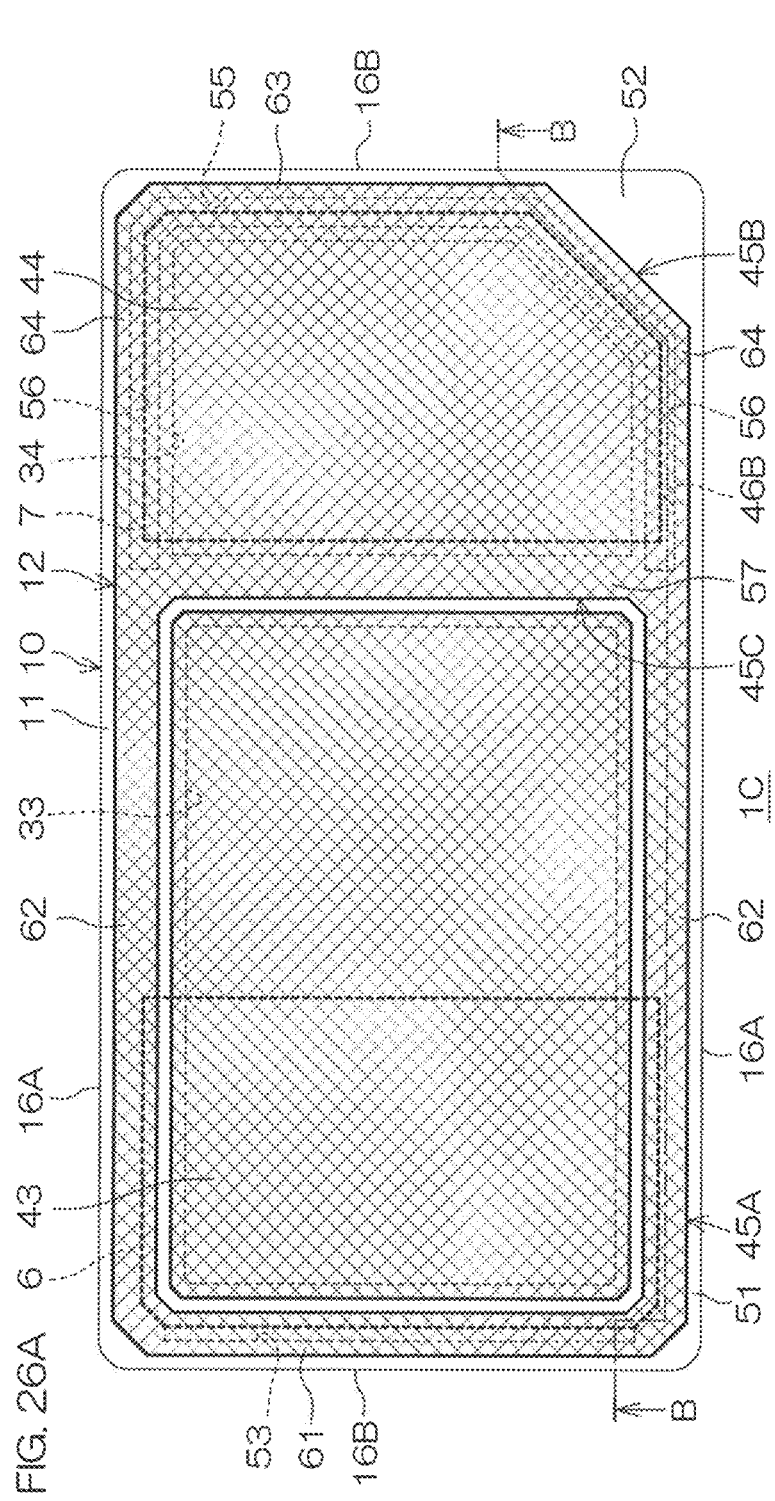
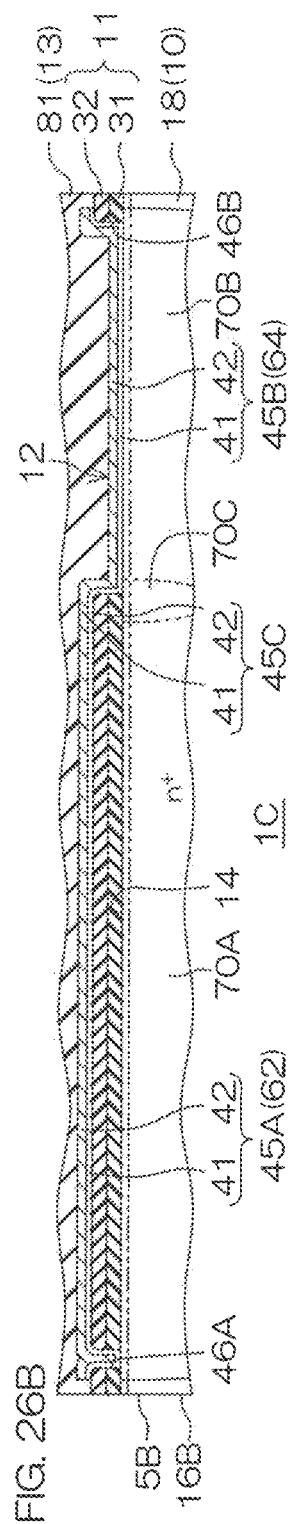
FIG. 26A
FIG. 26B

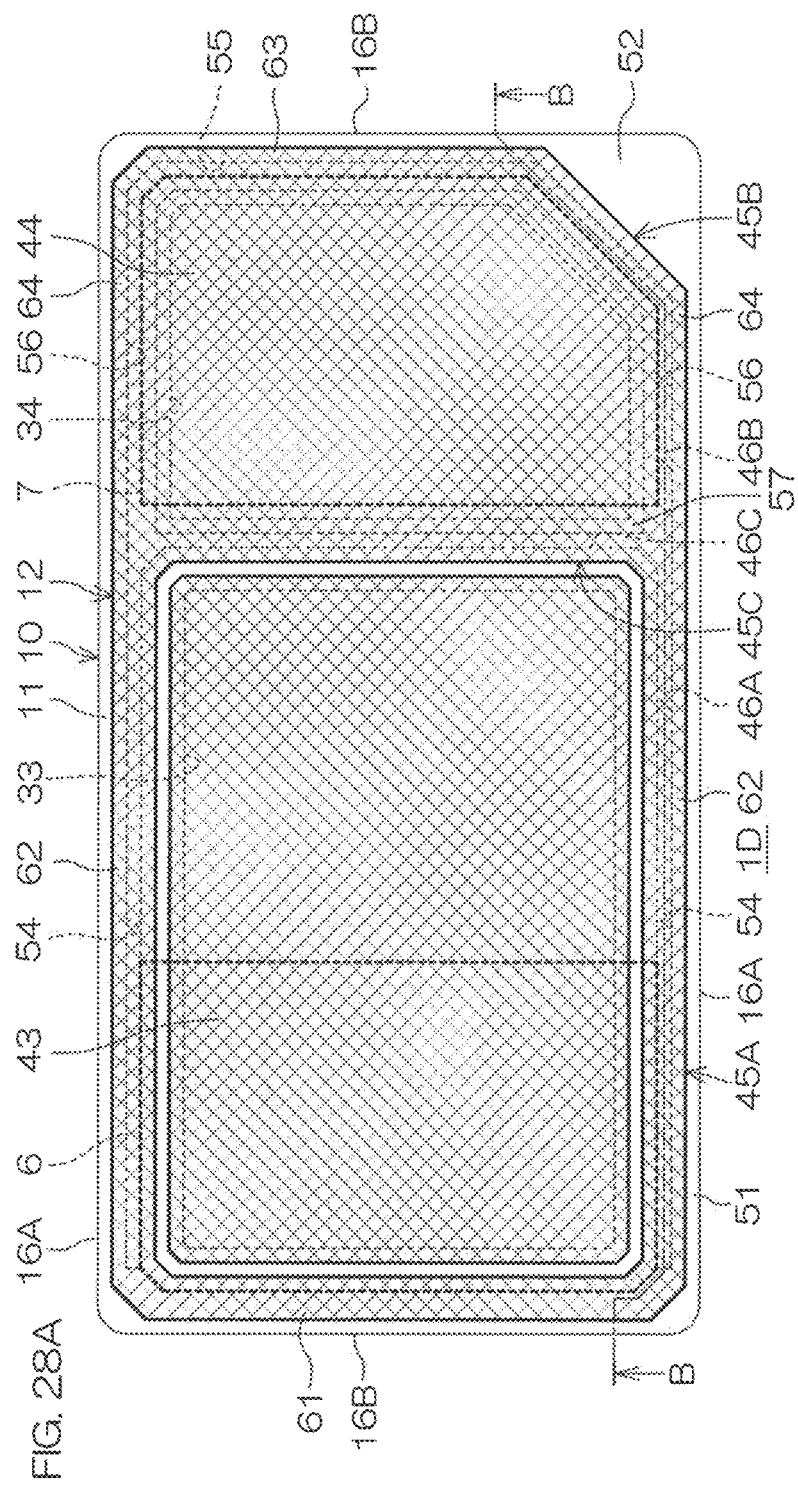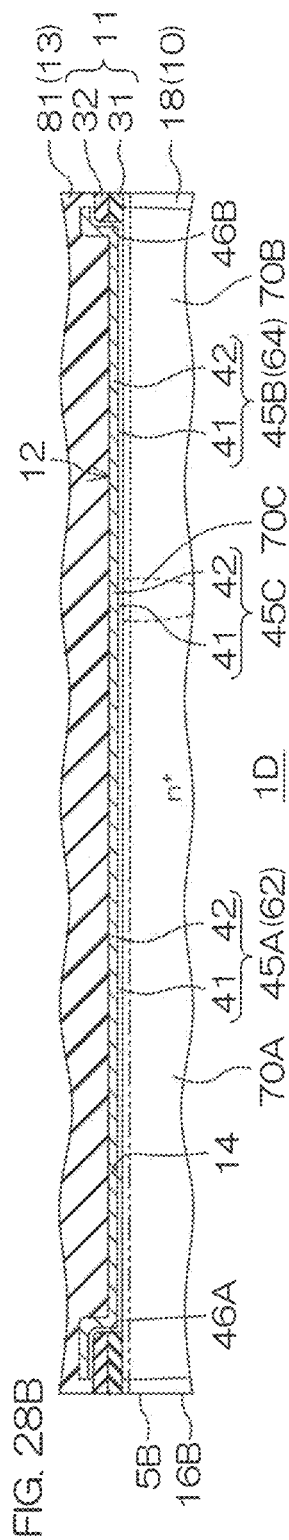

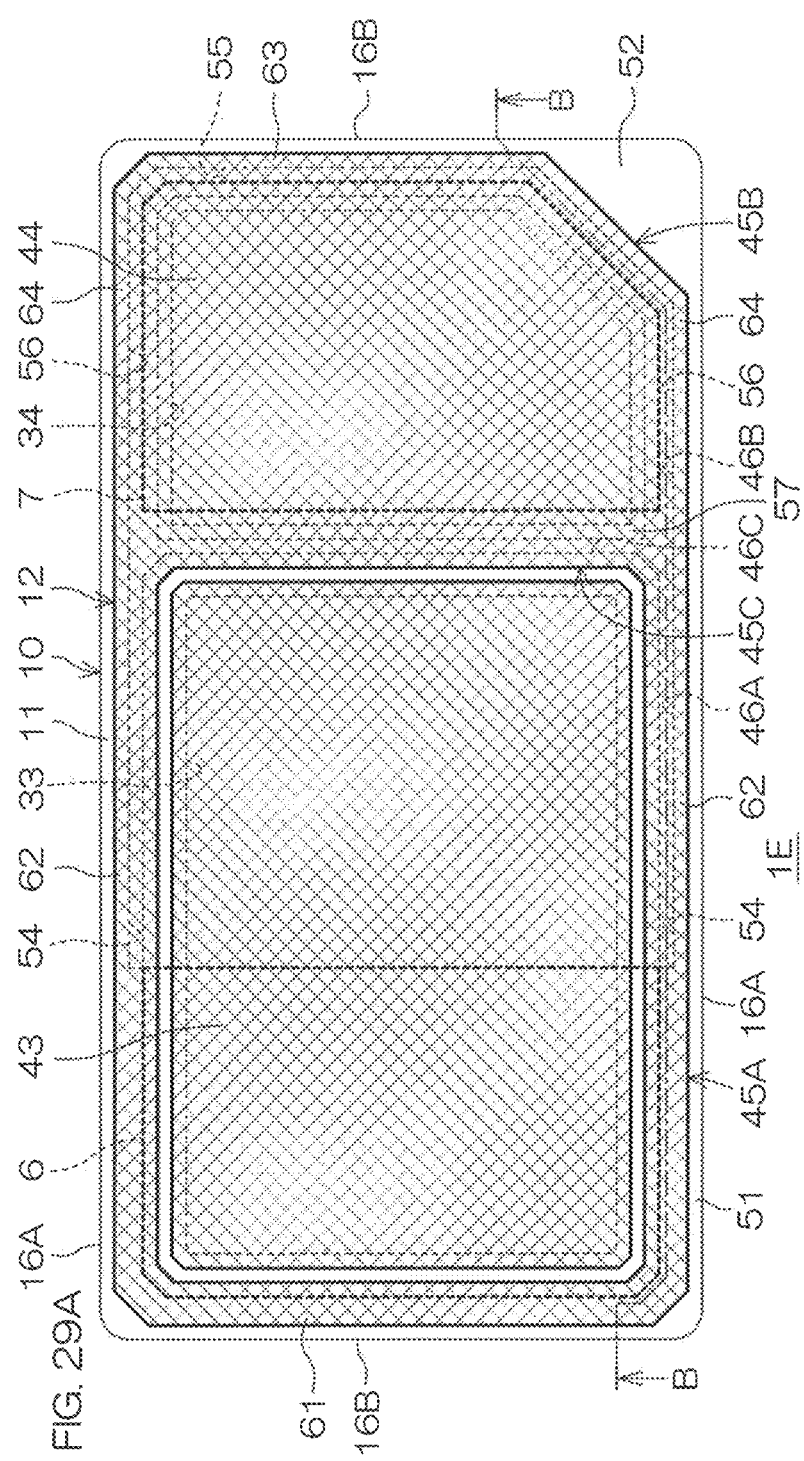
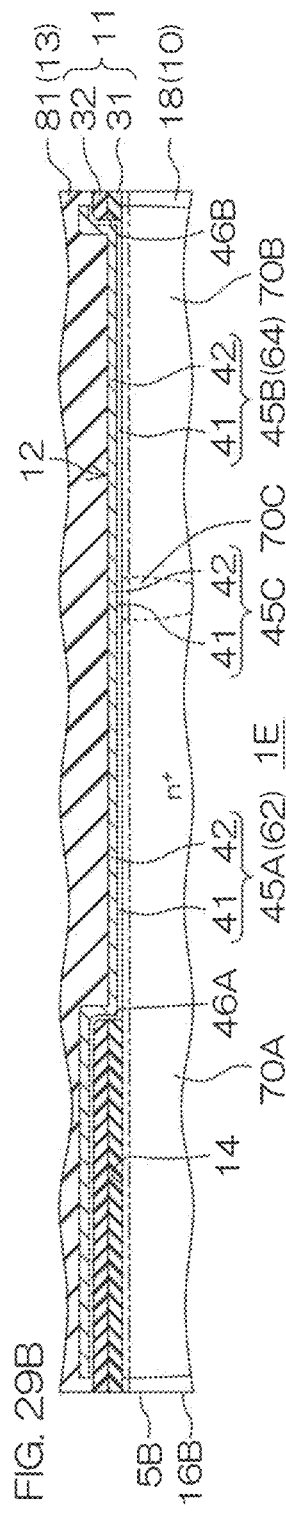
FIG. 29A
FIG. 29B

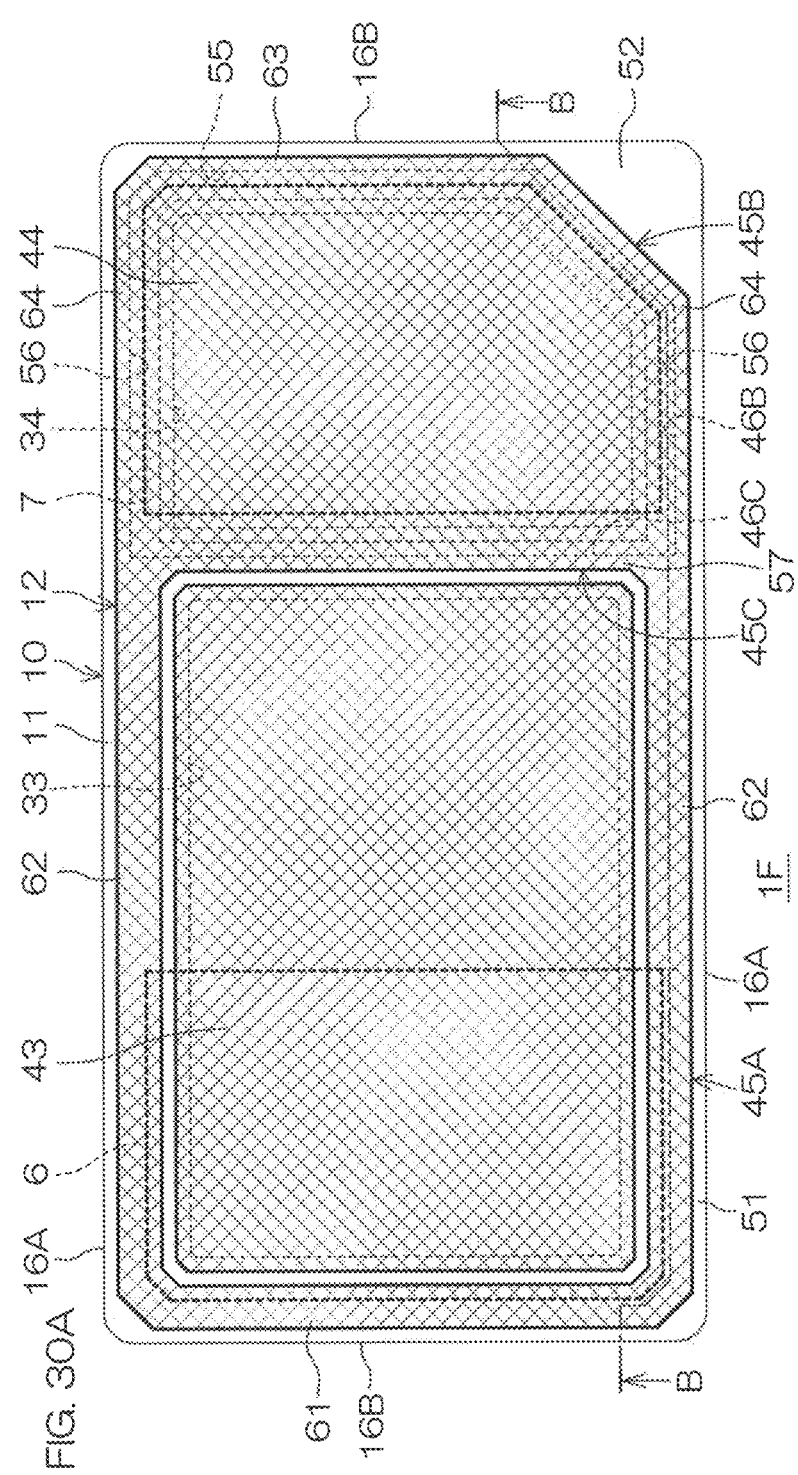
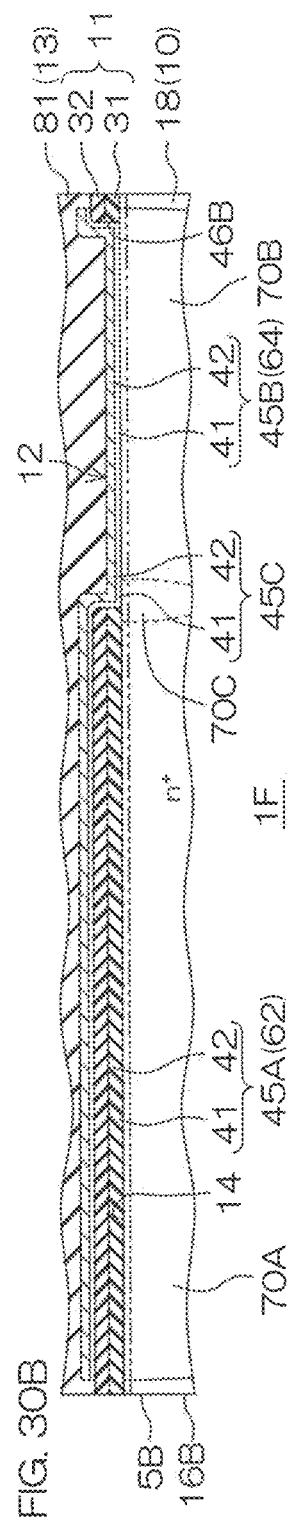
FIG. 30A
FIG. 30B

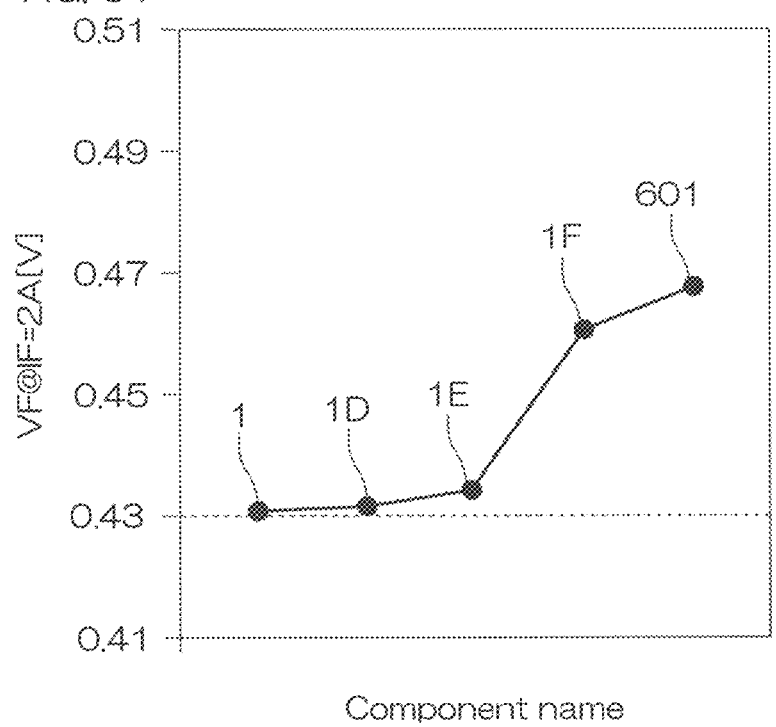

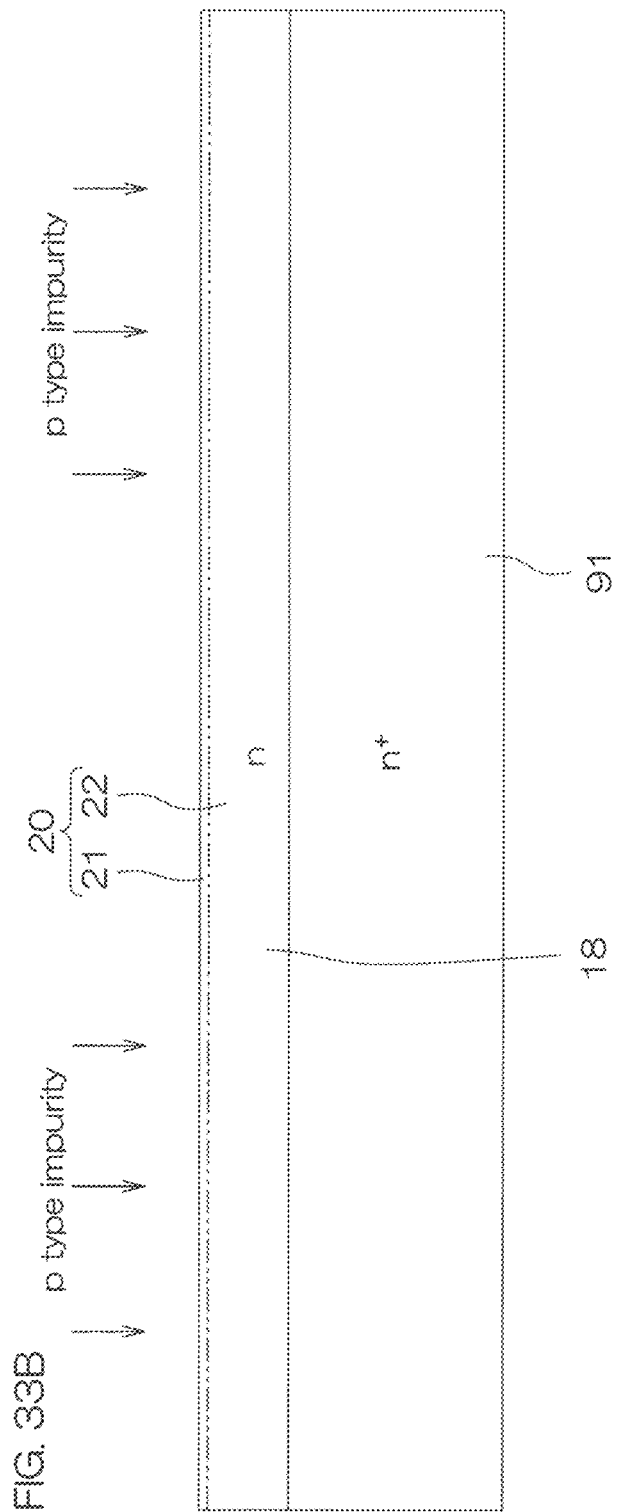

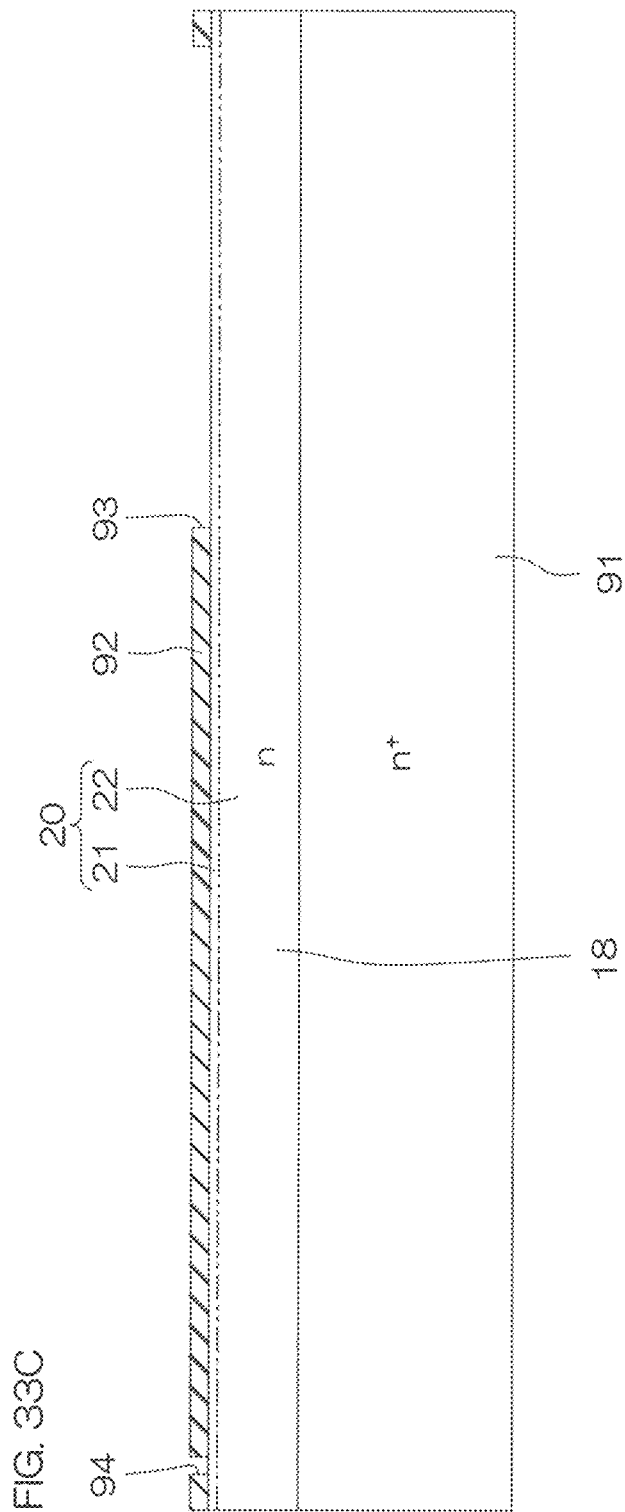

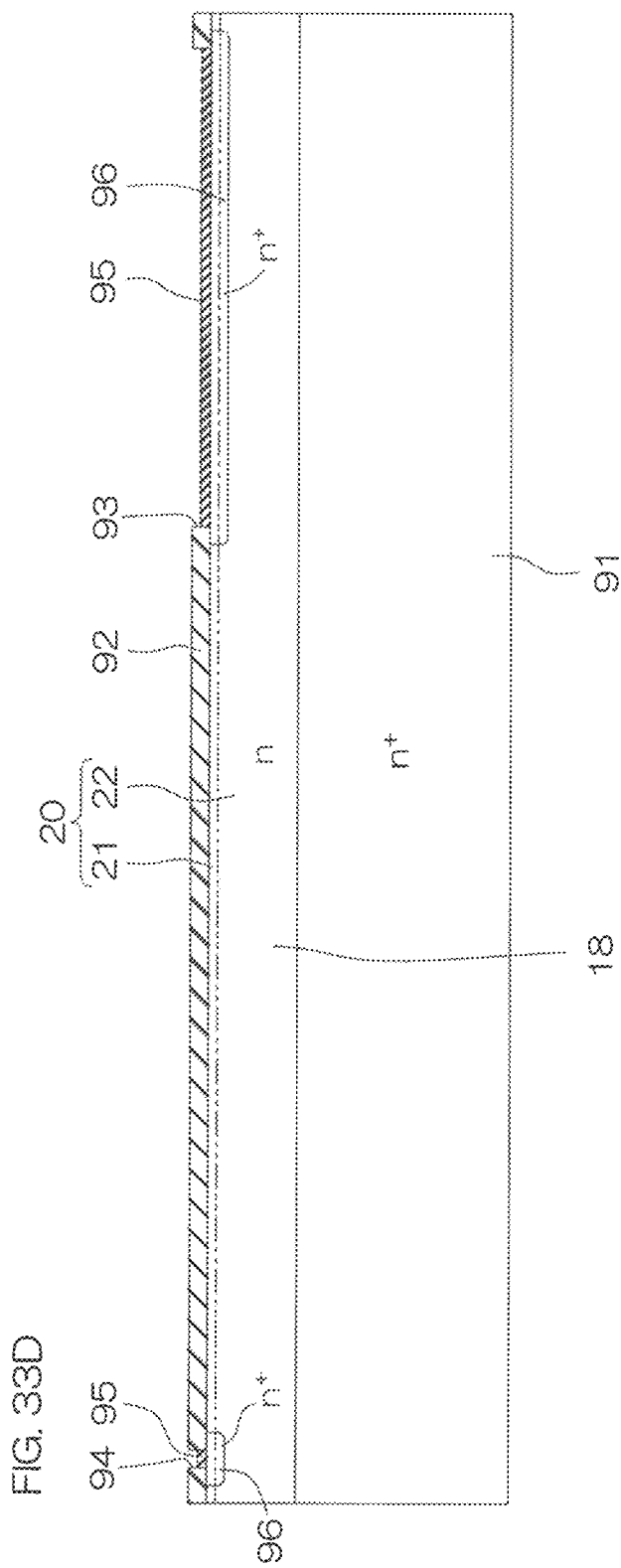

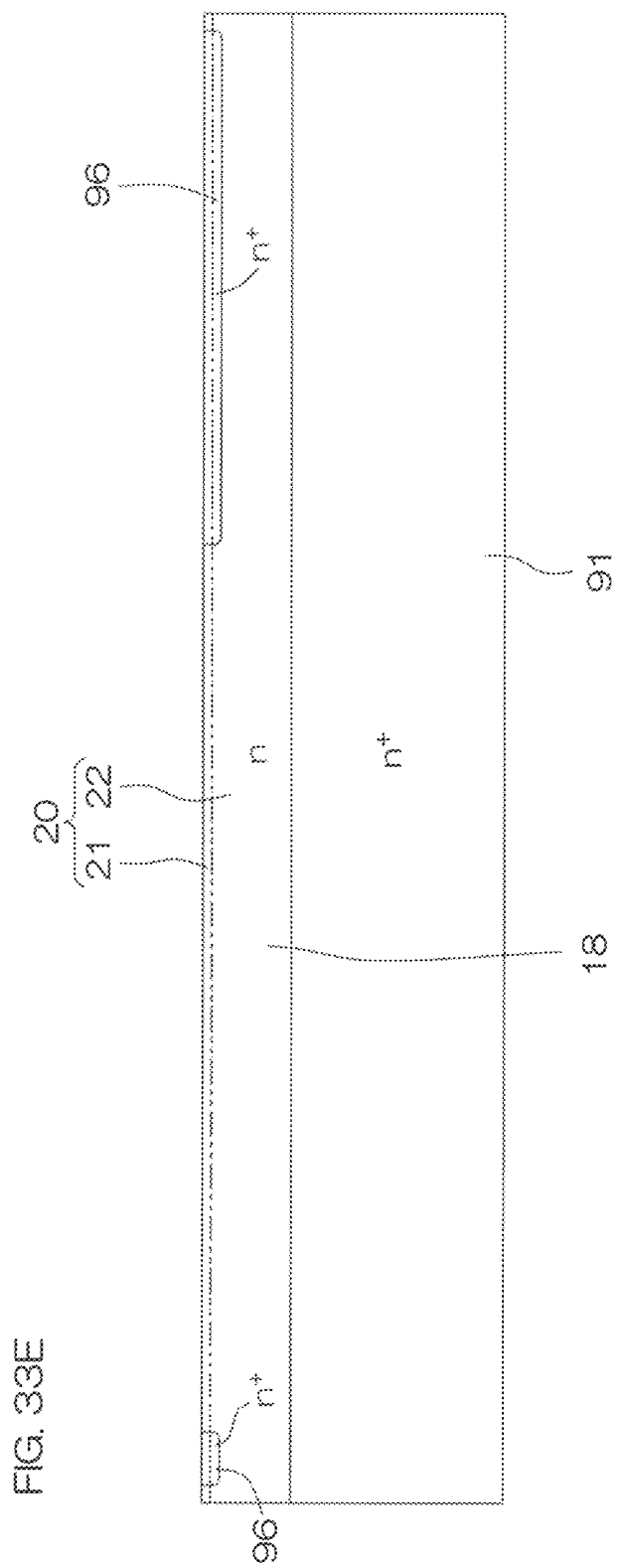

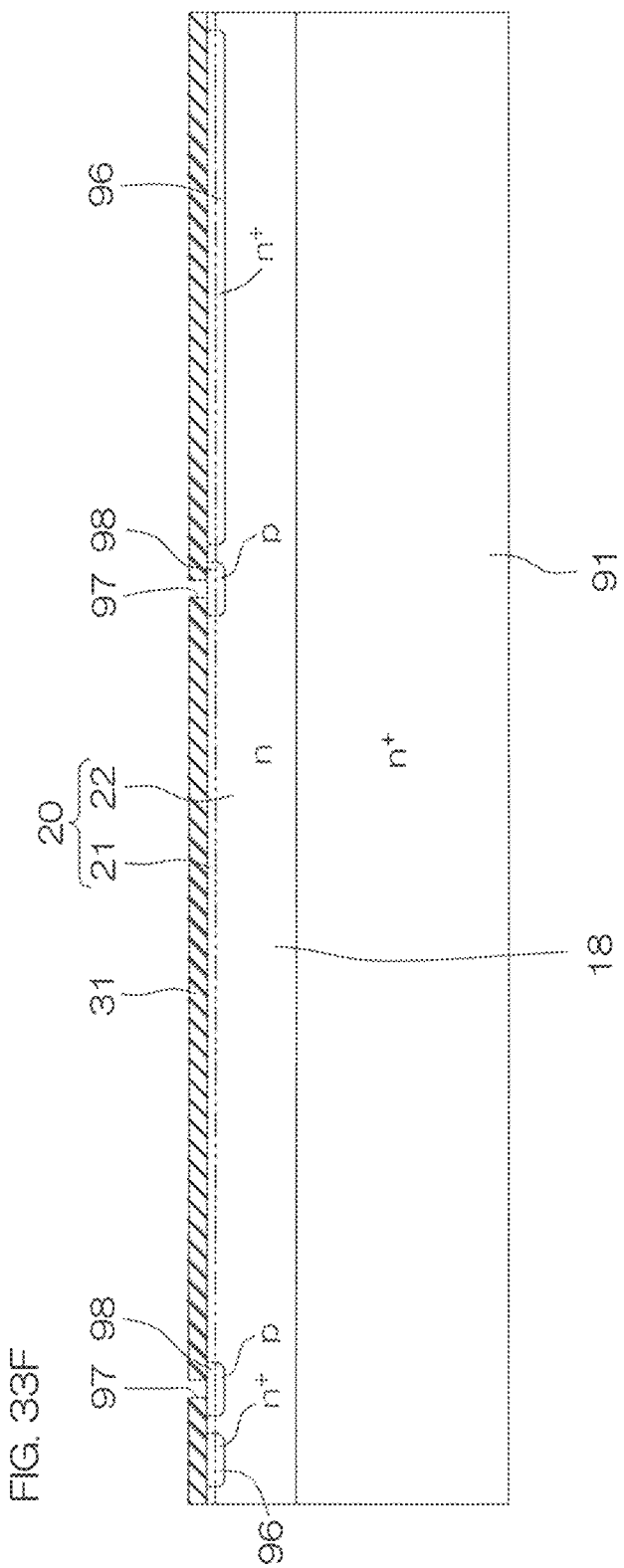

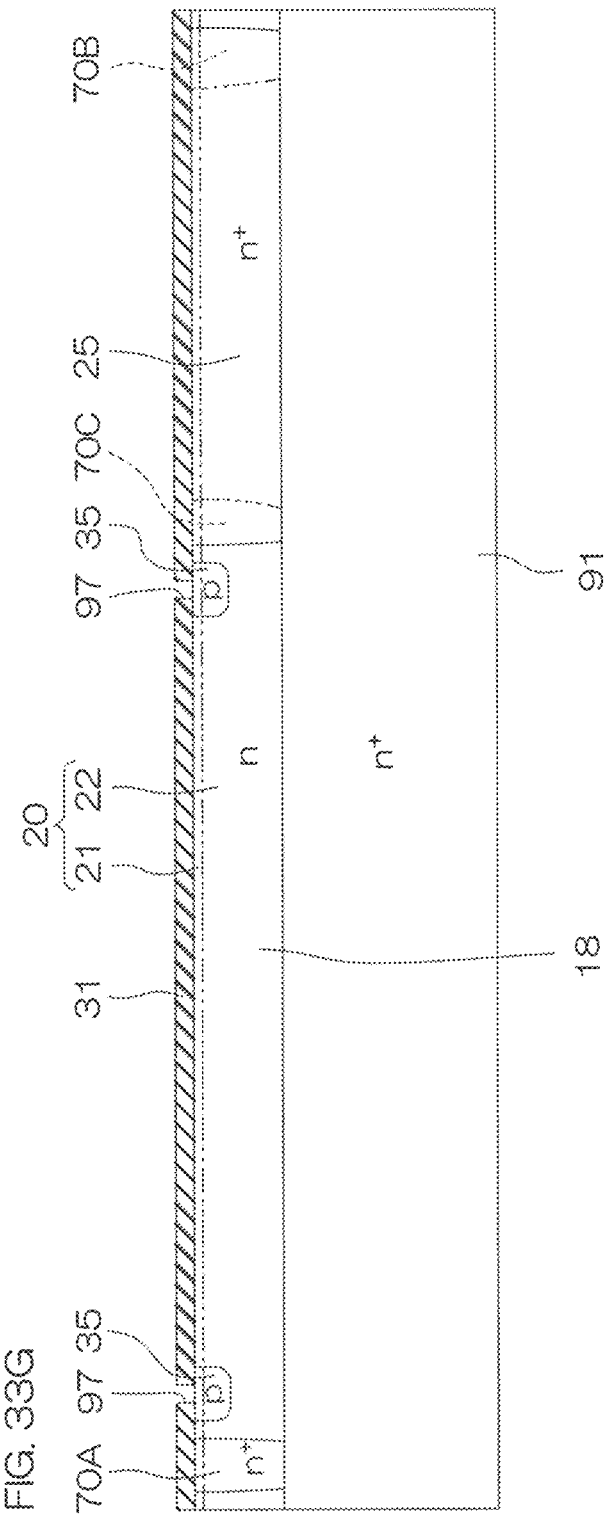

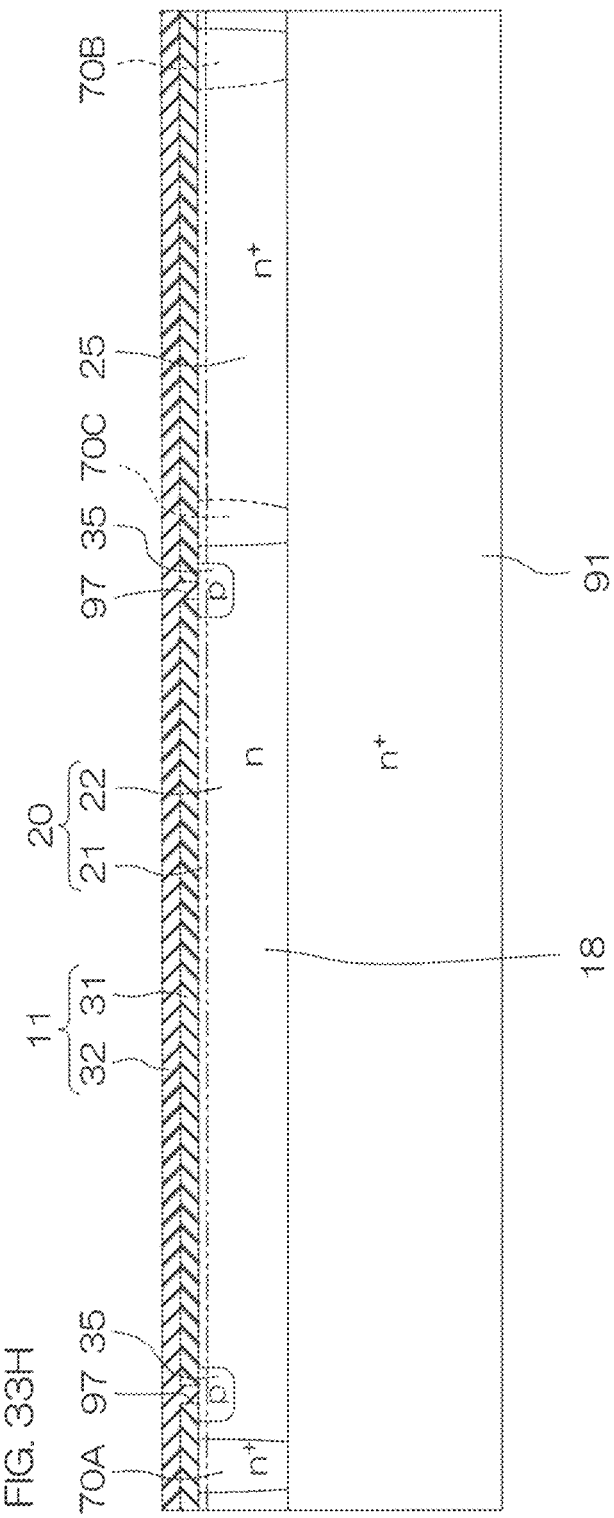

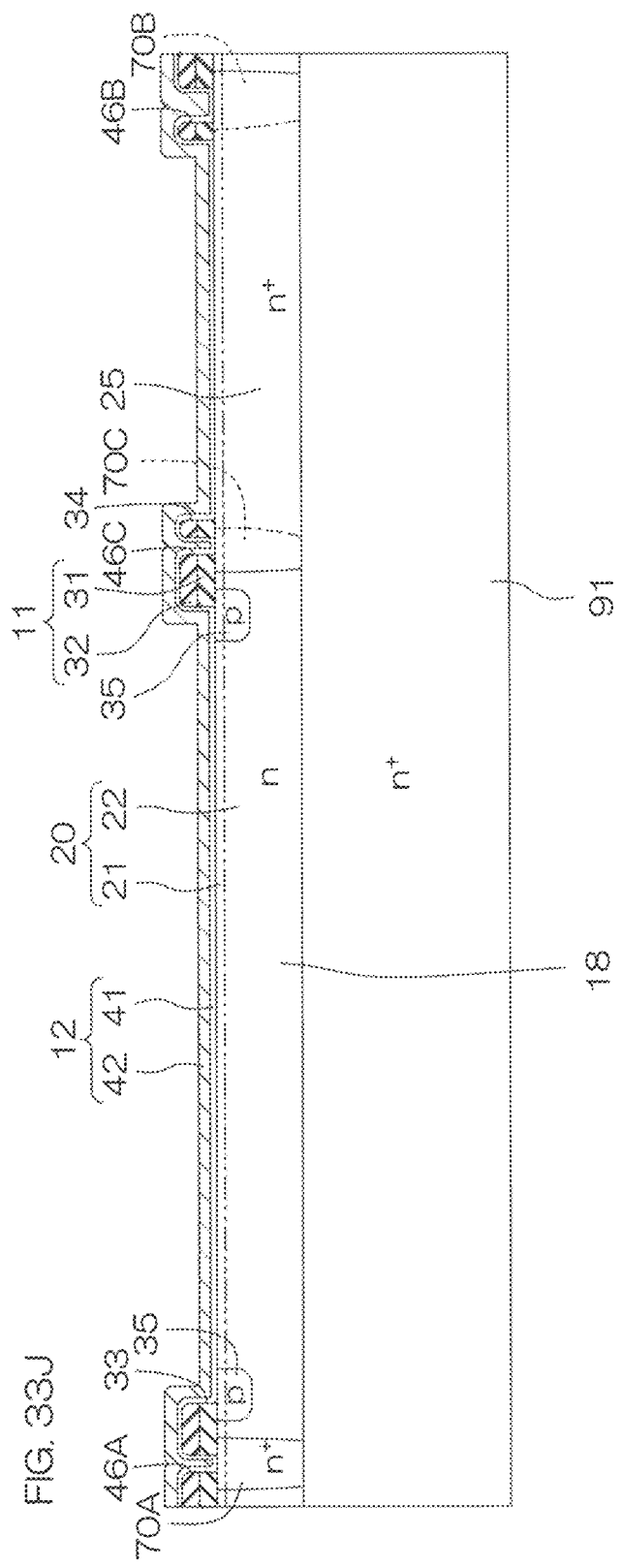

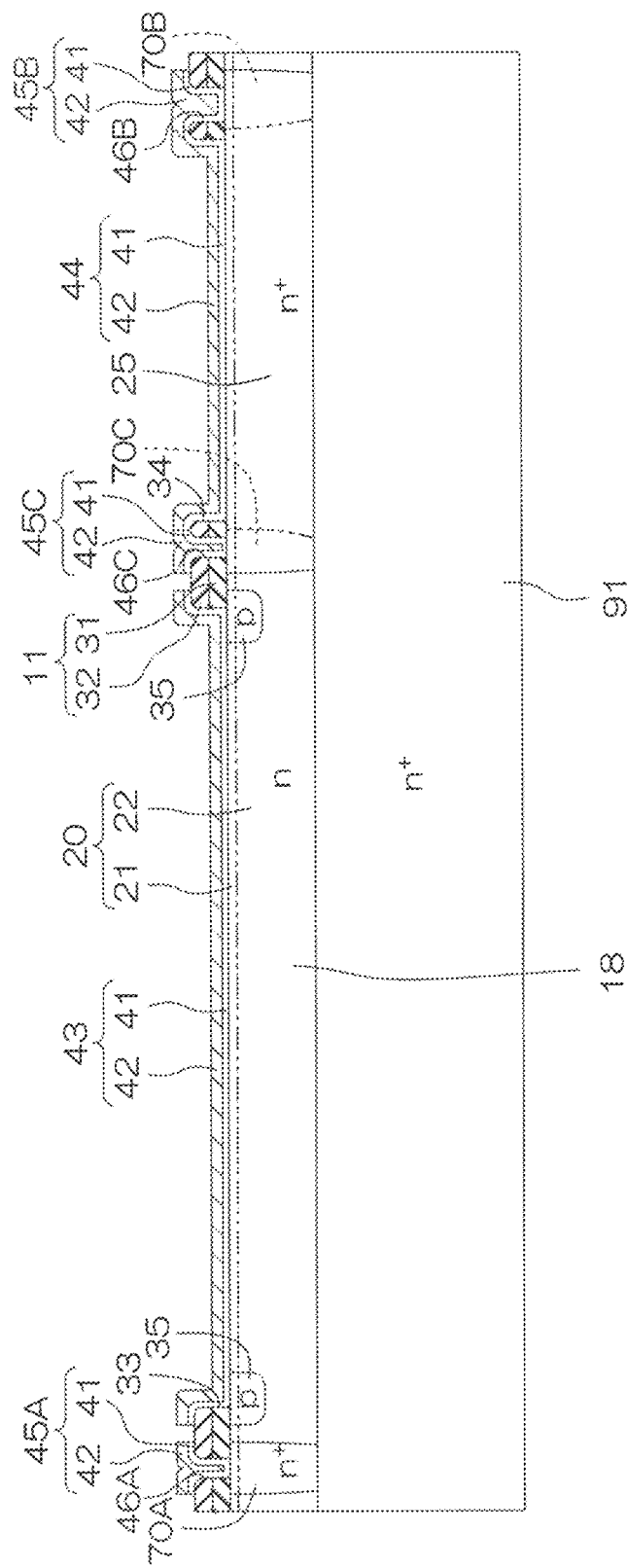

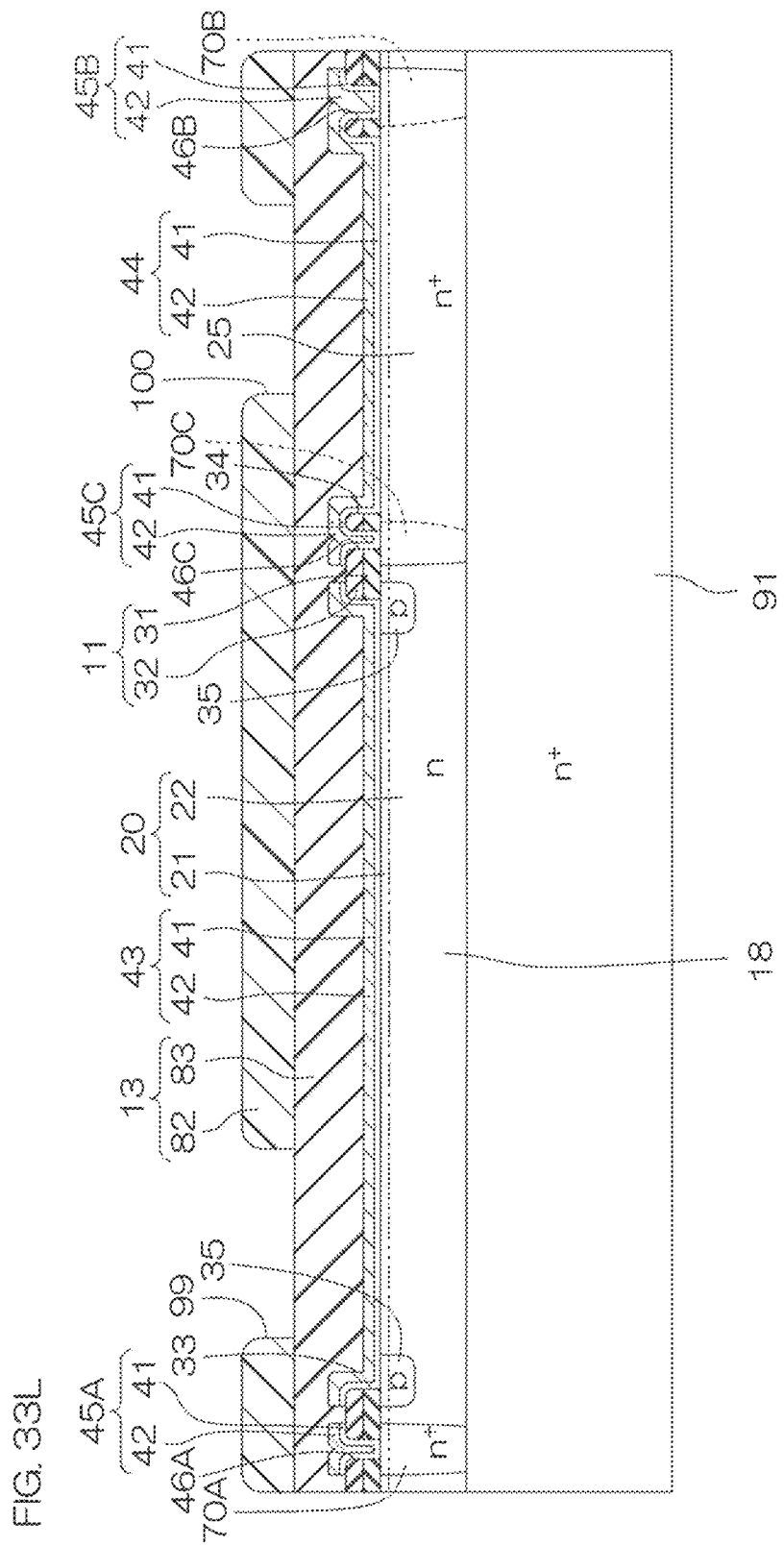

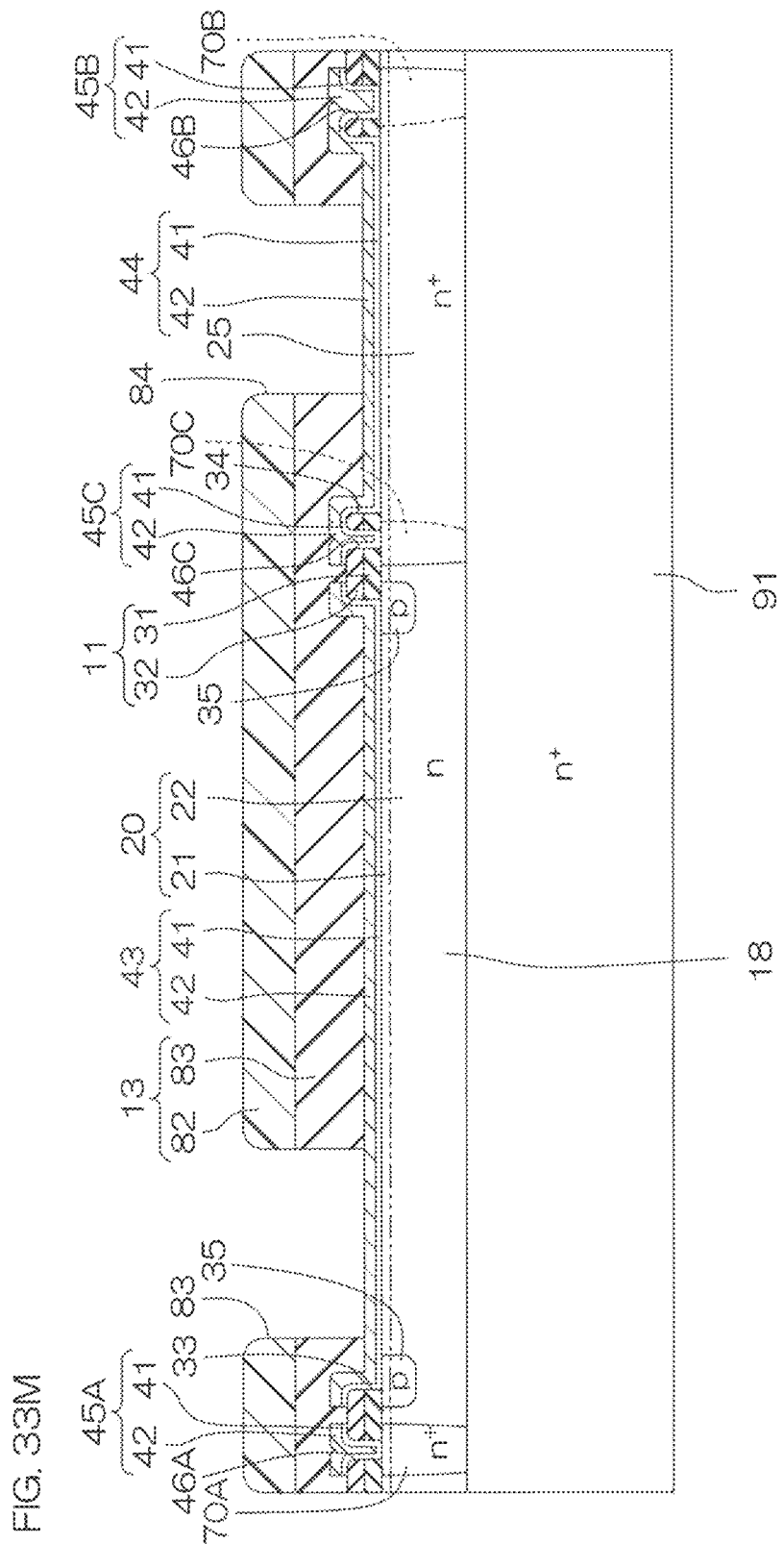

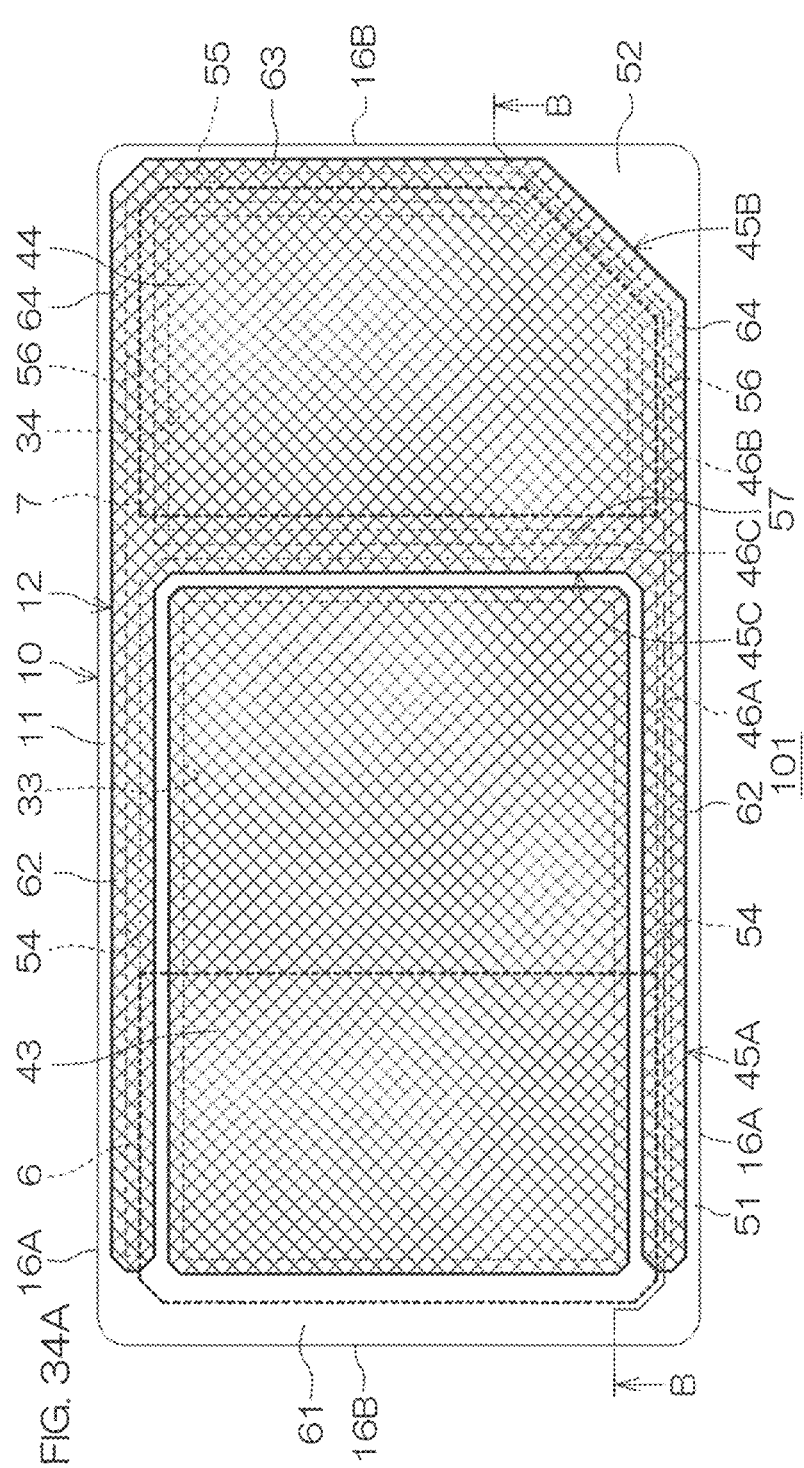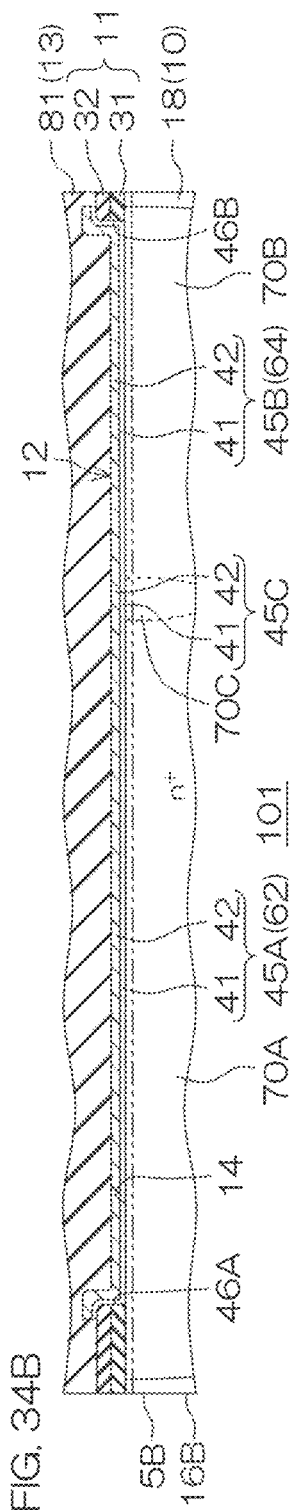

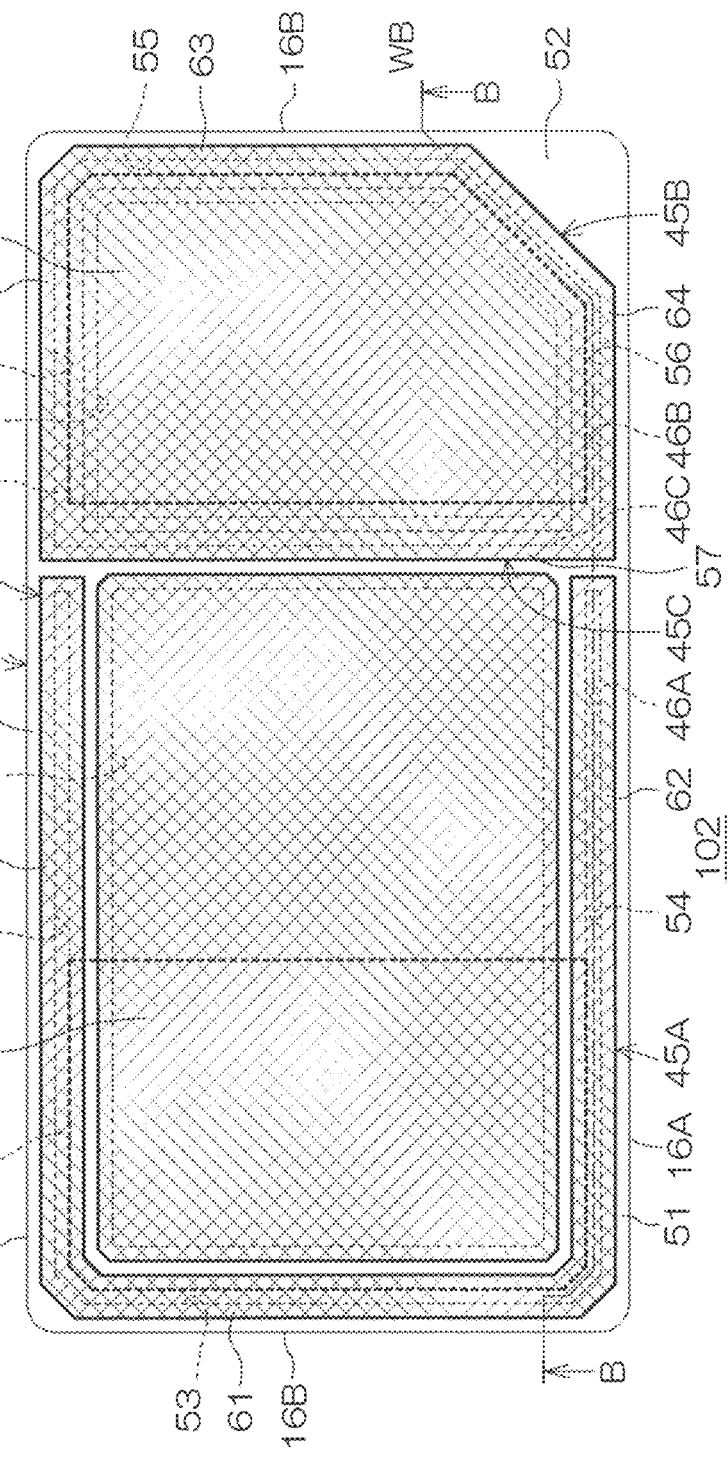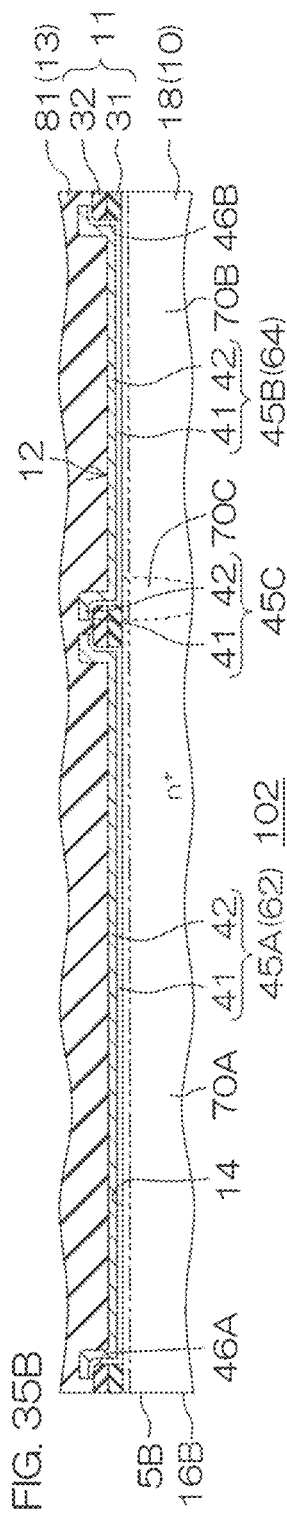

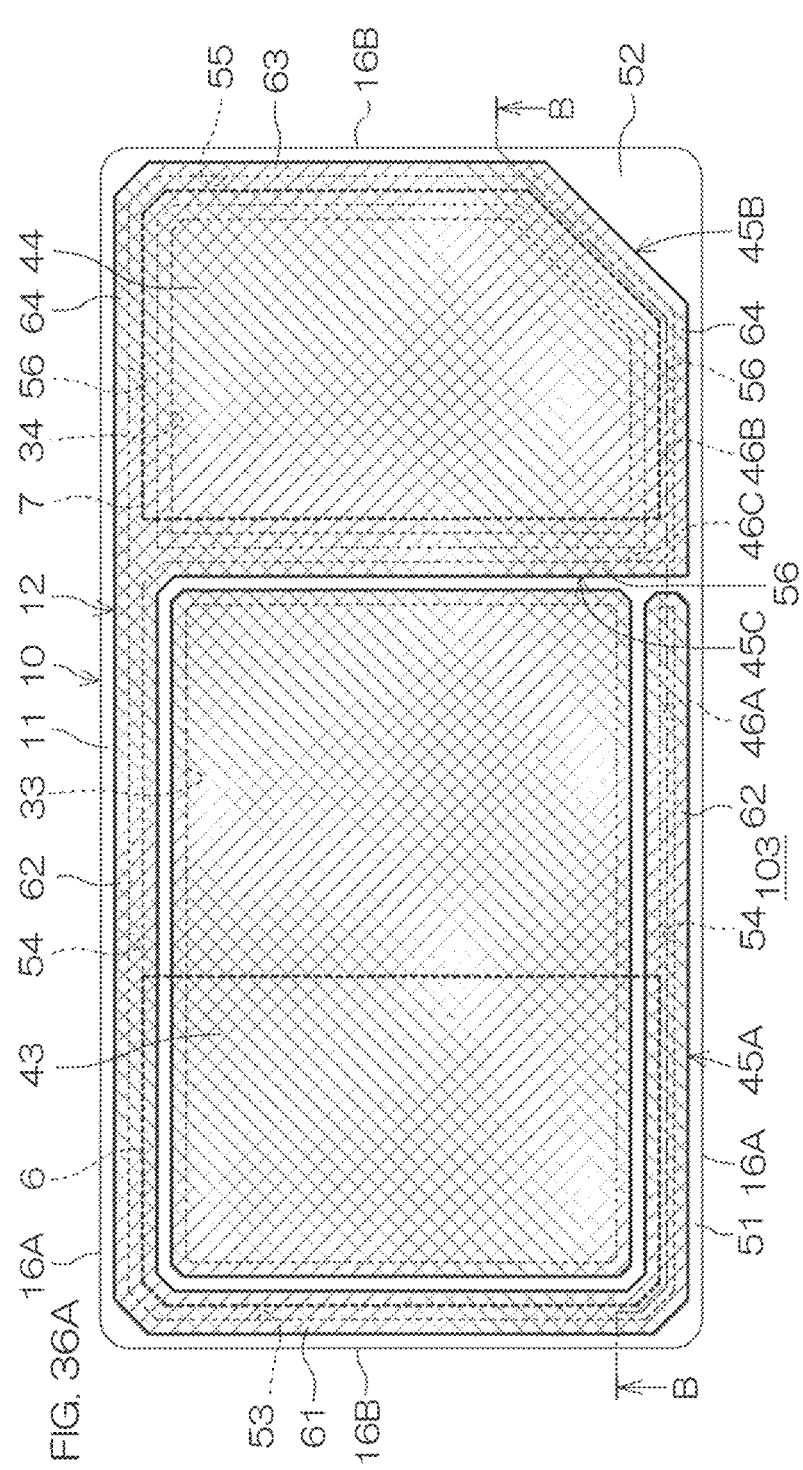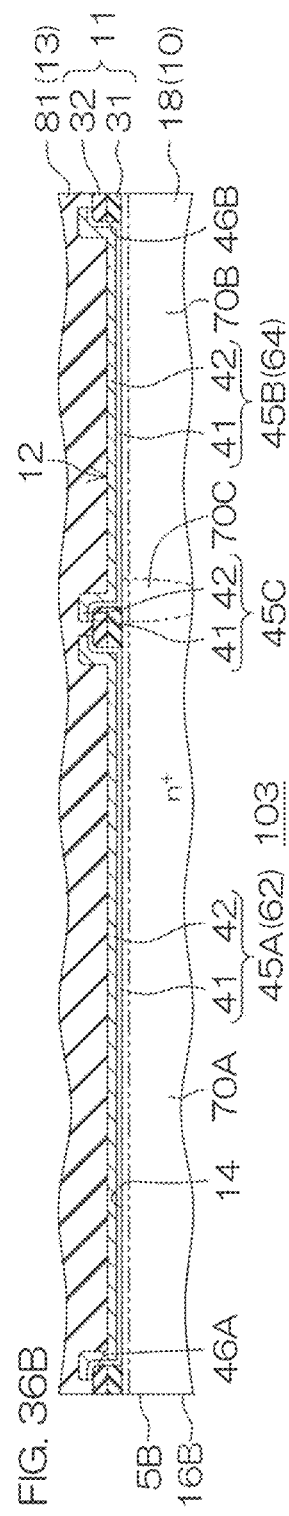

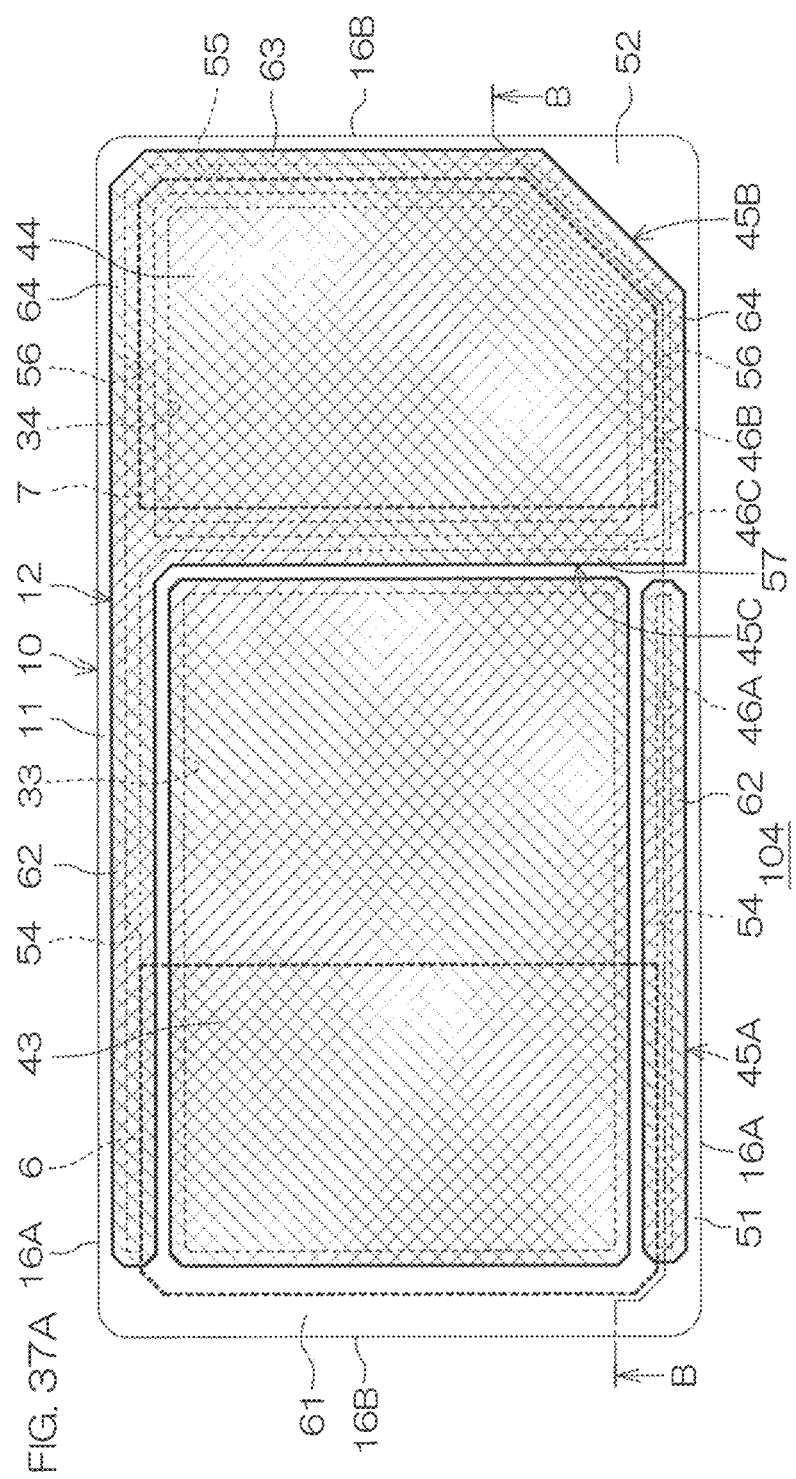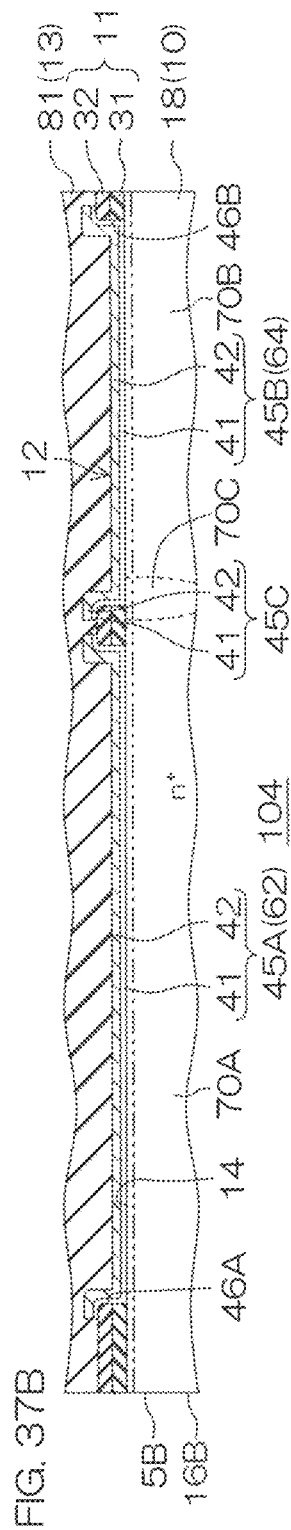

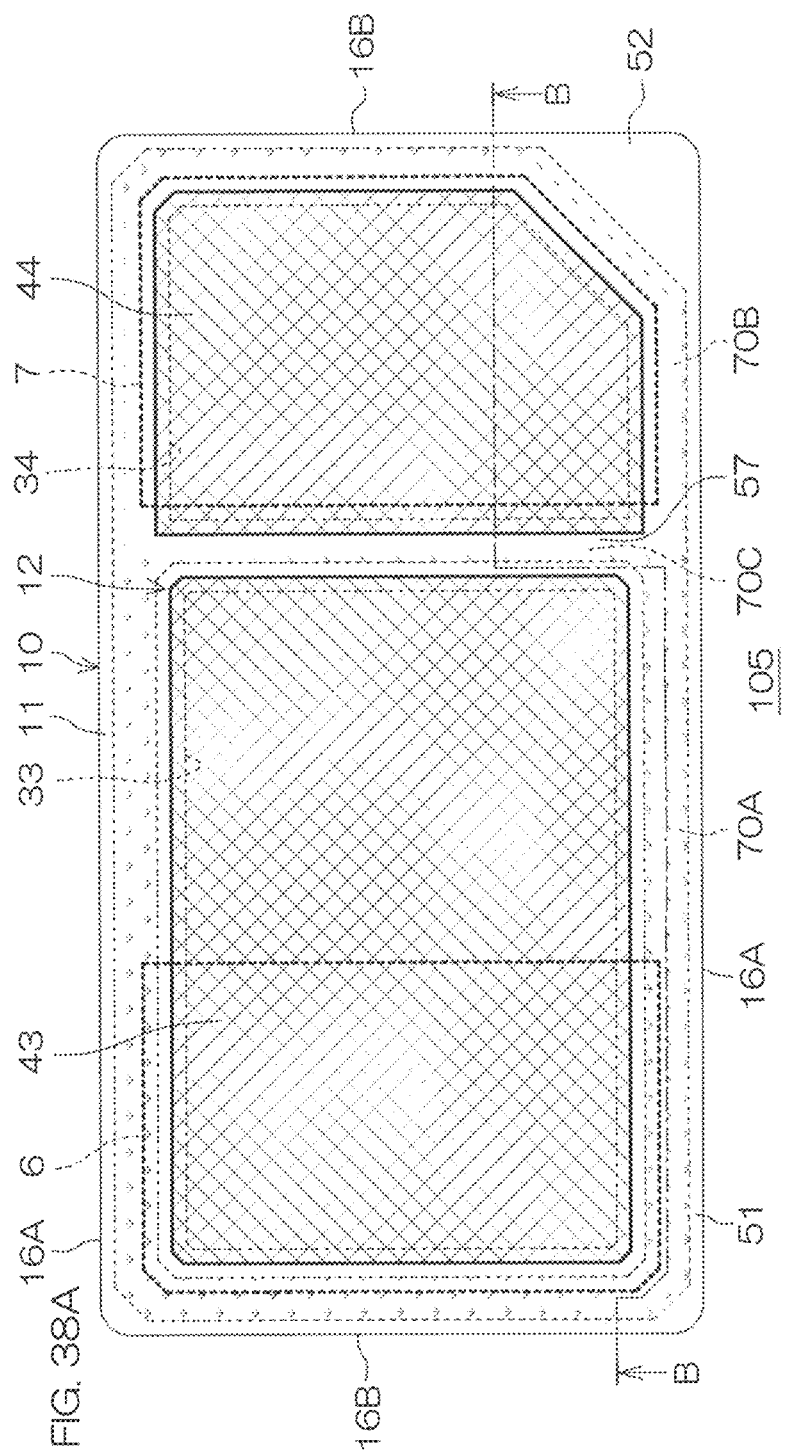
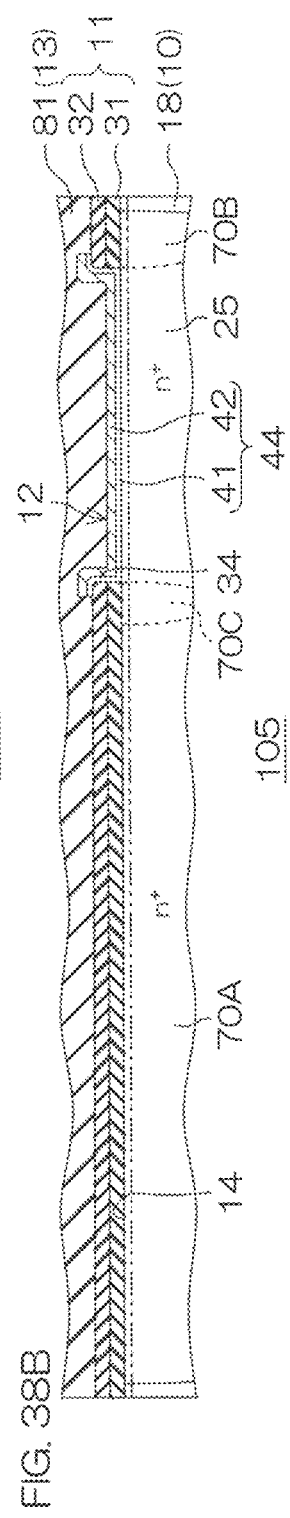
FIG. 38A
FIG. 38B

SCHOTTKY BARRIER DIODE

BACKGROUND OF THE INVENTION

1. Field of the Invention

The present invention relates to a Schottky barrier diode.

2. Description of the Related Art

JP2004-087555A discloses a Schottky barrier diode. The Schottky barrier diode includes an n type semiconductor layer. A p type semiconductor region is formed in a surface layer portion of the n type semiconductor layer.

A first electrode forming a Schottky junction with the n type semiconductor layer is formed on the n type semiconductor layer. A second electrode electrically connected to the p type semiconductor region is formed on the n type semiconductor layer.

SUMMARY OF THE INVENTION

A preferred embodiment of the present invention provides a Schottky barrier diode including a semiconductor layer having a major surface, a diode region of a first conductivity type formed in a surface layer portion of the semiconductor layer, a first conductivity type impurity region formed in the surface layer portion of the semiconductor layer and electrically connected to the diode region, a first electrode layer formed on the major surface of the semiconductor layer and forming a Schottky junction with the diode region, a second electrode layer formed on the major surface of the semiconductor layer and forming an ohmic junction with the first conductivity type impurity region, and a contact electrode layer formed on a peripheral region of the major surface of the semiconductor layer surrounding the first electrode layer so as to be electrically connected to the diode region via the semiconductor layer and being electrically connected to the second electrode layer.

A preferred embodiment of the present invention provides a Schottky barrier diode including a semiconductor layer having a major surface, a diode region of a first conductivity type formed in a surface layer portion of the semiconductor layer, a first conductivity type impurity region formed in the surface layer portion of the semiconductor layer and electrically connected to the diode region, a contact region formed along a peripheral region of the surface layer portion of the semiconductor layer surrounding the diode region so as to be electrically connected to the diode region and the first conductivity type impurity region and having a first conductivity type impurity concentration higher than a first conductivity type impurity concentration of the diode region, a first electrode layer formed on the major surface of the semiconductor layer and forming a Schottky junction with the diode region, and a second electrode layer formed on the major surface of the semiconductor layer and forming an ohmic junction with the first conductivity type impurity region.

The above and yet other objects, features, and effects of the present invention shall be made clear by the following description of the preferred embodiment with reference to the attached drawings.

BRIEF DESCRIPTION OF THE DRAWINGS

FIG. 6 is a sectional view taken along line VI-VI shown in FIG. 3.

FIG. 7B is an enlarged view of a region VIIB shown in FIG. 4.

FIG. 9A is a plan view of an internal structure of an SBD chip according to a reference example.

FIG. 9B is a sectional view taken along line B-B shown in FIG. 9A.

FIG. 24A is a plan view of a first evaluation element for evaluating the forward voltage when shapes of contact holes are adjusted in the SBD chip shown in FIG. 1.

FIG. 24B is a sectional view taken along line B-B shown in FIG. 24A.

FIG. 25A is a plan view of a second evaluation element for evaluating the forward voltage when the shapes of the contact holes are adjusted in the SBD chip shown in FIG. 1.

FIG. 25B is a sectional view taken along line B-B shown in FIG. 25A.

FIG. 26A is a plan view of a third evaluation element for evaluating the forward voltage when the shapes of the contact holes are adjusted in the SBD chip shown in FIG. 1.

FIG. 26B is a sectional view taken along line B-B shown in FIG. 26A.

FIG. 28A is a plan view of a fourth evaluation element for evaluating the forward voltage when the shapes of the contact holes are adjusted in the SBD chip shown in FIG. 1.

FIG. 28B is a sectional view taken along line B-B shown in FIG. 28A.

FIG. 29A is a plan view of a fifth evaluation element for evaluating the forward voltage when the shapes of the contact holes are adjusted in the SBD chip shown in FIG. 1.

FIG. 29B is a sectional view taken along line B-B shown in FIG. 29A.

FIG. 30A is a plan view of a sixth evaluation element for evaluating the forward voltage when the shapes of the contact holes are adjusted in the SBD chip shown in FIG. 1.

FIG. 30B is a sectional view taken along line B-B shown in FIG. 30A.

FIG. 31 is a graph of the forward voltages of the fourth evaluation element to the sixth evaluation element.

FIG. 34A is a plan view of an SBD chip according to a first modification example.

FIG. 34B is a sectional view taken along line B-B shown in FIG. 34A.

FIG. 35A is a plan view of an SBD chip according to a second modification example.

FIG. 35B is a sectional view taken along line B-B shown in FIG. 35A.

FIG. 36A is a plan view of an SBD chip according to a third modification example.

FIG. 36B is a sectional view taken along line B-B shown in FIG. 36A.

FIG. 37A is a plan view of an SBD chip according to a fourth modification example.

FIG. 37B is a sectional view taken along line B-B shown in FIG. 37A.

FIG. 38A is a plan view of an SBD chip according to a fifth modification example.

FIG. 38B is a sectional view taken along line B-B shown in FIG. 38A.

DETAILED DESCRIPTION OF THE PREFERRED EMBODIMENTS

Figure 1:
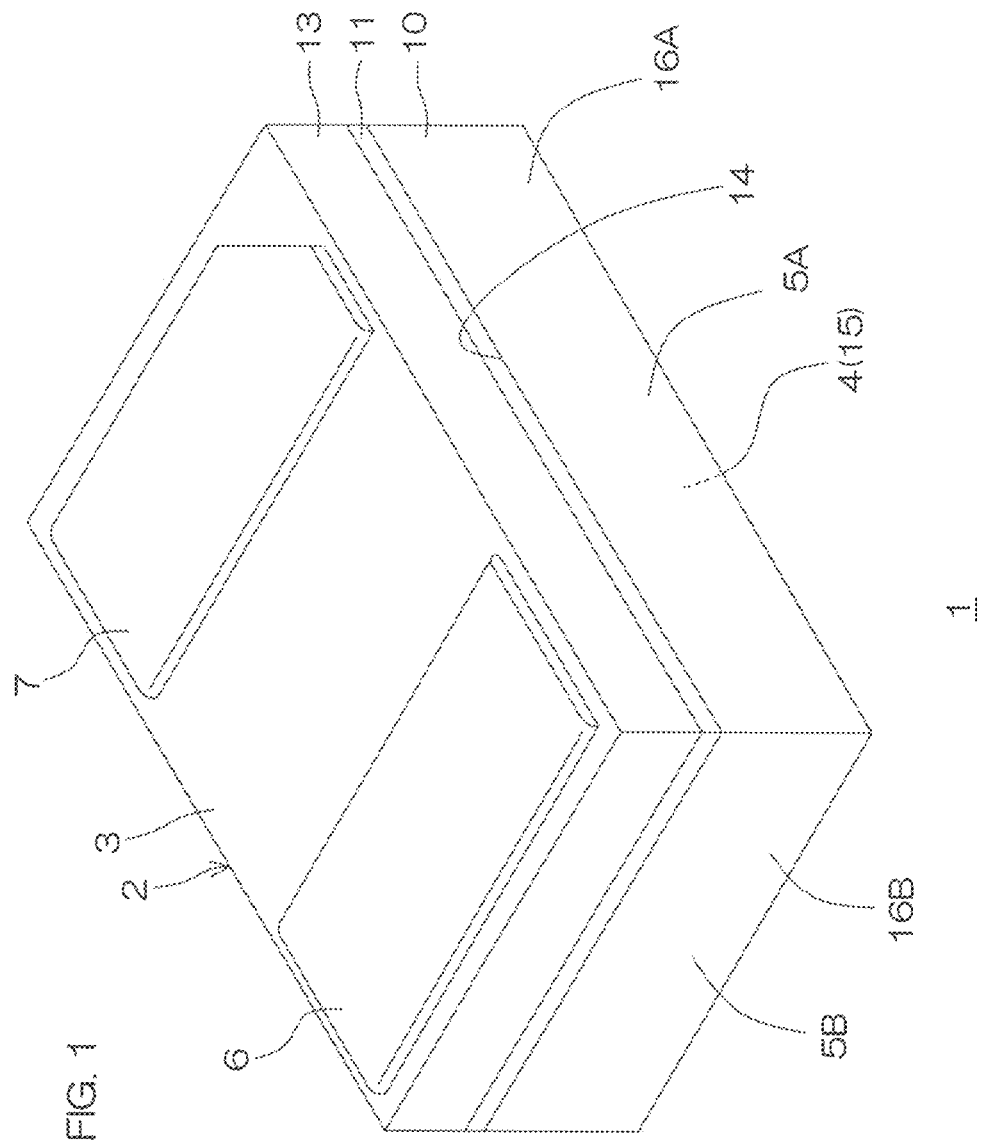
FIG. 1 is a perspective view of an SBD (Schottky barrier diode) chip according to a preferred embodiment of the present invention.

One electrical characteristic of a Schottky barrier diode is a forward voltage. An operating speed of the Schottky barrier diode becomes faster as the value of the forward voltage decreases and becomes slower as the value of the forward voltage increases. The Schottky barrier diode having a forward voltage of comparatively low value is thus demanded.

As a method of decreasing the forward voltage, it may be considered to increase an area of a semiconductor layer. However, as the area of the semiconductor layer is increased, the component itself becomes large, and consequently, market demands demanding compact components cannot be accommodated. On the other hand, when the area of the semiconductor layer is decreased, there are tradeoffs of increase of resistance value in accompaniment with reduction of current path and increase of the forward voltage.

A preferred embodiment of the present invention provides a Schottky barrier diode with which miniaturization and reduction of forward voltage can be achieved.

A preferred embodiment of the present invention provides a Schottky barrier diode including a semiconductor layer having a major surface, a diode region of a first conductivity type formed in a surface layer portion of the semiconductor layer, a first conductivity type impurity region formed in the surface layer portion of the semiconductor layer and electrically connected to the diode region, a first electrode layer formed on the major surface of the semiconductor layer and forming a Schottky junction with the diode region, a second electrode layer formed on the major surface of the semiconductor layer and forming an ohmic junction with the first conductivity type impurity region, and a contact electrode layer formed on a peripheral region of the major surface of the semiconductor layer surrounding the first electrode layer so as to be electrically connected to the diode region via the semiconductor layer and being electrically connected to the second electrode layer.

With the present Schottky barrier diode, the contact electrode layer is formed on the peripheral region of the major surface of the semiconductor layer surrounding the first electrode layer. The contact electrode layer is electrically connected to the diode region via the semiconductor layer. The contact electrode layer is also electrically connected to the second electrode layer.

Therefore, a current flowing into the diode region from the first electrode layer is guided from the diode region to the contact electrode layer of comparative low specific resistance via the semiconductor layer and flows to the second electrode layer. Reduction of resistance value in a current path between the first electrode layer and the second electrode layer can thereby be achieved and the reduction of the forward voltage can thus be achieved.

Moreover, it suffices to form the contact electrode layer in the peripheral region on the major surface of the semiconductor layer surrounding the first electrode layer and therefore it is not necessarily required to increase the area of the semiconductor layer to achieve the reduction of the forward voltage between the first electrode layer and the second electrode layer. A Schottky barrier diode can thus be provided with which miniaturization and the reduction of the forward voltage can be achieved.

A preferred embodiment of the present invention provides a Schottky barrier diode including a semiconductor layer having a major surface, a diode region of a first conductivity type formed in a surface layer portion of the semiconductor layer, a first conductivity type impurity region formed in the surface layer portion of the semiconductor layer and electrically connected to the diode region, a contact region formed along a peripheral region of the surface layer portion of the semiconductor layer surrounding the diode region so as to be electrically connected to the diode region and the first conductivity type impurity region and having a first conductivity type impurity concentration higher than a first conductivity type impurity concentration of the diode region, a first electrode layer formed on the major surface of the semiconductor layer and forming a Schottky junction with the diode region, and a second electrode layer formed on the major surface of the semiconductor layer and forming an ohmic junction with the first conductivity type impurity region.

With the present Schottky barrier diode, the contact region having the first conductivity type impurity concentration higher than the first conductivity type impurity concentration of the diode region is formed in the peripheral region of the surface layer portion of the semiconductor layer surrounding the diode region. The contact electrode layer is electrically connected to the diode region and the first conductivity type impurity region.

Therefore, a current flowing into the diode region from the first electrode layer flows from the diode region into the first conductivity type impurity region via the contact region of comparative low specific resistance and flows to the second electrode layer. The reduction of the resistance value in the current path between the first electrode layer and the second electrode layer can thereby be achieved and the reduction of the forward voltage can thus be achieved.

Moreover, it suffices to form the contact region in the peripheral region of the surface layer portion of the semiconductor layer surrounding the diode region and therefore it is not necessarily required to increase the area of the semiconductor layer to achieve the reduction of the forward voltage between the first electrode layer and the second electrode layer. A Schottky barrier diode can thus be provided with which miniaturization and the reduction of the forward voltage can be achieved.

Preferred embodiments of the present invention shall now be described in detail with reference to the attached drawings.

Figure 2:
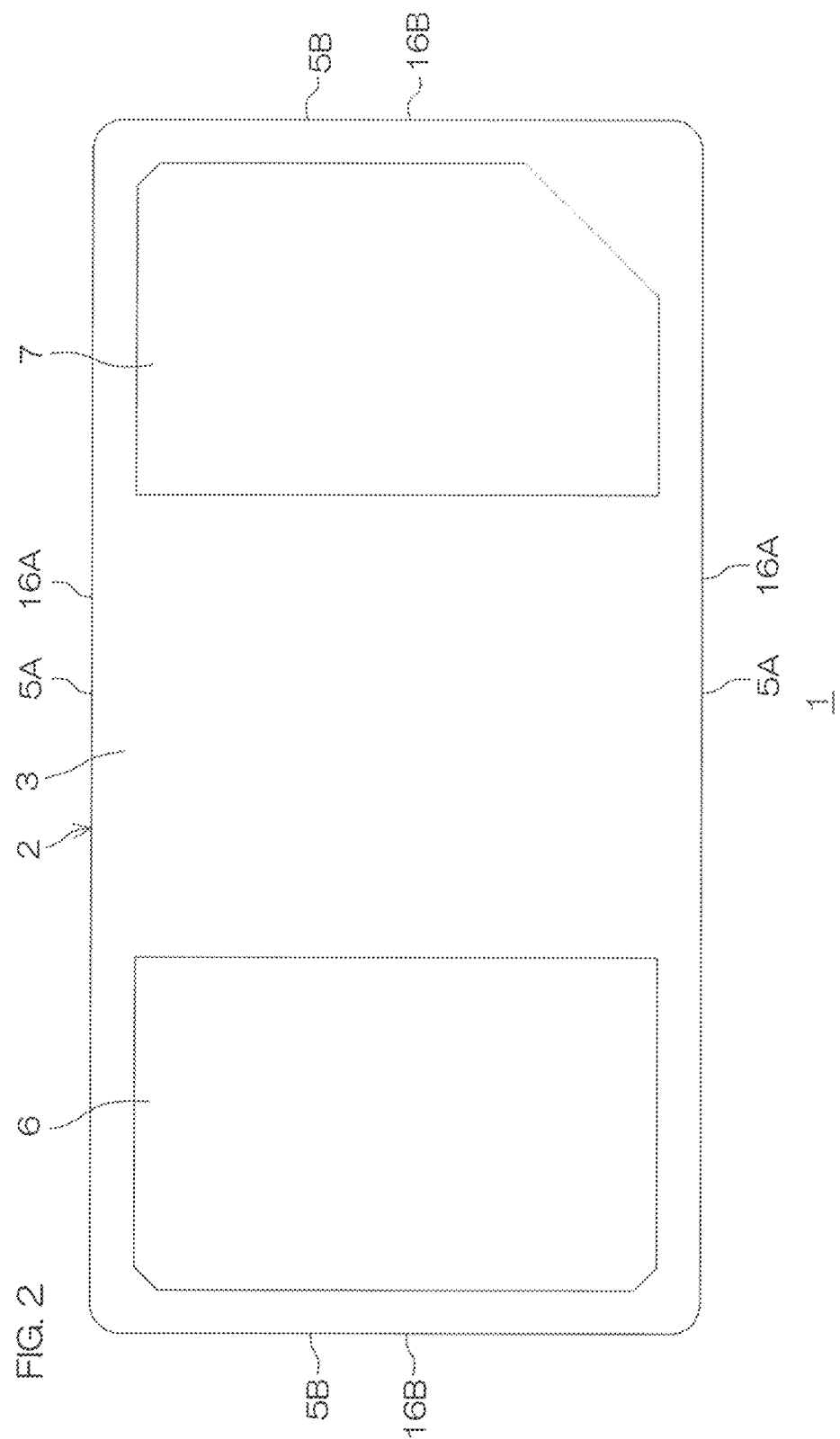
FIG. 2 is a top view of the SBD chip shown in FIG. 1.

FIG. 1 is a perspective view of an SBD (Schottky Barrier Diode) chip 1 according to a preferred embodiment of the present invention. FIG. 2 is a top view of the SBD chip 1 shown in FIG. 1. In the following, the SBD chip, having a structure with which a Schottky barrier diode is applied to a chip part, shall be described.

The SBD chip 1 is a chip part type semiconductor device that is called a 1608 (1.6 mm×0.8 mm) chip, a 1006 (1.0 mm×0.6 mm) chip, a 0603 (0.6 mm×0.3 mm) chip, a 0402 (0.4 mm×0.2 mm) chip, or a 03015 (0.3 mm×0.15 mm) chip, etc. In the present preferred embodiment, the SBD chip 1 is a 1006 (1.0 mm×0.6 mm) chip.

Referring to FIG. 1 and FIG. 2, the SBD chip 1 includes a chip main body 2 formed in a rectangular parallelepiped shape. The chip main body 2 includes a first major surface 3 on one side, a second major surface 4 on the other side, and side surfaces 5A and 5B connecting the first major surface 3 and the second major surface 4.

The first major surface 3 and the second major surface 4 of the chip main body 2 are formed in a rectangular shapes in a plan view as viewed from a direction of a normal to the first major surface 3 (hereinafter referred to simply as the "plan view"). The side surfaces 5A and 5B of the chip main body 2 include the pair of long side surfaces 5A extending along a long direction of the chip main body 2, and the pair of short side surfaces 5B extending along a short direction of the chip main body 2.

"1608," "1006," "0603," etc., are defined by a length of the long side surfaces 5A and a length of the short side surfaces 5B. A thickness of the chip main body 2 is, for example, not less than 50 μm and not more than 150 μm.

A first external terminal 6 and a second external terminal 7 are formed across an interval on the first major surface 3 of the chip main body 2.

The first external terminal 6 is formed at an end portion at one side in the long direction (the end portion at a left side in FIG. 1 and FIG. 2) of the chip main body 2. The first external terminal 6 is formed in a rectangular shape extending along the short direction of the chip main body 2 in the plan view.

The second external terminal 7 is formed at an end portion at the other side in the long direction (the end portion at a right side in FIG. 1 and FIG. 2) of the chip main body 2. The second external terminal 7 is formed in a rectangular shape extending along the short direction of the chip main body 2 in the plan view.

Figure 3:
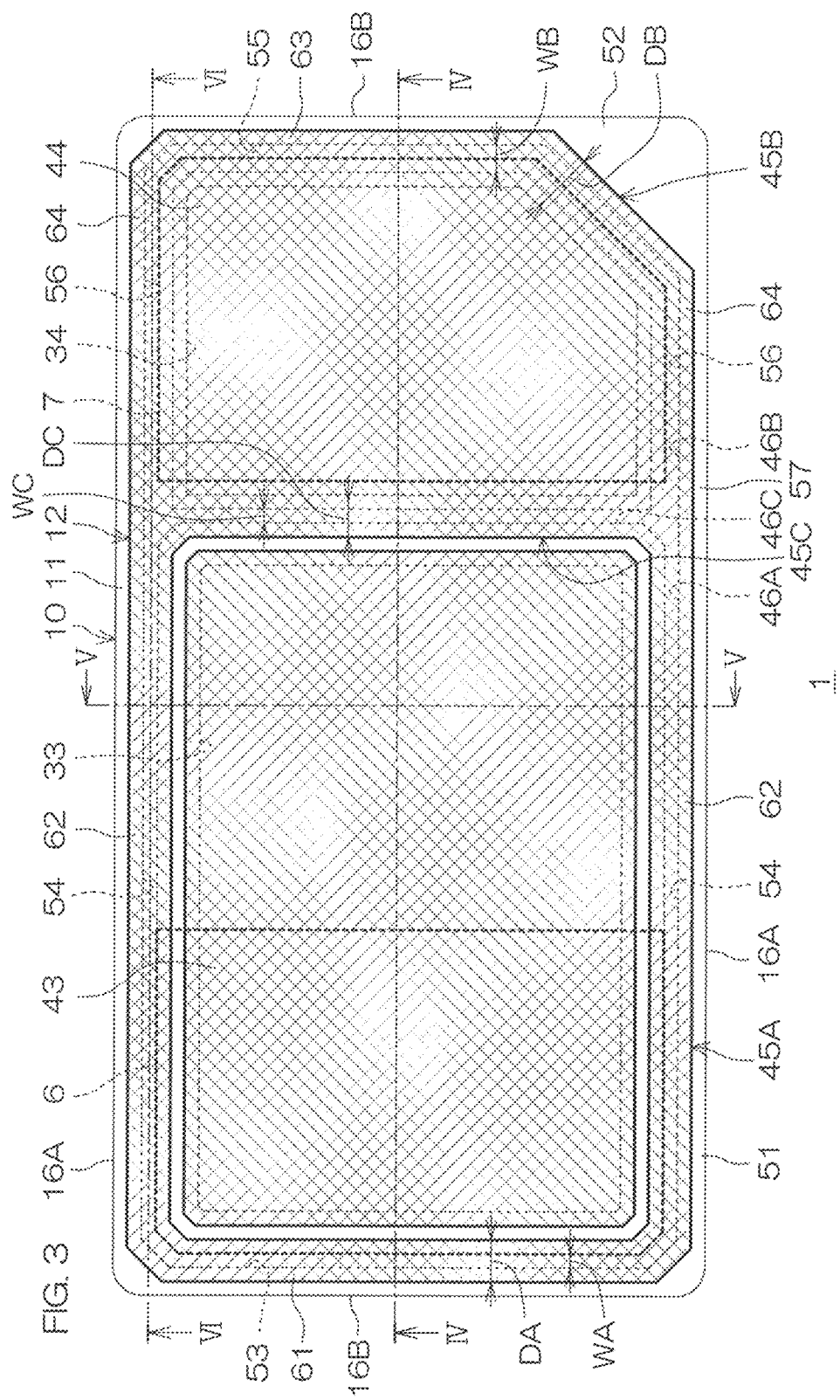
FIG. 3 is a plan view of an internal structure of the SBD chip shown in FIG. 1.
Figure 4:
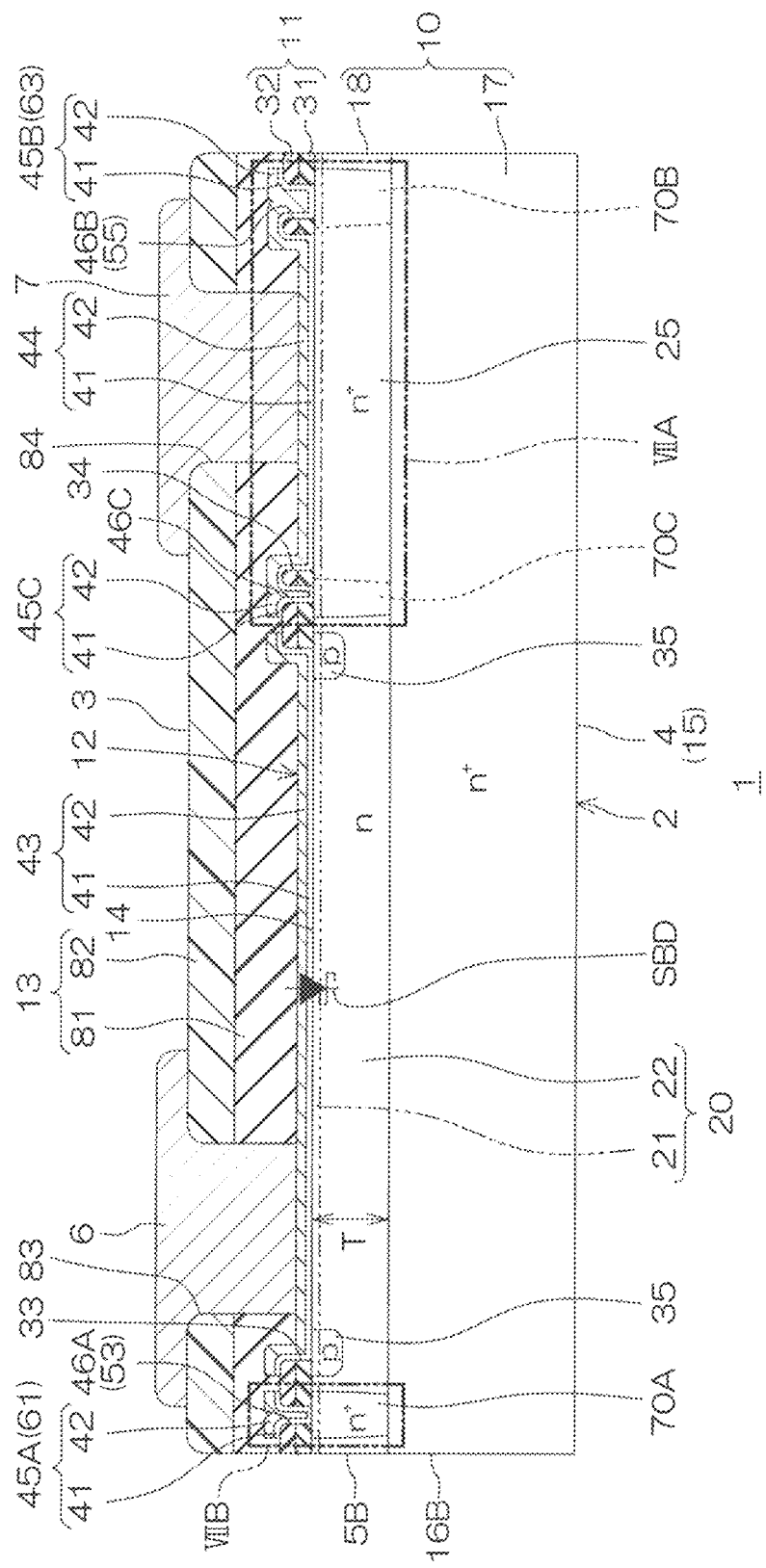
FIG. 4 is a sectional view taken along line IV-IV shown in FIG. 3.
Figure 5:
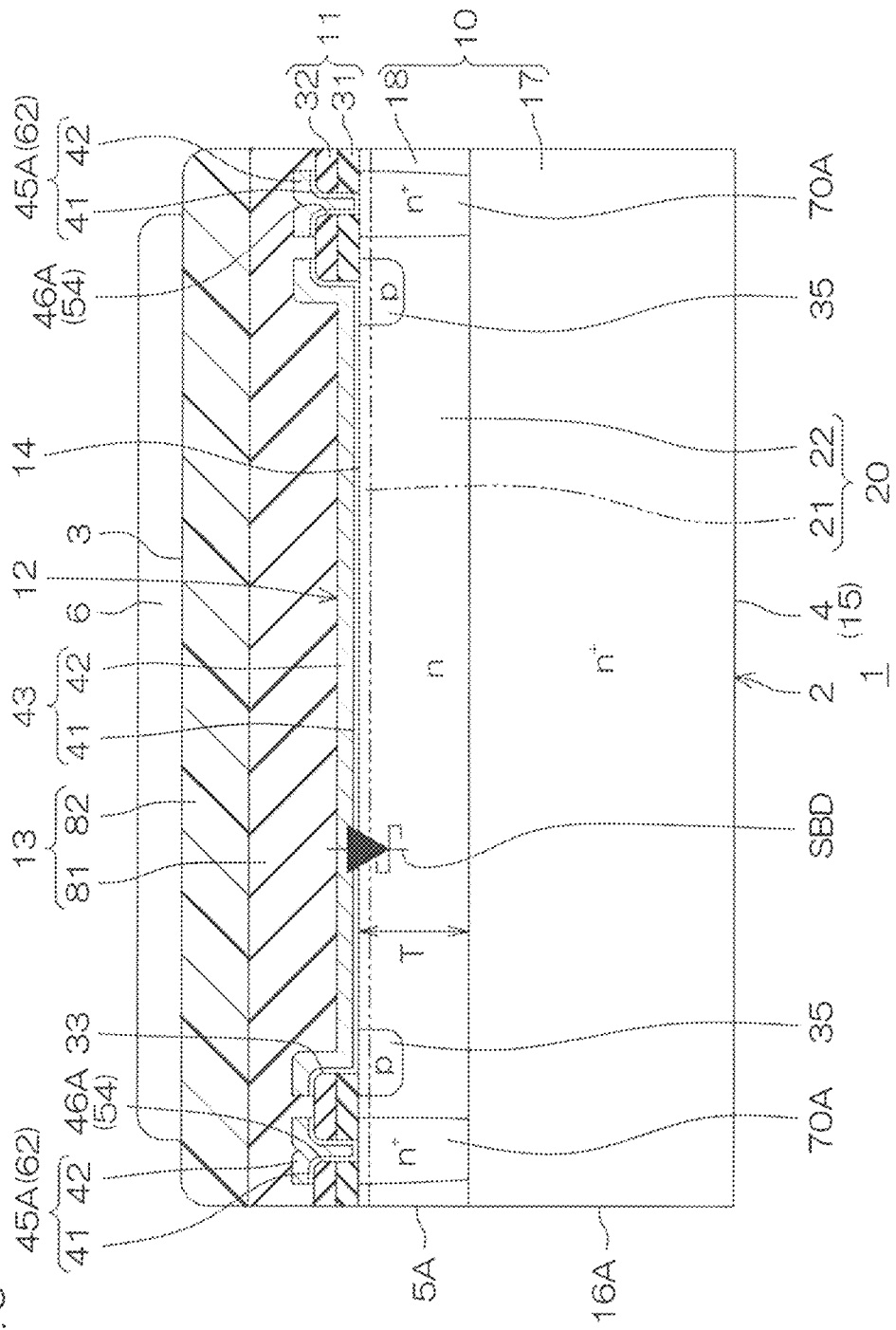
FIG. 5 is a sectional view taken along line V-V shown in FIG. 3.
Figure 7A:
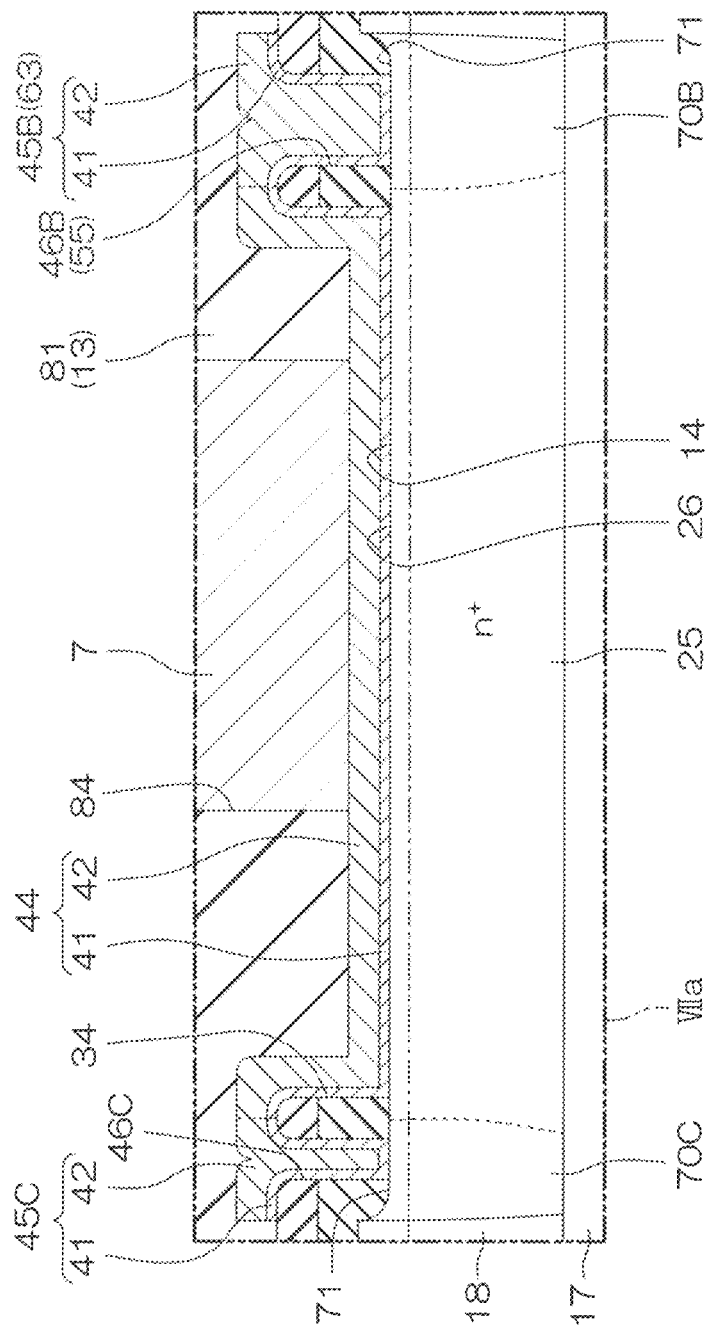
FIG. 7A is an enlarged view of a region VIIA shown in FIG. 4.

FIG. 3 is a plan view of an internal structure of the SBD chip 1 shown in FIG. 1. FIG. 4 is a sectional view taken along line IV-IV shown in FIG. 3. FIG. 5 is a sectional view taken along line V-V shown in FIG. 3. FIG. 6 is a sectional view taken along line VI-VI shown in FIG. 3. FIG. 7A is an enlarged view of a region VIIA shown in FIG. 4. FIG. 7B is an enlarged view of a region VIIB shown in FIG. 4.

Referring to FIG. 3 to FIG. 6, the chip main body 2 includes a semiconductor layer 10, a front surface insulating layer 11 formed on the semiconductor layer 10, a front surface electrode layer 12 formed on the front surface insulating layer 11, and a top insulating layer 13 formed on the front surface electrode layer 12.

The first major surface 3 of the chip main body 2 is formed by the top insulating layer 13. The second major surface 4 of the chip main body 2 is formed by the semiconductor layer 10. The side surfaces 5A and 5B of the chip main body 2 are formed by the semiconductor layer 10, the front surface insulating layer 11, and the top insulating layer 13. The first external terminal 6 and the second external terminal 7 are formed across an interval from each other on the top insulating layer 13.

In the present preferred embodiment, the semiconductor layer 10 is formed in a rectangular parallelepiped shape. The semiconductor layer 10 includes a first major surface 14 on one side, a second major surface 15 on the other side, and side surfaces 16A and 16B connecting the first major surface 14 and the second major surface 15. The second major surface 15 of the semiconductor layer 10 forms the second major surface 4 of the chip main body 2. The side surfaces 16A and 16B of the semiconductor layer 10 respectively form portions of the side surfaces 5A and 5B of the chip main body 2.

The semiconductor layer 10 has a laminated structure including an $n^+$ type semiconductor substrate 17 and an n type epitaxial layer 18 formed on the $n^+$ type semiconductor substrate 17.

The $n^+$ type semiconductor substrate 17 may include an $n^+$ type silicon substrate. The $n^+$ type semiconductor substrate 17 is formed as a region of high concentration and low resistance with a comparatively high n type impurity concentration. A specific resistance of the $n^+$ type semiconductor substrate 17 may be not less than 1.0 mΩ·cm and not more than 5.0 Ω·cm (e.g. approximately 3.0 Ω·cm).

The n type epitaxial layer 18 is formed as a region of low concentration and high resistance having an n type impurity concentration lower than the n type impurity concentration of the $n^+$ type semiconductor substrate 17. A specific resistance of the n type epitaxial layer 18 may be not less than 0.4 Ω·cm and not more than 1.0 Ω·cm (e.g. approximately 0.7 Ω·cm).

A thickness T of the n type epitaxial layer 18 may be not less than 2.0 µm and not more than 3.0 µm. The thickness T of the n type epitaxial layer 18 may be not less than 2.0 µm and not more than 2.5 µm. The thickness T of the n type epitaxial layer 18 may be not less than 2.0 µm and not more than 2.2 µm.

Referring to FIG. 4 and FIG. 5, an n type diode region 20 is formed in a surface layer portion of the first major surface 14 of the semiconductor layer 10. In the present preferred embodiment, the n type diode region 20 is formed using a region of a portion of the n type epitaxial layer 18. At the second major surface 15 side of the semiconductor layer 10, the n type diode region 20 is electrically connected to the n⁺ type semiconductor substrate 17.

The n type diode region 20 extends across a central region of the semiconductor layer 10 from a region directly below the first external terminal 6 to a region directly below the second external terminal 7. The n type diode region 20 may be formed in a rectangular shape parallel to the four sides of the semiconductor layer 10 in the plan view.

A ratio of a planar area of the n type diode region 20 with respect to a planar area of the semiconductor layer 10 may be not less than 0.3. The ratio of the planar area of the n type diode region 20 with respect to the planar area of the semiconductor layer 10 is preferably not less than 0.5.

The n type diode region 20 includes a surface layer region 21 formed in a surface layer portion of the n type diode region 20, and a lower layer region 22 formed at a side of the second major surface 15 of the semiconductor layer 10 with respect to the surface layer region 21. The surface layer region 21 is an n type low concentration region with a comparatively low n type impurity concentration. The lower layer region 22 is an n type high concentration region having an n type impurity concentration higher than the n type impurity concentration of the surface layer region 21.

More specifically, the surface layer region 21 is an n type low concentration region, which includes an n type impurity and a p type impurity and with which the n type impurity concentration of the n type impurity is higher than a p type impurity concentration of the p type impurity. The n type impurity includes, for example, phosphorus or arsenic. The p type impurity includes, for example, boron.

In the present preferred embodiment, the p type impurity is introduced into the entire surface layer portion of the first major surface 14 of the semiconductor layer 10. In FIG. 4 to FIG. 7B, the region in which the p type impurity is introduced, and the surface layer region 21 are indicated by alternate long and two short dashed lines.

Figure 8:
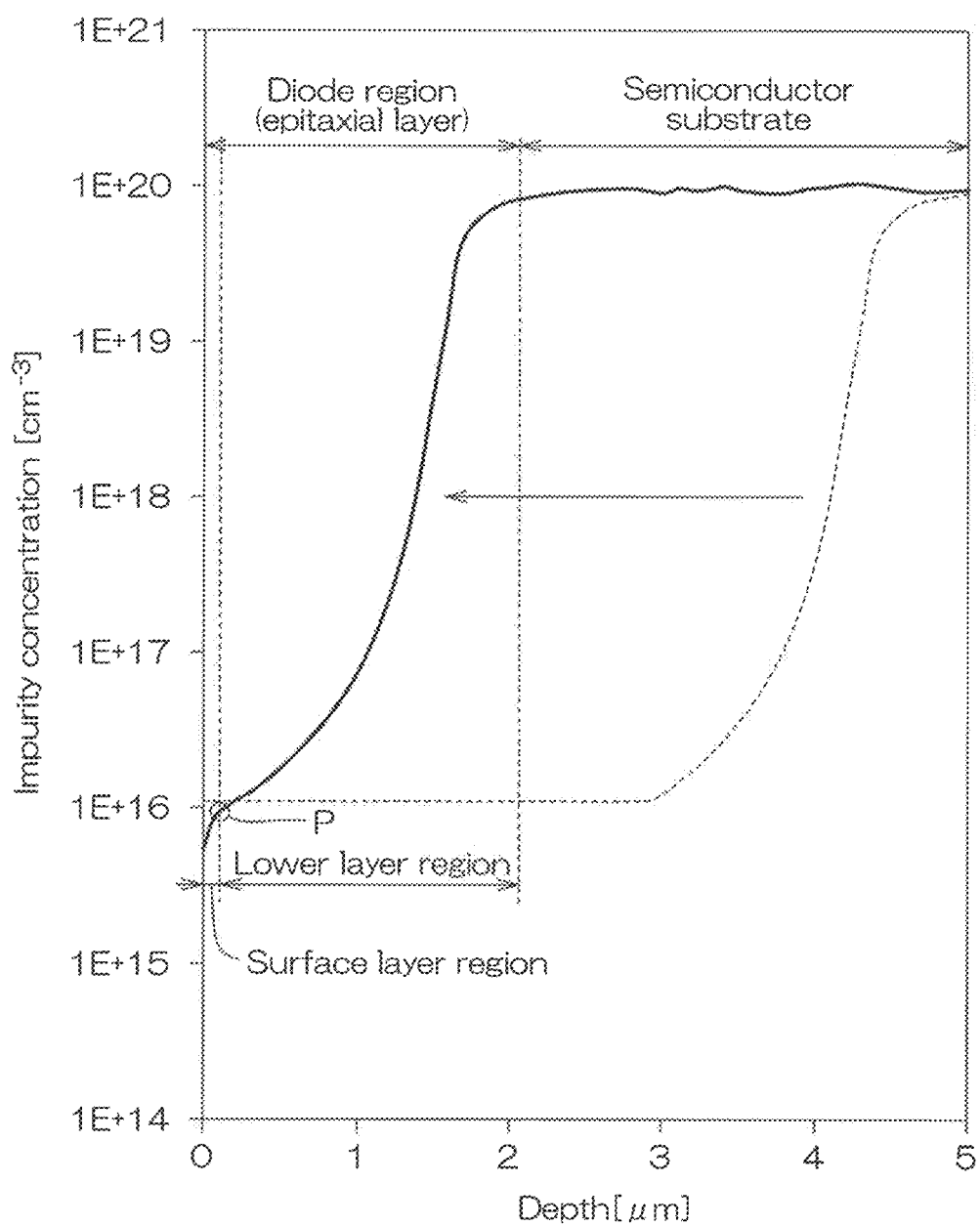
FIG. 8 is a graph of a concentration profile of a diode region.

A concentration profile of the n type diode region 20 that includes the surface layer region 21 and the lower layer region 22 is described using the graph of FIG. 8. FIG. 8 is a graph of the concentration profile of the n type diode region 20.

In FIG. 8, the ordinate is the n type impurity concentration and the abscissa is a depth of the semiconductor layer 10. The abscissa expresses the depth of the semiconductor layer 10, in case where the first major surface 14 of the semiconductor layer 10 is set to zero.

In FIG. 8, the concentration profile of the n type diode region 20 according to the present preferred embodiment is indicated by a solid line. The n type epitaxial layer 18, serving as a base of the n type diode region 20 according to the present preferred embodiment, has a thickness T of not less than 2.0 µm and not more than 3.0 µm.

In FIG. 8, the concentration profile of the n type diode region 20 according to a reference example is indicated by a broken line. The n type epitaxial layer 18, serving as a base of the n type diode region 20 according to the reference example, has a thickness T of 4 µm.

Referring to FIG. 8, the n type diode region 20 according to the reference example has a uniform n type impurity concentration of approximately $1.0 \times 10^{16}$ cm$^{-3}$ in a range of not less than 0 µm and not more than 3 µm.

On the other hand, with the n type diode region 20 according to the present preferred embodiment, the n type impurity concentration at the first major surface 14 side of the semiconductor layer 10 is lower than the n type impurity concentration at the second major surface 15 side of the semiconductor layer 10.

Also, the n type diode region 20 according to the present preferred embodiment has a concentration profile with which the n type impurity concentration increases (increases monotonously) from the first major surface 14 toward the second major surface 15 of the semiconductor layer 10.

The n type impurity concentration of the n type diode region 20 according to the present preferred embodiment is increased more than the n type impurity concentration of the n type diode region 20 according to the reference example across substantially the entire depth direction. This is because the entire n type epitaxial layer 18 is formed inside a region in which the n type impurity of the n⁺ type semiconductor substrate 17 is diffusible.

The n type impurity concentration of the n type diode region 20 according to the present preferred embodiment is thereby increased more than the n type impurity concentration of the n type diode region 20 according to the reference example. A resistance value of the n type diode region 20 according to the present preferred embodiment is thus lower than a resistance value of the n type diode region 20 according to the reference example.

The n type diode region 20 according to the present preferred embodiment has, in the surface layer portion of the n type diode region 20, an inflection point P, at which a slope characteristic of a tangent to the n type impurity concentration changes from a decrease to an increase. The inflection point P is a boundary region between the surface layer region 21 and the lower layer region 22.

The surface layer region 21 is formed in a region between the inflection point P and the first major surface 14 of the semiconductor layer 10. The lower layer region 22 is formed in a region between the inflection point P and the n⁺ type semiconductor substrate 17.

The surface layer region 21 of the n type diode region 20 has a concentration profile where an absolute value of an amount of change of the n type impurity concentration per unit depth gradually increases from the inflection point P (the boundary region between the surface layer region 21 and the lower layer region 22) toward the first major surface 14 of the semiconductor layer 10.

The lower layer region 22 of the n type diode region 20 has a concentration profile where the absolute value of the amount of change of the n type impurity concentration per unit depth gradually decreases from the n⁺ type semiconductor substrate 17 toward the inflection point P.

In the surface layer region 21 of the n type diode region 20, the n type impurity concentration decreases suddenly from the inflection point P toward the first major surface 14 of the semiconductor layer 10. The absolute value of the amount of change of the n type impurity concentration per unit depth of the surface layer region 21 in a vicinity of the first major surface 14 of the semiconductor layer 10 is greater than the absolute value of the amount of change of the n type impurity concentration per unit depth of the lower layer region 22 in a vicinity of the inflection point P.

A portion of the n type impurity forming the surface layer portion of the n type diode region 20 is offset by the p type impurity introduced into the surface layer portion of the n type diode region 20. The concentration profile of the surface layer region 21 is formed thereby.

The n type impurity concentration of the surface layer region 21 is less than $1.0 \times 10^{16}$ cm$^{-3}$. The n type impurity concentration of the lower layer region 22 is not less than $1.0 \times 10^{16}$ cm$^{-3}$ and not more than $1.0 \times 10^{20}$ cm$^{-3}$. The reason why the surface layer region 21 is provided in the surface layer portion of the n type diode region 20 shall be described in detail later.

Referring to FIG. 4 to FIG. 6, an n$^+$ type impurity region 25 (first conductivity type impurity region) is formed in the surface layer portion of the first major surface 14 of the semiconductor layer 10. The n$^+$ type impurity region 25 is formed by introduction of the n type impurity into the n type epitaxial layer 18.

The n$^+$ type impurity region 25 has an n type impurity concentration higher than the n type impurity concentration of the n type diode region 20 (n type epitaxial layer 18). The n$^+$ type impurity region 25 is formed as a region of high concentration and low resistance with a comparatively high n type impurity concentration.

The n$^+$ type impurity region 25 is formed in a region in the surface layer portion of the first major surface 14 of the semiconductor layer 10 that is directly below the second external terminal 7. The n$^+$ type impurity region 25 extends along the short direction of the semiconductor layer 10 in the plan view.

The n$^+$ type impurity region 25 is formed in a rectangular shape parallel to the four sides of the semiconductor layer 10 in the plan view. The n$^+$ type impurity region 25 is electrically connected to the n type diode region 20. Referring to FIG. 7A, a first recess portion 26 recessed by one step is formed in a portion of the first major surface 14 of the semiconductor layer 10 at which the n$^+$ type impurity region 25 is exposed.

Referring to FIG. 4 to FIG. 6, the front surface insulating layer 11 is formed on the first major surface 14 of the semiconductor layer 10. The front surface insulation layer 11 covers the entire first major surface 14 of the semiconductor layer 10. The front surface insulating layer 11 has a laminated structure that includes a silicon oxide film 31 and a USG (Undoped Silica Glass) film 32 formed on the silicon oxide film 31.

The front surface insulating layer 11 may have a single layer structure constituted of the silicon oxide film 31 or the USG film 32. A first opening 33 exposing the n type diode region 20, and a second opening 34 exposing the n$^+$ type impurity region 25 are formed in the front surface insulating layer 11.

Referring to FIG. 3, the first opening 33 is formed so as to expose an inner region, besides a peripheral edge, of the n type diode region 20. The first opening 33 is formed in a rectangular shape parallel to the respective sides of the n type diode region 20.

The second opening 34 is formed so as to expose an inner region, besides a peripheral edge, of the n$^+$ type impurity region 25. The second opening 34 is formed in a rectangular shape parallel to the respective sides of the n$^+$ type impurity region 25.

Referring to FIG. 4 and FIG. 5, a p type guard ring region 35 is formed in the surface layer portion of the first major surface 14 of the semiconductor layer 10 (in a surface layer portion of the n type epitaxial layer 18). The p type guard ring region 35 is formed to a quadrilateral annular shape along a peripheral edge of the n type diode region 20.

The p type guard ring region 35 is formed along an inner wall of the first opening 33. The p type guard ring region 35 crosses the inner wall of the first opening 33 and spans across a region at an inner side and a region at an outer side of the first opening 33 in the plan view. The p type guard ring region 35 thus exposes the n type diode region 20.

Electric field concentrates readily at a portion at which the inner wall of the first opening 33 contacts the n type diode region 20. Therefore, by forming the p type guard ring region 35 so as to contact the inner wall of the first opening 33, the electric field generated at the portion at which the inner wall of the first opening 33 contacts the n type diode region 20 can be relaxed. Improvement of withstand voltage of the SBD chip 1 can thereby be achieved.

Referring to FIG. 3 to FIG. 5, the front surface electrode layer 12 is formed on the front surface insulating layer 11. The front surface electrode layer 12 includes a metal material having a specific resistance lower than a specific resistance of the semiconductor layer 10. The front surface electrode layer 12 has a laminated structure that includes a first conductor film 41 formed on the front surface insulating layer 11, and a second conductor film 42 formed on the first conductor film 41.

The first conductor film 41 may have a single layer structure constituted of a titanium nitride layer or a titanium layer. The first conductor film 41 may have a laminated structure that includes a titanium nitride layer, and a titanium layer formed on the titanium nitride layer. By including the titanium nitride layer and/or the titanium layer, the first conductor film 41 functions as a barrier layer.

The second conductor film 42 is formed of a metal material having a specific resistance lower than a specific resistance of the first conductor film 41. The second conductor film 42 includes at least one type of metal material among copper, aluminum, alloys that include copper, or alloys that include aluminum.

The second conductor film 42 may include an aluminum-copper alloy (Al—Cu alloy). The second conductor film 42 may include an aluminum-silicon-copper alloy (Al—Si—Cu alloy).

The front surface electrode layer 12 includes an anode electrode layer 43 (first electrode layer) and a cathode electrode layer 44 (second electrode layer). In FIG. 3, the anode electrode layer 43 and the cathode electrode layer 44 are indicated by cross hatching.

The anode electrode layer 43 extends along the long direction of the semiconductor layer 10. The anode electrode layer 43 is formed in a rectangular shape parallel to the respective sides of the first opening 33. The anode electrode layer 43 enters into the first opening 33 from above the front surface insulating layer 11.

The anode electrode layer 43 is electrically connected to the n type diode region 20 and the p type guard ring region 35 in the first opening 33. The anode electrode layer 43 forms a Schottky junction with the n type diode region 20. More specifically, the anode electrode layer 43 forms a Schottky junction with the surface layer region 21, which, in the n type diode region 20, is comparatively low in n type impurity concentration.

A Schottky barrier diode SBD, having the anode electrode layer 43 as an anode and the n type diode region 20 as a cathode, is thereby formed. The Schottky barrier diode SBD is formed in a boundary region between the anode electrode layer 43 and the n type diode region 20.

The cathode electrode layer 44 extends along the short direction of the semiconductor layer 10. The cathode electrode layer 44 is formed in a rectangular shape parallel to the respective sides of the first opening 33. The cathode electrode layer 44 enters into the second opening 34 from above the front surface insulating layer 11. The cathode electrode layer 44 is electrically connected to the n$^+$ type impurity region 25 in the second opening 34.

The cathode electrode layer 44 forms an ohmic junction with the n$^+$ type impurity region 25. A current path, connecting the anode electrode layer 43, the n type diode region 20, the n$^+$ type semiconductor substrate 17, the n$^+$ type impurity region 25, and the cathode electrode layer 44 is thereby formed.

Referring to FIG. 3 to FIG. 6, the front surface electrode layer 12 further includes contact electrode layers 45A, 45B, and 45C. The contact electrode layers 45A, 45B, and 45C include the first contact electrode layer 45A, the second contact electrode layer 45B, and the third contact electrode layer 45C.

The contact electrode layers 45A, 45B, and 45C are electrically connected to the cathode electrode layer 44. That is, the contact electrode layers 45A, 45B, and 45C form a portion of the current path connecting the anode electrode layer 43 and the cathode electrode layer 44.

The contact electrode layers 45A, 45B, and 45C are provided to achieve reduction of resistance value between the anode electrode layer 43 and the cathode electrode layer 44. The contact electrode layers 45A, 45B, and 45C and a structure of a periphery thereof shall be described specifically below.

Referring to FIG. 3 to FIG. 6, contact holes 46A, 46B, and 46C are formed in the front surface insulating layer 11. The contact holes 46A, 46B, and 46C include the first contact hole 46A, the second contact hole 46B, and the third contact hole 46C.

The first contact hole 46A is formed in a first peripheral region 51 of the front surface insulating layer 11 that surrounds the anode electrode layer 43 (first opening 33). The first peripheral region 51 includes a region defined by a peripheral edge of the anode electrode layer 43 and a peripheral edge of the semiconductor layer 10.

The second contact hole 46B is formed in a second peripheral region 52 of the front surface insulating layer 11 that surrounds the cathode electrode layer 44 (second opening 34). The second peripheral region 52 includes a region defined by a peripheral edge of the cathode electrode layer 44 and the peripheral edge of the semiconductor layer 10.

The third contact hole 46C is formed in an intermediate region 57 between the anode electrode layer 43 (first opening 33) and the cathode electrode layer 44 (second opening 34).

The first contact hole 46A extends as a band in the first peripheral region 51. The first contact hole 46A includes a first contact facing portion 53 and a pair of first contact line portions 54.

The first contact facing portion 53 faces the second opening 34 across the first opening 33 in the plan view. The first contact facing portion 53 extends as a band along the short direction of the semiconductor layer 10. The first contact facing portion 53 is formed across an interval from the first opening 33.

The pair of first contact line portions 54 are lead out toward the second opening 34 side from the first contact facing portion 53. More specifically, the pair of first contact line portions 54 are lead out as bands toward the second opening 34 side from both end portions of the first contact facing portion 53 so as to sandwich the first opening 33. The pair of first contact line portions 54 are formed across intervals from the first opening 33.

The second contact hole 46B extends as a band in the second peripheral region 52. The second contact hole 46B includes a second contact facing portion 55 and a pair of second contact line portions 56.

The second contact facing portion 55 faces the first opening 33 across the second opening 34 in a direction along the first major surface 14 of the semiconductor layer 10. The second contact facing portion 55 extends as a band along the short direction of the semiconductor layer 10. The second contact facing portion 55 is formed across an interval from the second opening 34.

The pair of second contact line portions 56 are lead out toward the first opening 33 side from the second contact facing portion 55. The pair of second contact line portions 56 are lead out as bands toward the first opening 33 side from both end portions of the second contact facing portion 55 so as to sandwich the second opening 34. The pair of second contact line portions 56 are formed across intervals from the second opening 34.

The third contact hole 46C extends as a band along the short direction of the semiconductor layer 10 in the intermediate region 57. In the intermediate region 57, the third contact hole 46C is formed across intervals from the first opening 33 and the second opening 34.

At end portions at the second opening 34 side, the pair of first contact line portions 54 are in communication with the third contact hole 46C. A contact hole of quadrilateral annular shape surrounding the anode electrode layer 43 (first opening 33) in the plan view is formed by the first contact hole 46A and the third contact hole 46C.

At end portions at the first opening 33 side, the pair of second contact line portions 56 are in communication with the third contact hole 46C. A contact hole of quadrilateral annular shape surrounding the cathode electrode layer 44 (second opening 34) in the plan view is formed by the second contact hole 46B and the third contact hole 46C.

Although the second contact hole 46B is formed across an interval from the second opening 34, the second contact hole 46B may be continuous to the second opening 34. Although the third contact hole 46C is formed across an interval from the second opening 34, the third contact hole 46C may be continuous to the second opening 34.

A width WA of the first contact hole 46A in regard to a direction orthogonal to a direction in which the first contact hole 46A extends may be not less than 1 μm and not more than 15 μm (e.g. approximately 5 μm).

A width WB of the second contact hole 46B in regard to a direction orthogonal to a direction in which the second contact hole 46B extends may be not less than 1 μm and not more than 15 μm (e.g. approximately 10 μm).

A width WC of the third contact hole 46C in regard to a direction orthogonal to a direction in which the third contact hole 46C extends may be not less than 1 μm and not more than 15 μm (e.g. approximately 5 μm).

The first contact electrode layer 45A is formed on the first peripheral region 51 of the front surface insulating layer 11. The first contact electrode layer 45A extends as a band in the first peripheral region 51. The first contact electrode layer 45A includes a first electrode facing portion 61 and a pair of first electrode line portions 62.

The first electrode facing portion 61 faces the cathode electrode layer 44 across the anode electrode layer 43 in the plan view. The first electrode facing portion 61 extends as a band along the short direction of the semiconductor layer 10.

The first electrode facing portion 61 is formed across an interval from the anode electrode layer 43.

The first electrode facing portion 61 enters into the first contact facing portion 53 from above the front surface insulating layer 11. The first electrode facing portion 61 is connected to the first major surface 14 of the semiconductor layer 10 inside the first contact facing portion 53.

The pair of first electrode line portions 62 are lead out toward the cathode electrode layer 44 side from the first electrode facing portion 61 in the plan view. The pair of first electrode line portions 62 are lead out as bands toward the cathode electrode layer 44 side from both end portions of the first electrode facing portion 61 so as to sandwich the anode electrode layer 43.

The pair of first electrode line portions 62 are formed across intervals from the anode electrode layer 43. The pair of first electrode line portions 62 enter into the pair of first contact line portions 54 from above the front surface insulating layer 11. The pair of first electrode line portions 62 are connected to the first major surface 14 of the semiconductor layer 10 inside the pair of first contact line portions 54.

A width DA of the first contact electrode layer 45A in regard to a direction orthogonal to a direction in which the first contact electrode layer 45A extends is formed to be wider than the width WA of the first contact hole 46A. The width DA of the first contact electrode layer 45A may be not less than 1 μm and not more than 15 μm (e.g. approximately 8 μm).

The second contact electrode layer 45B is formed on the second peripheral region 52 of the front surface insulating layer 11. The second contact electrode layer 45B extends as a band in the second peripheral region 52. The second contact electrode layer 45B includes a second electrode facing portion 63 and a pair of second electrode line portions 64.

The second electrode facing portion 63 faces the anode electrode layer 43 across the cathode electrode layer 44 in the plan view. The second electrode facing portion 63 extends as a band along the short direction of the semiconductor layer 10.

The second electrode facing portion 63 enters into the second contact facing portion 55 from above the front surface insulating layer 11. The second electrode facing portion 63 is connected to the first major surface 14 of the semiconductor layer 10 inside the second contact facing portion 55.

The pair of second electrode line portions 64 are lead out toward the anode electrode layer 43 side from the second electrode facing portion 63 in the plan view. The pair of second electrode line portions 64 are lead out as bands toward the anode electrode layer 43 side from both end portions of the second electrode facing portion 63 so as to sandwich the cathode electrode layer 44.

The pair of second electrode line portions 64 enter into the pair of second contact line portions 56 from above the front surface insulating layer 11. The pair of second electrode line portions 64 are connected to the second major surface 14 of the semiconductor layer 10 inside the pair of second contact line portions 56.

A width DB of the second contact electrode layer 45B in regard to a direction orthogonal to a direction in which the second contact electrode layer 45B extends is formed to be wider than the width WB of the second contact hole 46B. The width DB of the second contact electrode layer 45B may be not less than 1 μm and not more than 20 μm (e.g. approximately 20 μm).

As shown in FIG. 3, in the second contact electrode layer 45B, the second electrode facing portion 63 and the pair of second electrode line portions 64 may be continuous to the cathode electrode layer 44 at the entire inner peripheries thereof.

That is, the second contact electrode layer 45B may form a portion of the cathode electrode layer 44. In another preferred embodiment, the second electrode facing portion 63 and the pair of second electrode line portions 64 in the second contact electrode layer 45B may be formed across intervals from the cathode electrode layer 44.

The third contact electrode layer 45C is formed on the intermediate region 57 of the front surface insulating layer 11. In the intermediate region 57, the third contact electrode layer 45C extends as a band along the short direction of the semiconductor layer 10.

The third contact electrode layer 45C is formed across intervals from the anode electrode layer 43 and the cathode electrode layer 44. The third contact electrode layer 45C enters into the third contact hole 46C from above the front surface insulating layer 11. Inside the third contact hole 46C, the third contact electrode layer 45C is connected to the first major surface 14 of the semiconductor layer 10.

A width DC of the third contact electrode layer 45C in regard to a direction orthogonal to a direction in which the third contact electrode layer 45C extends is formed to be wider than the width WC of the third contact hole 46C. The width DC of the third contact electrode layer 45C may be not less than 1 μm and not more than 15 μm (e.g. approximately 8 μm).

The third contact electrode layer 45C may be continuous to the cathode electrode layer 44. That is, the third contact electrode layer 45C may form a portion of the cathode electrode layer 44. In another preferred embodiment, the third contact electrode layer 45C may be formed across an interval from the cathode electrode layer 44.

At end portions at the cathode electrode layer 44 side, the pair of first electrode line portions 62 are continuous to the third contact electrode layer 45C. The pair of first electrode line portions 62 are thereby lead out from the third contact electrode layer 45C (cathode electrode layer 44) so as to sandwich the anode electrode layer 43. A quadrilateral annular contact electrode layer surrounding the anode electrode layer 43 in the plan view is formed by the first contact electrode layer 45A and the third contact electrode layer 45C.

At end portions at the anode electrode layer 43 side, the pair of second electrode line portions 64 are continuous to the third contact electrode layer 45C. The pair of second electrode line portions 64 are thereby lead out from the third contact electrode layer 45C so as to sandwich the cathode electrode layer 44. A quadrilateral annular contact electrode layer surrounding the cathode electrode layer 44 in the plan view is formed by the second contact electrode layer 45B and the third contact electrode layer 45C.

The anode electrode layer 43 includes a facing region facing the cathode electrode layer 44 and a non-facing region not facing the cathode electrode layer 44. The cathode electrode layer 44 includes a facing region facing the anode electrode layer 43 and a non-facing region not facing the anode electrode layer 43.

In the first peripheral region 51, the first contact electrode layer 45A is formed so as to conform to the non-facing region of the anode electrode layer 43. In the second peripheral region 52, the second contact electrode layer 45B is formed so as to conform to the non-facing region of the cathode electrode layer 44. In the intermediate region 57, the third contact electrode layer 45C is formed to conform to the facing region of the cathode electrode layer 44 and the facing region of the anode electrode layer 43.

A portion of a current that flowed into the n type diode region 20 from the anode electrode layer 43 flows into the first contact electrode layer 45A, the second contact electrode layer 45B, and the third contact electrode layer 45C, which have comparatively low specific resistances, via the semiconductor layer 10 and flows to the cathode electrode layer 44. Reduction of resistance value of the current path formed between the anode electrode layer 43 and the cathode electrode layer 44 is thereby achieved.

Referring to FIG. 4 to FIG. 6, in the present preferred embodiment, $n^+$ type contact regions 70A, 70B, and 70C are further formed in the surface layer portion of the first major surface 14 of the semiconductor layer 10. Further reduction of the resistance value of the current path formed between the anode electrode layer 43 and the cathode electrode layer 44 is achieved by the $n^+$ type contact regions 70A, 70B, and 70C.

In the surface layer portion of the first major surface 14 of the semiconductor layer 10, the $n^+$ type contact regions 70A, 70B, and 70C are formed in a peripheral region of the n type diode region 20. Referring to FIG. 7B, a second recess portion 71 recessed by one step is formed in a portion of the first major surface 14 of the semiconductor layer 10 at which the $n^+$ type contact regions 70A, 70B, and 70C are exposed.

The $n^+$ type contact regions 70A, 70B, and 70C are formed by introduction of the n type impurity into the n type epitaxial layer 18. The $n^+$ type contact regions 70A, 70B, and 70C have an n type impurity concentration higher than the n type impurity concentration of the n type diode region 20 (n type epitaxial layer 18).

The $n^+$ type contact regions 70A, 70B, and 70C have an n type impurity concentration substantially equal to the n type impurity concentration of the $n^+$ type impurity region 25. The $n^+$ type contact regions 70A, 70B, and 70C are formed as regions of high concentration and low resistance with a comparatively high n type impurity concentration.

The $n^+$ type contact regions 70A, 70B, and 70C include the first contact region 70A, the second contact region 70B, and the third contact region 70C.

The first contact region 70A is formed at least in a region in the surface layer portion of the first major surface 14 of the semiconductor layer 10 that faces the first contact electrode layer 45A.

The second contact region 70B is formed at least in a region in the surface layer portion of the first major surface 14 of the semiconductor layer 10 that faces the second contact electrode layer 45B.

The third contact region 70C is formed at least in a region in the surface layer portion of the first major surface 14 of the semiconductor layer 10 that faces the third contact electrode layer 45C.

The first contact region 70A is, more specifically, formed along the first electrode facing portion 61 and the pair of first electrode line portions 62 so as to face the first contact electrode layer 45A. In the present preferred embodiment, the first contact region 70A faces the entire first contact electrode layer 45A. The first contact region 70A is electrically connected to the n type diode region 20 and the $n^+$ type impurity region 25.

The first contact region 70A is exposed from the entire first contact hole 46A. The first contact region 70A is electrically connected to the first contact electrode layer 45A inside the first contact hole 46A.

The n type diode region 20 is thereby electrically connected via the first contact region 70A to the first contact electrode layer 45A, the $n^+$ type impurity region 25, and the cathode electrode layer 44.

The second contact region 70B is, more specifically, formed along the second electrode facing portion 63 and the pair of second electrode line portions 64 so as to face the second contact electrode layer 45B. In the present preferred embodiment, the first contact region 70A faces the entire second contact electrode layer 45B. The second contact region 70B is electrically connected to the n type diode region 20 and the $n^+$ type impurity region 25.

The second contact region 70B is exposed from the entire second contact hole 46B. The second contact region 70B is electrically connected to the second contact electrode layer 45B inside the second contact hole 46B.

The n type diode region 20 is thereby electrically connected via the second contact region 70B to the second contact electrode layer 45B, the $n^+$ type impurity region 25, and the cathode electrode layer 44.

The third contact region 70C is, more specifically, formed along the third contact electrode layer 45C so as to face the third contact electrode layer 45C. In the present preferred embodiment, the third contact region 70C faces the entire third contact electrode layer 45C. The third contact region 70C is electrically connected to the n type diode region 20 and the $n^+$ type impurity region 25.

The third contact region 70C is exposed from the entire third contact hole 46C. The third contact region 70C is electrically connected to the third contact electrode layer 45C inside the third contact hole 46C.

The n type diode region 20 is thereby electrically connected via the third contact region 70C to the third contact electrode layer 45C, the $n^+$ type impurity region 25, and the cathode electrode layer 44.

A portion of the current that flowed into the n type diode region 20 from the anode electrode layer 43 flows into the contact electrode layers 45A, 45B, and 45C via the $n^+$ type contact regions 70A, 70B, and 70C, which have lower resistance values than the n type diode region 20.

A resistance value of the semiconductor layer 10 (n type epitaxial layer 18) can thereby be reduced as compared with a case where the $n^+$ type contact regions 70A, 70B, and 70C are not formed and therefore, the resistance value of the current path between the anode electrode layer 43 and the cathode electrode layer 44 can be reduced further.

Referring to FIG. 4 to FIG. 6, the top insulating layer 13 is formed on the front surface insulating layer 11 so as to cover the front surface electrode layer 12. In the present preferred embodiment, the top insulating layer 13 covers substantially the entire front surface electrode layer 12. The top insulating layer 13 has a laminated structure that includes a passivation film 81 and a resin film 82 formed on the passivation film 81.

The passivation film 81 may include silicon nitride. The resin film 82 may include a polyimide resin. An anode pad opening 83 exposing the anode electrode layer 43, and a cathode pad opening 84 exposing the cathode electrode layer 44 are formed in the top insulating layer 13.

The first external terminal 6 is formed in the anode pad opening 83. The first external terminal 6 is electrically connected to the anode electrode layer 43 in the anode pad opening 83. The first external terminal 6 is thereby electrically connected to the n type diode region 20 via the anode electrode layer 43.

The first external terminal 6 is formed so as to project from the top insulating layer 13. The first external terminal 6 has a covering portion that covers the top insulating layer 13. The first external terminal 6 may have a laminated structure in which a plurality of metal films are laminated. The plurality of metal films may include an Ni film, a Pd film, and an Au film laminated in that order from the anode electrode layer 43.

The second external terminal 7 is formed in the cathode pad opening 84. The second external terminal 7 is electrically connected to the cathode electrode layer 44 in the cathode pad opening 84. The second external terminal 7 is thereby electrically connected to the n type diode region 20 via the cathode electrode layer 44.

The second external terminal 7 is formed so as to project from the top insulating layer 13. The second external terminal 7 has a covering portion that covers the top insulating layer 13. The second external terminal 7 may have a laminated structure in which a plurality of metal films are laminated. The plurality of metal films may include an Ni film, a Pd film, and an Au film laminated in that order from the cathode electrode layer 44.

An SBD chip 601 according to a reference example, shown in FIG. 9, was prepared for comparison with electrical characteristics of the SBD chip 1. FIG. 9A is a plan view of an internal structure of the SBD chip 601 according to the reference example. FIG. 9B is a sectional view taken along line B-B shown in FIG. 9A. In FIG. 9B, just the structure at the first major surface 14 side of the semiconductor layer 10 is shown.

Referring to FIG. 9, the SBD chip 601 according to the reference example has substantially the same structure as the SBD chip 1 with the exception of not including the contact electrode layers 45A, 45B, and 45C, the contact holes 46A, 46B, and 46C, and the $n^+$ type contact regions 70A, 70B, and 70C. With the SBD chip 601 according to the reference example, arrangements corresponding to arrangements of the SBD chip 1 are provided with the same reference symbols and description thereof shall be omitted.

Next, influences of the thickness T of the n type epitaxial layer 18 (that is, the thickness of the n type diode region 20) of the SBD chip 601 according to the reference example on a forward voltage VF, a forward current IF, a reverse voltage VR, a reverse current IR, a breakdown voltage BV, etc., shall now be described.

The forward current IF is the current that flows between the first external terminal 6 and the second external terminal 7 (the anode electrode layer 43 and the cathode electrode layer 44) in a state where the forward voltage VF is applied between the first external terminal 6 and the second external terminal 7 (the anode electrode layer 43 and the cathode electrode layer 44).

The reverse current IR is the current that flows between the first external terminal 6 and the second external terminal 7 (the anode electrode layer 43 and the cathode electrode layer 44) in a state where the reverse voltage VR is applied between the first external terminal 6 and the second external terminal 7 (the anode electrode layer 43 and the cathode electrode layer 44).

The breakdown voltage BV is the voltage at which a breakdown phenomenon starts and the reverse current IR, flowing between the first external terminal 6 and the second external terminal 7 (the anode electrode layer 43 and the cathode electrode layer 44) in the state where the reverse voltage VR is applied between the first external terminal 6 and the second external terminal 7 (the anode electrode layer 43 and the cathode electrode layer 44), increases suddenly.

Here, four SBD chips 601A, 601B, 601C, and 601D according to the reference example that differ in the thickness T of the n type epitaxial layer 18 as shown in Table 1 below were prepared.

TABLE 1

| | SBD chip 601 according to reference example | | | |
|---|---|---|---|---|
| | A | B | C | D |
| Thickness T (μm) of the n type epitaxial layer 18 | 1.5 | 2.0 | 2.5 | 3.8 |

The SBD chip 601A is an SBD chip 601 with which the thickness T of the n type epitaxial layer 18 is set to 1.5 μm. The SBD chip 601B is an SBD chip 601 with which the thickness T of then type epitaxial layer 18 is set to 2.0 μm. The SBD chip 601C is an SBD chip 601 with which the thickness T of the n type epitaxial layer 18 is set to 2.5 μm. The SBD chip 601D is an SBD chip 601 with which the thickness T of the n type epitaxial layer 18 is set to 3.8 μm.

Results of determining the forward voltages VF, the reverse currents IR, and the breakdown voltages BV of the SBD chips 601A, 601B, 601C, and 601D by simulation are shown in FIG. 10 to FIG. 15.

Figure 10:
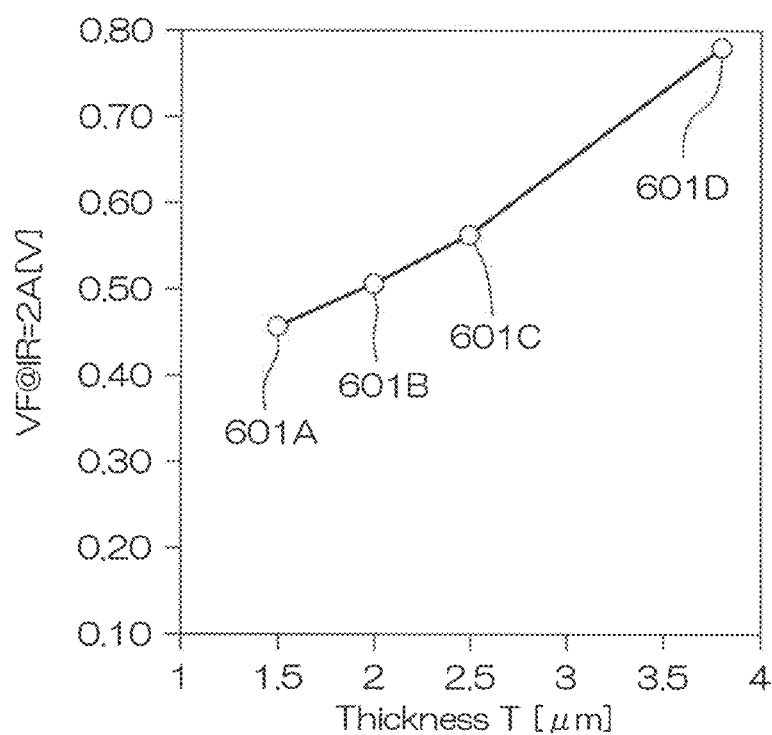
FIG. 10 is a graph for describing relationships of thickness of an n type epitaxial layer and forward voltage in SBD chips according to the reference example.

FIG. 10 is a graph for describing relationships of the thickness T of the n type epitaxial layer 18 and the forward voltage VF in the SBD chips 601A, 601B, 601C, and 601D according to the reference example shown in Table 1.

In FIG. 10, the ordinate is the forward voltage VF and the abscissa is the thickness T of the n type epitaxial layer 18. The forward voltage VF is the voltage between the first external terminal 6 and the second external terminal 7 when the forward current IF is 2 A.

Referring to FIG. 10, when the thickness T of the n type epitaxial layer 18 is decreased, the forward voltage VF is decreased. Also, when the thickness T of the n type epitaxial layer 18 is increased, the forward voltage VF is increased.

It is considered that the forward voltage VF increases in accordance with increase of the thickness T of the n type epitaxial layer 18 because the resistance value increases by just an amount corresponding to the increase of thickness T of the n type epitaxial layer 18.

It was thus found that a low forward voltage VF can be realized by making the thickness T of the n type epitaxial layer 18 small and reducing the resistance value of the n type epitaxial layer 18.

Figure 11:
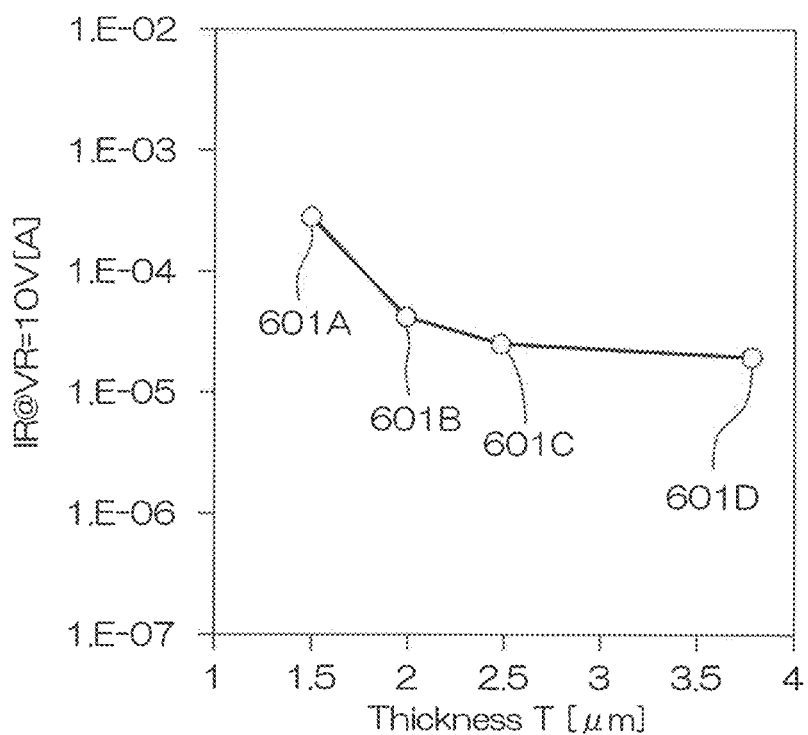
FIG. 11 is a graph for describing relationships of the thickness of the n type epitaxial layer and reverse current in the SBD chips according to the reference example.

FIG. 11 is a graph for describing relationships of the thickness T of the n type epitaxial layer 18 and the reverse current IR in the SBD chips 601A, 601B, 601C, and 601D according to the reference example shown in Table 1.

In FIG. 11, the ordinate is the reverse current IR and the abscissa is the thickness T of the n type epitaxial layer 18. The reverse current IR is the current that flows between the first external terminal 6 and the second external terminal 7 when the reverse voltage VR is 10 V.

Referring to FIG. 11, when the thickness T of the n type epitaxial layer 18 is decreased, the reverse current IR is increased. Also, when the thickness T of the n type epitaxial layer 18 is increased, the reverse current IR is decreased.

It is considered that the reverse current IR increases in accordance with decrease of the thickness T of the n type epitaxial layer 18 due to the n type impurity diffusing from the $n^+$ type semiconductor substrate 17.

More specifically, when the thickness T of the n type epitaxial layer 18 is decreased, the n type impurity concentration of the n type epitaxial layer 18, particularly that of the surface layer portion of the n type epitaxial layer 18 increases readily due to the n type impurity diffusing from the n+ type semiconductor substrate 17.

It is considered that consequently, increase of leak current occurs between the front surface electrode layer 12 and the n type epitaxial layer 18 and the reverse current IR increases.

In particular, the reverse current IR increases suddenly in a region where the thickness T of the n type epitaxial layer 18 is less than 2 μm as a result of increased influence of the n type impurity, diffusing from the n+ type semiconductor substrate 17, on the n type epitaxial layer 18.

It was thus found that in a case where the thickness T of the n type epitaxial layer 18 is made small, the increase of the reverse current IR can be suppressed by suppressing increase of the n type impurity concentration of the n type epitaxial layer 18, particularly the surface layer portion of the n type epitaxial layer 18.

Figure 12:
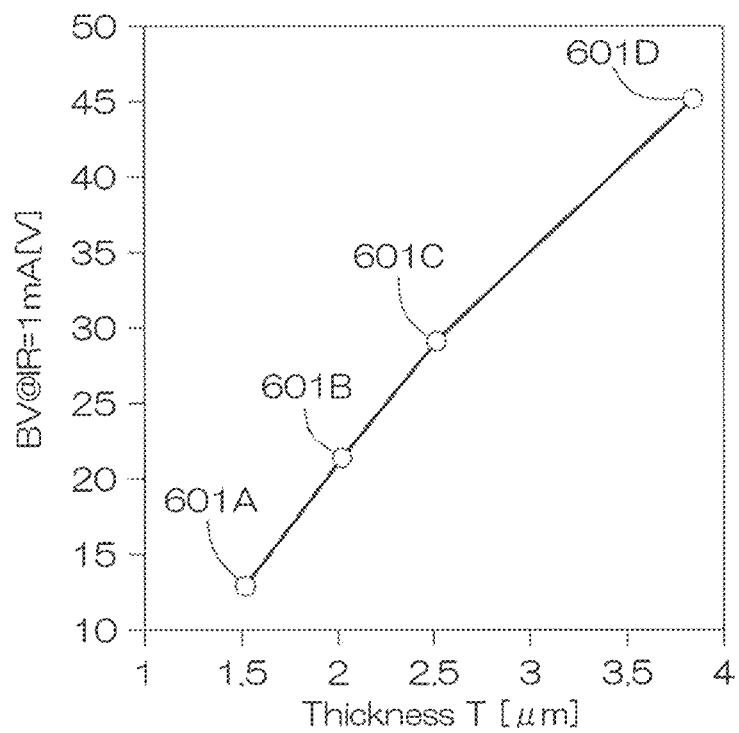
FIG. 12 is a graph for describing relationships of the thickness of the n type epitaxial layer and breakdown voltage in the SBD chips according to the reference example.

FIG. 12 is a graph for describing relationships of the thickness T of the n type epitaxial layer 18 and the breakdown voltage BV in the SBD chips 601A, 601B, 601C, and 601D according to the reference example shown in Table 1.

In FIG. 12, the ordinate is the breakdown voltage BV and the abscissa is the thickness T of the n type epitaxial layer 18. The breakdown voltage BV is the voltage between the first external terminal 6 and the second external terminal 7 when the reverse current IR is 1 mA.

Referring to FIG. 12, when the thickness T of the n type epitaxial layer 18 is decreased, the breakdown voltage BV is decreased. Also, when the thickness T of the n type epitaxial layer 18 is increased, the breakdown voltage BV is increased.

Referring to FIG. 10 to FIG. 12, it was found that when it is attempted to realize a comparatively low forward voltage VF, the reverse current IR is increased. It was also found that when it is attempted to realize a comparatively low forward voltage VF, the breakdown voltage BV is decreased.

It was therefore found that a tradeoff relationship is present between the forward voltage VF and the reverse current IR. It was also found that a tradeoff relationship is present between the forward voltage VF and the breakdown voltage BV.

It was thus found that a low forward voltage VF, a low reverse current IR, and a high breakdown voltage BV can be realized by setting the thickness T of the n type epitaxial layer 18 to an appropriate value.

Next, influences of the specific resistance of the n type epitaxial layer 18 of the SBD chip 601 according to the reference example on the forward voltage VF, the forward current IF, the reverse voltage VR, the reverse current IR, the breakdown voltage BV, etc., shall now be described.

The specific resistance of the n type epitaxial layer 18 is also the specific resistance of the n type diode region 20. That the specific resistance of the n type epitaxial layer 18 is low means that the n type impurity concentration of the n type epitaxial layer 18 is high. That the specific resistance of the n type epitaxial layer 18 is high means that the n type impurity concentration of the n type epitaxial layer 18 is low.

Here, three SBD chips 601E, 601F, and 601G, which differ respectively in the specific resistance of the n type epitaxial layer 18 as shown in Table 2 below, were prepared.

TABLE 2

|  | SBD chip 601 according to reference example | | |
| --- | --- | --- | --- |
|  | E | F | G |
| Specific resistance (Ω·cm) of the n type epitaxial layer 18 | 0.2 | 0.4 | 0.7 |

The SBD chip 601E is an SBD chip 601 with which the specific resistance of the n type epitaxial layer 18 is set to 0.2 Ω·cm. The SBD chip 601F is an SBD chip 601 with which the specific resistance of the n type epitaxial layer 18 is set to 0.4 Ω·cm. The SBD chip 601G is an SBD chip 601 with which the specific resistance of the n type epitaxial layer 18 is set to 0.7 Ω·cm.

The thickness T of the n type epitaxial layer 18 of the SBD chips 601E, 601F, and 601G is approximately 3.8 μm.

Figure 13:
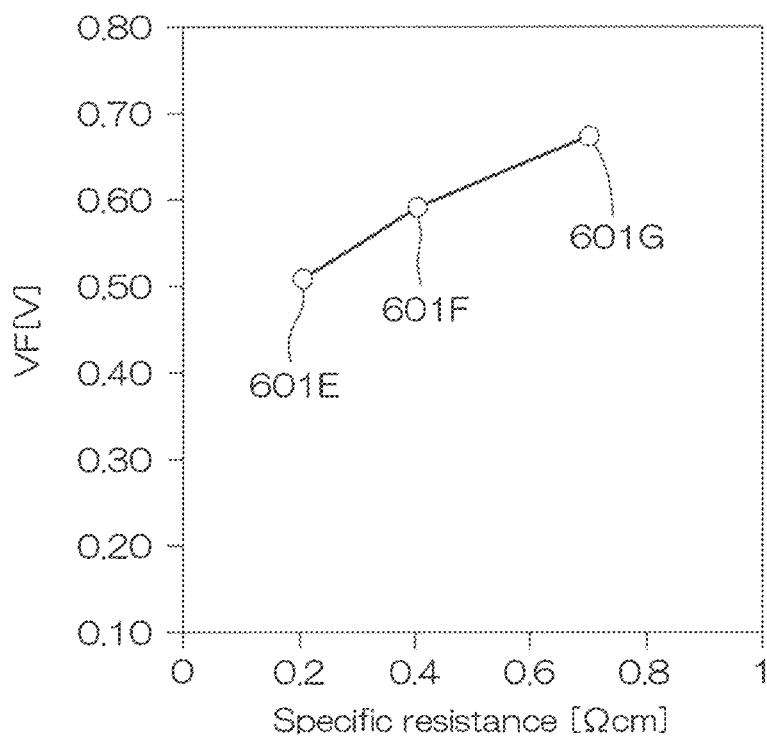
FIG. 13 is a graph for describing relationships of specific resistance of the n type epitaxial layer and the forward voltage in the SBD chips according to the reference example.
Figure 14:
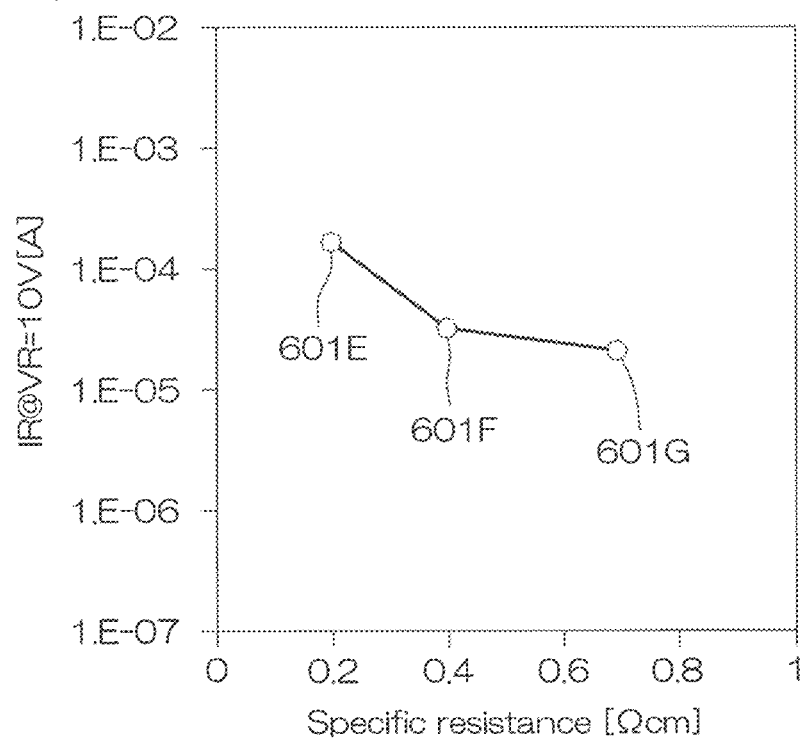
FIG. 14 is a graph for describing relationships of the specific resistance of the n type epitaxial layer and the reverse current in the SBD chips according to the reference example.
Figure 15:
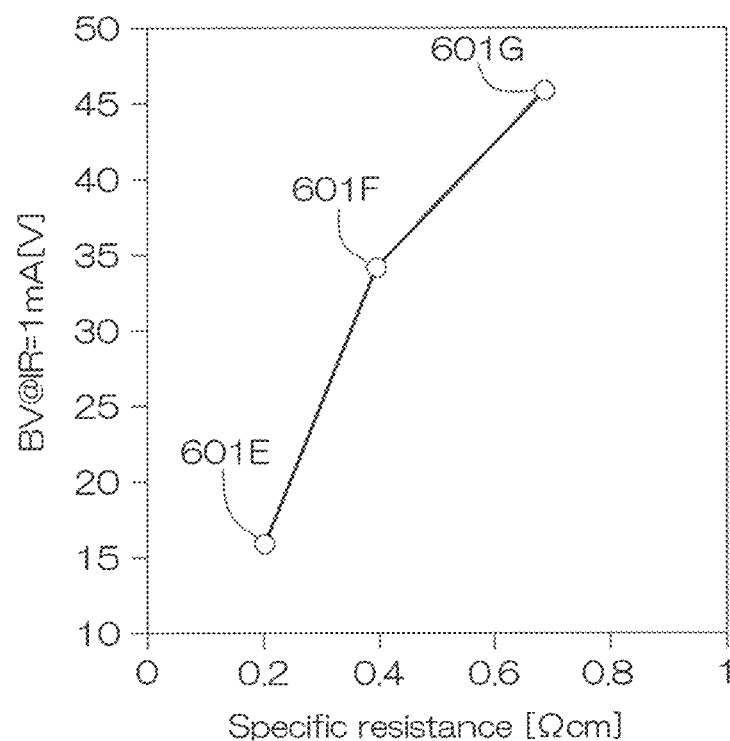
FIG. 15 is a graph for describing relationships of the specific resistance of the n type epitaxial layer and the breakdown voltage in the SBD chips according to the reference example.

Results of determining the forward voltages VF, the reverse currents IR, and the breakdown voltages BV of the SBD chips 601E, 601F, and 601G by simulation are shown in FIG. 13 to FIG. 15.

FIG. 13 is a graph for describing relationships of the specific resistance of the n type epitaxial layer 18 and the forward voltage VF in the SBD chips 601E, 601F, and 601G according to the reference example shown in Table 2.

In FIG. 13, the ordinate is the forward voltage VF and the abscissa is the specific resistance of the n type epitaxial layer 18. The forward voltage VF is the voltage between the first external terminal 6 and the second external terminal 7 when the forward current IF is 2 A.

Referring to FIG. 13, when the specific resistance of the n type epitaxial layer 18 is decreased, the forward voltage VF is decreased. Also, when the specific resistance of the n type epitaxial layer 18 is increased, the forward voltage VF is increased.

It was thus found that a low forward voltage VF can be realized by making the specific resistance of the n type epitaxial layer 18 low.

With FIG. 10, it was described that a low forward voltage VF can be obtained by reducing the resistance value of the n type epitaxial layer 18. This is also substantiated by FIG. 13, which shows the characteristic that the forward voltage VF is decreased in accordance with the decrease of the specific resistance.

FIG. 14 is a graph for describing relationships of the specific resistance of the n type epitaxial layer 18 and the reverse current IR in the SBD chips 601E, 601F, and 601G according to the reference example shown in Table 2.

In FIG. 14, the ordinate is the reverse current IR and the abscissa is the specific resistance of the n type epitaxial layer 18. The reverse current IR is the current that flows between the first external terminal 6 and the second external terminal 7 when the reverse voltage VR is 10 V.

Referring to FIG. 14, when the specific resistance of the n type epitaxial layer 18 is decreased, the reverse current IR is increased. Also, when the specific resistance of the n type epitaxial layer 18 is increased, the reverse current IR is decreased.

It was thus found that a low reverse current IR can be realized by making the specific resistance of the n type epitaxial layer 18 high.

With FIG. 11, it was described that the reverse current IR is increased by the increase of the n type impurity concentration of the n type epitaxial layer 18 due to the n type impurity diffusing from the n+ type semiconductor substrate 17. This is also substantiated by FIG. 14, which shows the characteristic that the reverse current IR is increased in accordance with the decrease of the specific resistance.

FIG. 15 is a graph for describing relationships of the specific resistance of the n type epitaxial layer 18 and the breakdown voltage BV in the SBD chips 601E, 601F, and 601G according to the reference example shown in Table 2.

In FIG. 15, the ordinate is the breakdown voltage BV and the abscissa is the specific resistance of the n type epitaxial layer 18. The breakdown voltage BV is the voltage between the first external terminal 6 and the second external terminal 7 when the reverse current IR is 1 mA.

Referring to FIG. 15, when the specific resistance of the n type epitaxial layer 18 is decreased, the breakdown voltage BV is decreased. Also, when the specific resistance of the n type epitaxial layer 18 is increased, the breakdown voltage BV is increased.

It was thus found that a high breakdown voltage BV can be realized by making the specific resistance of the n type epitaxial layer 18 high.

Referring to FIG. 13 to FIG. 15, when it is attempted to realize a comparatively low forward voltage VF, the reverse current IR is increased. Also, when it is attempted to realize a comparatively low forward voltage VF, the breakdown voltage BV is decreased.

It was therefore found that a tradeoff relationship is present between the forward voltage VF and the reverse current IR. It was also found that a tradeoff relationship is present between the forward voltage VF and the breakdown voltage BV.

It was thus found that a low forward voltage VF, a low reverse current IR, and a high breakdown voltage BV can be realized by setting the specific resistance of the n type epitaxial layer 18 to an appropriate value.

From FIG. 10 to FIG. 12, it can be understood that the smaller the thickness T of the n type epitaxial layer 18, the more preferable. However, the reverse current IR increases suddenly when the thickness T of the n type epitaxial layer 18 becomes less than 2 µm. This is due to the increase of the n type impurity concentration of the n type epitaxial layer 18 due to the n type impurity diffusing from the n⁺ type semiconductor substrate 17.

It can therefore be understood that although the lower the n type impurity concentration of the n type epitaxial layer 18 the more preferable, it is preferable for the thickness T of the n type epitaxial layer 18 to be not less than 2 µm.

And, from the standpoint of suppression of the reverse current IR in accompaniment with thinning of the n type epitaxial layer 18, it can be understood that the n type impurity concentration of the surface layer portion of the n type epitaxial layer 18 should be made low.

It can further be understood from FIG. 13 to FIG. 15 that the higher the specific resistance of the n type epitaxial layer 18, the more preferable. More specifically, it can be understood that the n type epitaxial layer 18 is preferably formed to be of an n type impurity concentration such that the specific resistance of the n type epitaxial layer 18 is not less than 0.4 Ω·cm.

The SBD chip 1 differs from the SBD chip 601 according to the reference example and includes the contact electrode layers 45A, 45B, and 45C, the contact holes 46A, 46B, and 46C, and the n⁺ type contact regions 70A, 70B, and 70C.

With the SBD chip 1, the thickness T of the n type epitaxial layer 18 is set to not less than 2.0 µm and not more than 3.0 µm. More specifically, the thickness T of the n type epitaxial layer 18 is not less than 2.0 µm and not more than 2.5 µm.

With the SBD chip 1, the specific resistance of the n type epitaxial layer 18 is set to not less than 0.4 Ω·cm. More specifically, the specific resistance of the n type epitaxial layer 18 is not less than 0.7 Ω·cm and not more than 1.0 Ω·cm.

Further, with the SBD chip 1, the surface layer region 21 is formed in the surface layer portion of the n type diode region 20 (see also FIG. 8, etc.). The surface layer region 21 includes the n type impurity and the p type impurity.

By the surface layer region 21, variation of the n type impurity concentration of the n type epitaxial layer 18 due to diffusion of the n type impurity from the n⁺ type semiconductor substrate 17 is suppressed. In particular, the surface layer region 21 suppresses increase of the n type impurity concentration of the surface layer portion of the n type epitaxial layer 18.

The electrical characteristics of the SBD chip 1 shall now be described with reference to FIG. 16 to FIG. 23. The electrical characteristics of the SBD chip 1 were determined by simulation.

Figure 16:
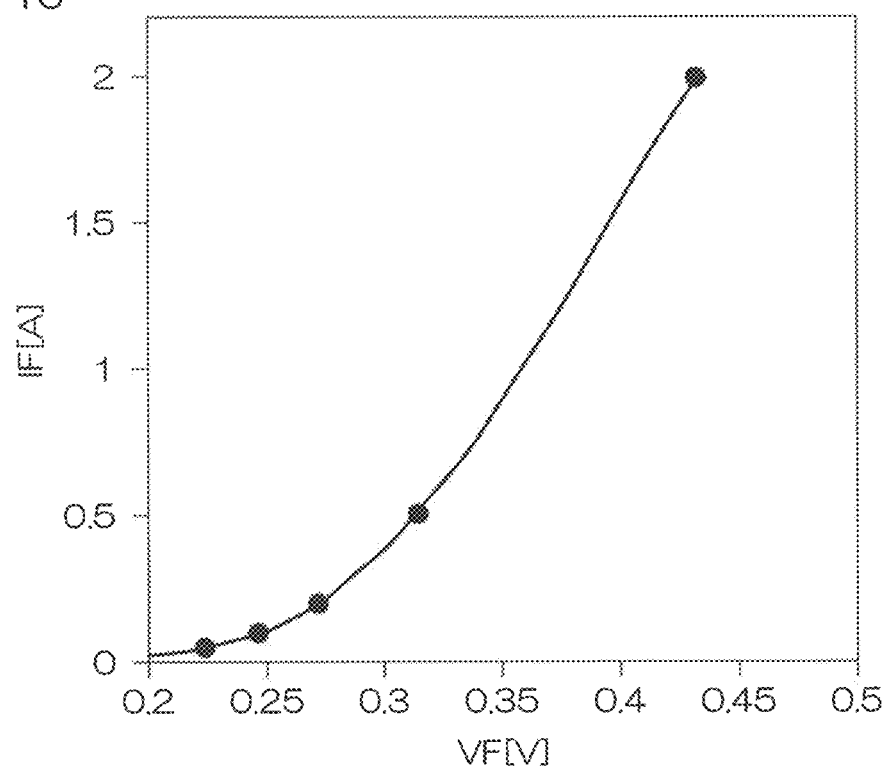
FIG. 16 is a graph of forward current vs. forward voltage characteristics of the SBD chip shown in FIG. 1.

FIG. 16 is a graph of forward current IF vs. forward voltage VF characteristics of the SBD chip 1 shown in FIG. 1. In FIG. 16, the ordinate is the forward current IF and the abscissa is the forward voltage VF.

Referring to FIG. 16, the result was obtained that when the forward current IF between the first external terminal 6 and the second external terminal 7 is 1 A, the forward voltage VF between the first external terminal 6 and the second external terminal 7 is not more than 0.36 V. The result was obtained that when the forward current IF between the first external terminal 6 and the second external terminal 7 is 2 A, the forward voltage VF between the first external terminal 6 and the second external terminal 7 is less than 0.44 V.

Figure 17:
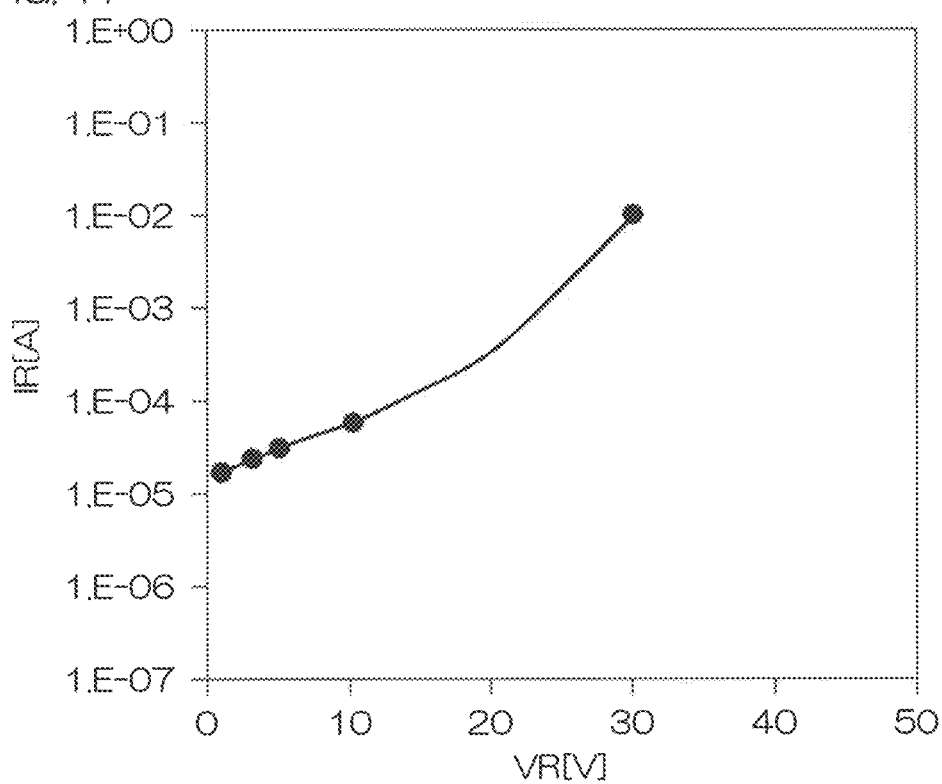
FIG. 17 is a graph of reverse current vs. reverse voltage characteristics of the SBD chip shown in FIG. 1.

FIG. 17 is a graph of reverse current IR vs. reverse voltage VR characteristics of the SBD chip 1 shown in FIG. 1. In FIG. 17, the ordinate is the reverse current IR and the abscissa is the reverse voltage VR.

Referring to FIG. 17, the result was obtained that when the reverse voltage VR between the first external terminal 6 and the second external terminal 7 is 10 V, the reverse current IR between the first external terminal 6 and the second external terminal 7 is not more than $1.0 \times 10^{-4}$ A. The result was obtained that when the reverse voltage VR between the first external terminal 6 and the second external terminal 7 is 20 V, the reverse current IR between the first external terminal 6 and the second external terminal 7 is not more than $1.0 \times 10^{-3}$ A.

Figure 18:
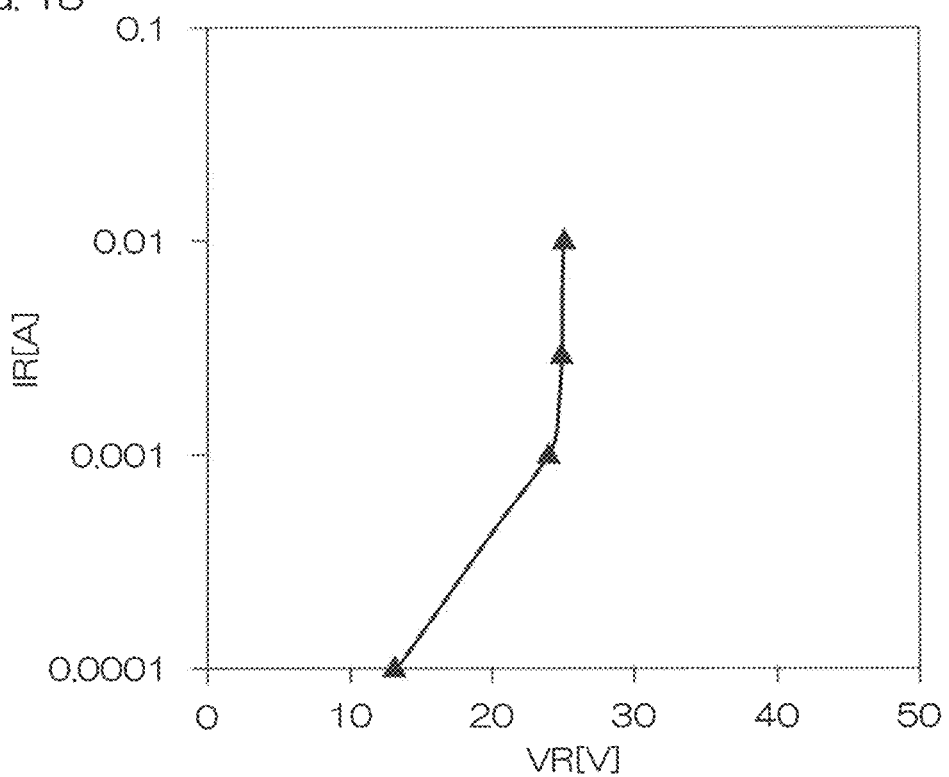
FIG. 18 is a graph of reverse current vs. reverse voltage characteristics of the SBD chip shown in FIG. 1 and is a graph for describing breakdown voltage characteristics.

FIG. 18 is a graph of reverse current IR vs. reverse voltage VR characteristics of the SBD chip 1 shown in FIG. 1 and is a graph for describing breakdown voltage BV characteristics. In FIG. 18, the ordinate is the reverse current IR and the abscissa is the reverse voltage VR.

Referring to FIG. 18, the reverse current IR increases suddenly when the reverse voltage VR between the first external terminal 6 and the second external terminal 7 becomes not less than 20 V. The breakdown voltage BV between the first external terminal 6 and the second external terminal 7 is thus not less than 20 V.

When the breakdown voltage BV between the first external terminal 6 and the second external terminal 7 is not less than 20 V, the reverse current IR between the first external terminal 6 and the second external terminal 7 is not less than $1.0 \times 10^{-3}$ A.

Figure 19:
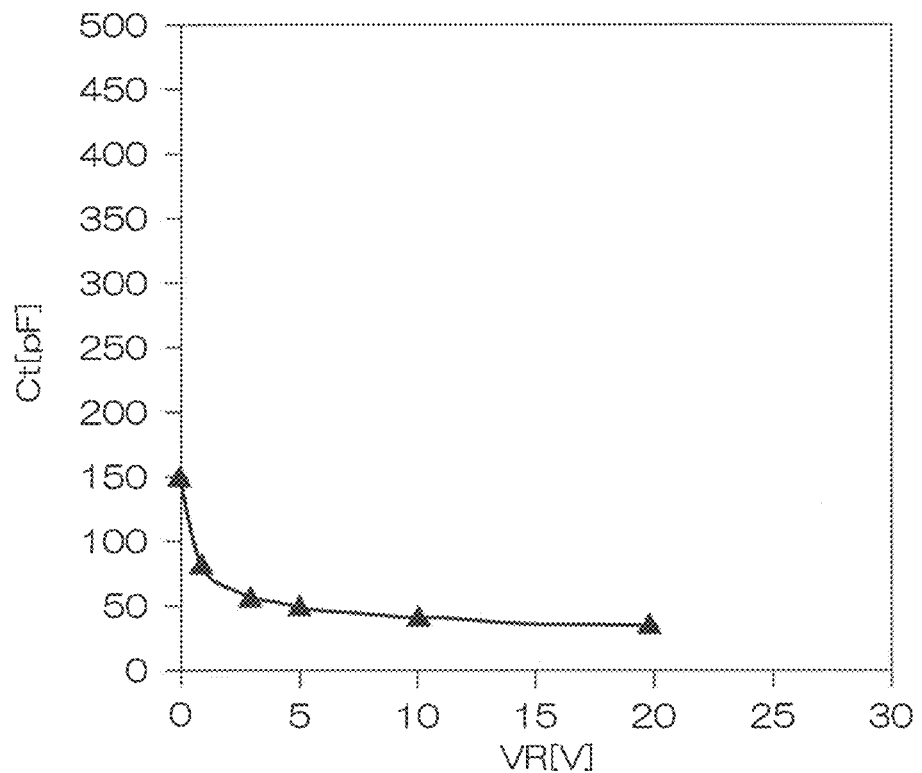
FIG. 19 is a graph of parasitic capacitance vs. forward voltage characteristics of the SBD chip shown in FIG. 1.

FIG. 19 is a graph of parasitic capacitance CT vs. forward voltage VF characteristics of the SBD chip 1 shown in FIG. 1. In FIG. 19, the ordinate is the parasitic capacitance CT and the abscissa is the reverse voltage VR. The parasitic capacitance CT is also the interterminal capacitance between the first external terminal 6 and the second external terminal 7 (the anode electrode layer 43 and the cathode electrode layer 44).

Referring to FIG. 19, the result was obtained that when the reverse voltage VR between the first external terminal 6 and the second external terminal 7 is not less than 5 V, the parasitic capacitance CT between the first external terminal 6 and the second external terminal 7 is not more than 100 pF. More specifically, the parasitic capacitance CT is not more than 50 pF.

Figure 20:
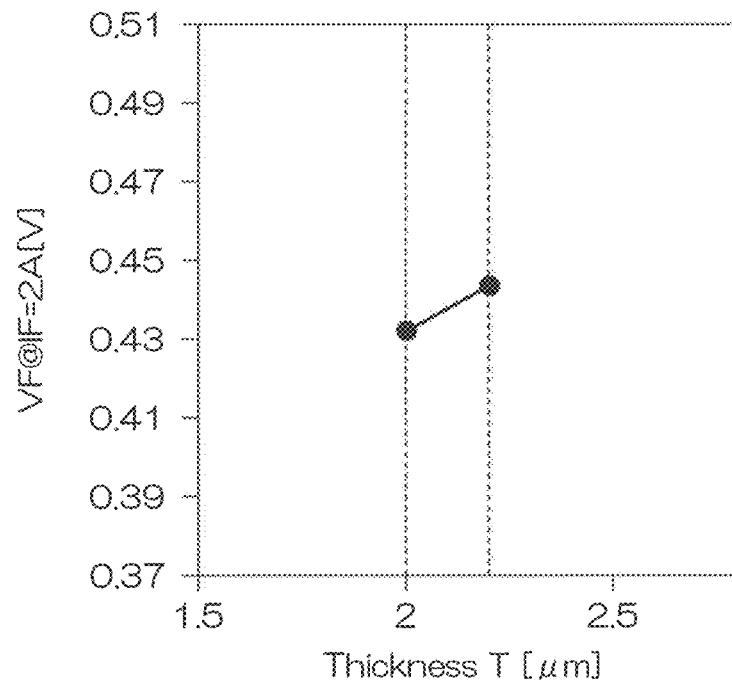
FIG. 20 is a graph of a change of forward voltage when the thickness of the epitaxial layer is adjusted in the SBD chip shown in FIG. 1.

FIG. 20 is a graph of a change of the forward voltage VF when the thickness T of the n type epitaxial layer 18 is adjusted in the SBD chip 1 shown in FIG. 1. In FIG. 20, the ordinate is the forward voltage VF and the abscissa is the thickness T of the n type epitaxial layer 18.

Here, the change of the forward voltage VF when the thickness T of the n type epitaxial layer 18 is changed between 2.0 μm and 2.2 μm is shown. The forward voltage VF is the voltage between the first external terminal 6 and the second external terminal 7 when the forward current IF is 2 A.

Referring to FIG. 20, the result was obtained that when the thickness T of the n type epitaxial layer 18 is in the range of not less than 2.0 μm and not more than 2.2 μm, the forward voltage VF is not less than 0.43 V and not more than 0.45 V when the forward current IF is 2 A.

Figure 21:
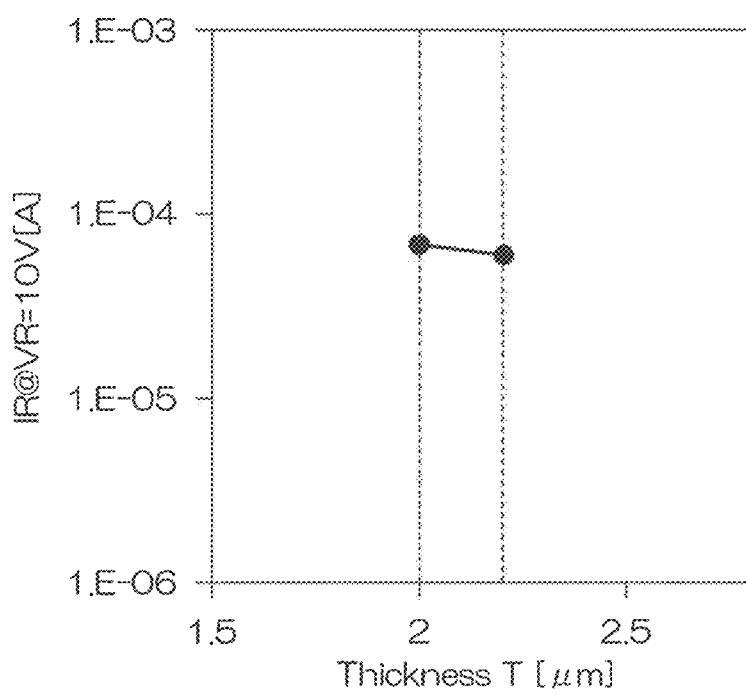
FIG. 21 is a graph of a change of reverse current when the thickness of the epitaxial layer is adjusted in the SBD chip shown in FIG. 1.

FIG. 21 is a graph of a change of the reverse current IR when the thickness T of the n type epitaxial layer 18 is adjusted in the SBD chip 1 shown in FIG. 1. In FIG. 21, the ordinate is the reverse current IR and the abscissa is the thickness T of the n type epitaxial layer 18.

Here, the change of the reverse current IR when the thickness T of the n type epitaxial layer 18 is changed between 2.0 μm and 2.2 μm is shown. The reverse current IR is the current that flows between the first external terminal 6 and the second external terminal 7 when the reverse voltage VR between the first external terminal 6 and the second external terminal 7 is 10 V.

Referring to FIG. 21, the result was obtained that when the thickness T of the n type epitaxial layer 18 is in the range of not less than 2.0 μm and not more than 2.2 μm, the reverse current IR is not more than $1.0 \times 10^{-4}$ A when the reverse voltage VR is 10 V. More specifically, the reverse current IR is not less than $5.0 \times 10^{-5}$ A and not more than $7.0 \times 10^{-5}$ A.

Figure 22:
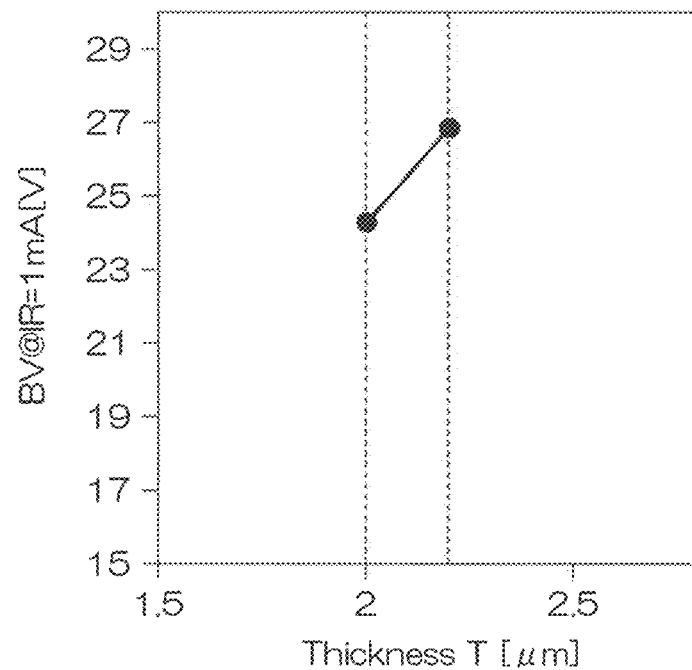
FIG. 22 is a graph of a change of breakdown voltage when the thickness of the epitaxial layer is adjusted in the SBD chip shown in FIG. 1.

FIG. 22 is a graph of a change of the breakdown voltage BV when the thickness T of the n type epitaxial layer 18 is adjusted in the SBD chip 1 shown in FIG. 1. In FIG. 22, the ordinate is the breakdown voltage BV and the abscissa is the thickness T of the n type epitaxial layer 18.

Here, the change of the breakdown voltage BV when the thickness T of the n type epitaxial layer 18 is changed between 2.0 μm and 2.2 μm is shown. The breakdown voltage BV is the voltage between the first external terminal 6 and the second external terminal 7 when the reverse current IR that flows between the first external terminal 6 and the second external terminal 7 is 1 mA.

Referring to FIG. 22, the result was obtained that when the thickness T of the n type epitaxial layer 18 is in the range of not less than 2.0 μm and not more than 2.2 μm, the breakdown voltage BV between the first external terminal 6 and the second external terminal 7 is not less than 23 V and not more than 27 V.

Figure 23:
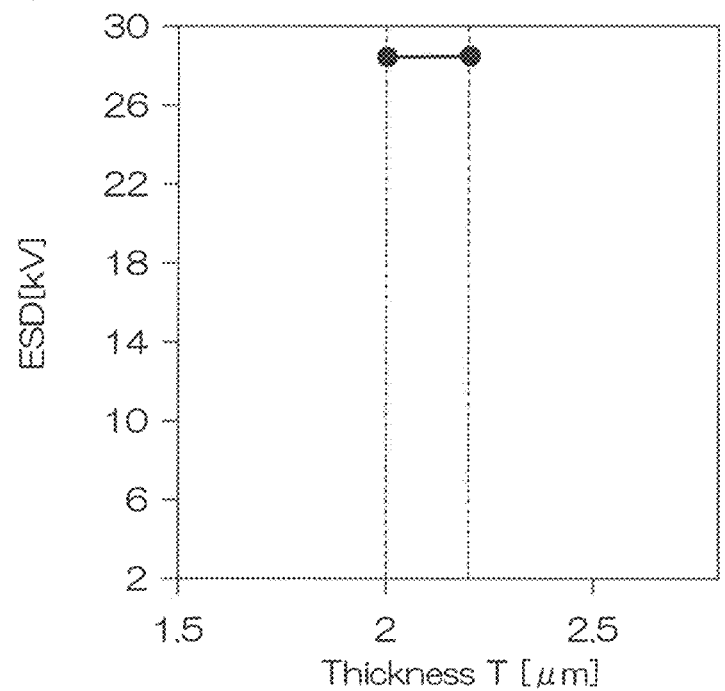
FIG. 23 is a graph of a change of electrostatic discharge resistance when the thickness of the epitaxial layer is adjusted in the SBD chip shown in FIG. 1.

FIG. 23 is a graph of a change of electrostatic discharge resistance when the thickness T of the n type epitaxial layer 18 is adjusted in the SBD chip 1 shown in FIG. 1. In FIG. 23, the ordinate is the electrostatic discharge resistance and the abscissa is the thickness T of the n type epitaxial layer 18.

Here, the change of the electrostatic discharge resistance when the thickness T of the n type epitaxial layer 18 is changed between 2.0 μm and 2.2 μm is shown.

Referring to FIG. 23, the result was obtained that when the thickness T of the n type epitaxial layer 18 is in the range of not less than 2.0 μm and not more than 2.2 μm, the breakdown voltage BV between the first external terminal 6 and the second external terminal 7 is not less than 26 kV and not more than 30 kV.

Further, with the present preferred embodiment, changes of the forward voltage VF when the shapes of the contact holes 46A, 46B, and 46C are adjusted in the SBD chip 1 were determined by simulation.

Here, three SBD chips 1, with which the shape of the first contact hole 46A is changed in a state where the first contact hole 46A and the second opening 34 (second contact hole 46B) are separated, were prepared. The three SBD chips 1 include a first evaluation element 1A, a second evaluation element 1B, and a third evaluation element 1C.

Forms of the first evaluation element 1A, the second evaluation element 1B, and the third evaluation element 1C and the forward voltages VF thereof shall be described specifically with reference to FIG. 24 to FIG. 27.

FIG. 24A is a plan view of the first evaluation element 1A for evaluating the forward voltage VF when the shapes of the contact holes 46A, 46B, and 46C are adjusted in the SBD chip 1 shown in FIG. 1. FIG. 24B is a sectional view taken along line B-B shown in FIG. 24A. In FIG. 24B, just the structure at the first major surface 14 side of the semiconductor layer 10 is shown.

With the exception of not including the third contact hole 46C, the first evaluation element 1A has substantially the same arrangement as the arrangement of the SBD chip 1 shown in FIG. 1. In FIG. 24A and FIG. 24B, arrangements that are the same as those of the SBD chip 1 shown in FIG. 1 are provided with the same reference symbols and description thereof shall be omitted.

Referring to FIG. 24A and FIG. 24B, the pair of first contact line portions 54 extend toward the second opening 34 side from both end portions of the first contact facing portion 53 so as to cross the central region of the semiconductor layer 10.

End portions of the pair of first contact line portions 54 at the cathode electrode layer 44 side are formed at positions in proximity to the cathode electrode layer 44. The end portions of the pair of first contact line portions 54 at the cathode electrode layer 44 side face end portions of the pair of second contact line portions 56 of the second contact hole 46B at the anode electrode layer 43 side across the front surface insulating layer 11.

FIG. 25A is a plan view of the second evaluation element 1B for evaluating the forward voltage VF when the shapes of the contact holes 46A, 46B, and 46C are adjusted in the SBD chip 1 shown in FIG. 1. FIG. 25B is a sectional view taken along line B-B shown in FIG. 25A. In FIG. 25B, just the structure at the first major surface 14 side of the semiconductor layer 10 is shown.

With the exception of not including the third contact hole 46C, the second evaluation element 1B has substantially the same arrangement as the arrangement of the SBD chip 1 shown in FIG. 1. In FIG. 25A and FIG. 25B, arrangements that are the same as those of the SBD chip 1 shown in FIG. 1 are provided with the same reference symbols and description thereof shall be omitted.

Referring to FIG. 25A and FIG. 25B, the pair of first contact line portions 54 extend toward the second opening 34 side from both end portions of the first contact facing portion 53 in a region between the central region of the semiconductor layer 10 and both end portions of the first contact facing portion 53.

End portions of the pair of first contact line portions 54 at the cathode electrode layer 44 side face end portions of the pair of second contact line portions 56 of the second contact hole 46B at the anode electrode layer 43 side across the front surface insulating layer 11.

FIG. 26A is a plan view of the third evaluation element 1C for evaluating the forward voltage VF when the shapes of the contact holes 46A, 46B, and 46C are adjusted in the SBD chip 1 shown in FIG. 1. FIG. 26B is a sectional view taken along line B-B shown in FIG. 26A. In FIG. 26B, just the structure at the first major surface 14 side of the semiconductor layer 10 is shown.

With the exception that the first contact hole 46A does not include the pair of first contact line portions 54 and the exception of not including the third contact hole 46C, the third evaluation element 1C has substantially the same arrangement as the arrangement of the SBD chip 1 shown in FIG. 1. In FIG. 26A and FIG. 26B, arrangements that are the same as those of the SBD chip 1 shown in FIG. 1 are provided with the same reference symbols and description thereof shall be omitted.

Figure 27:
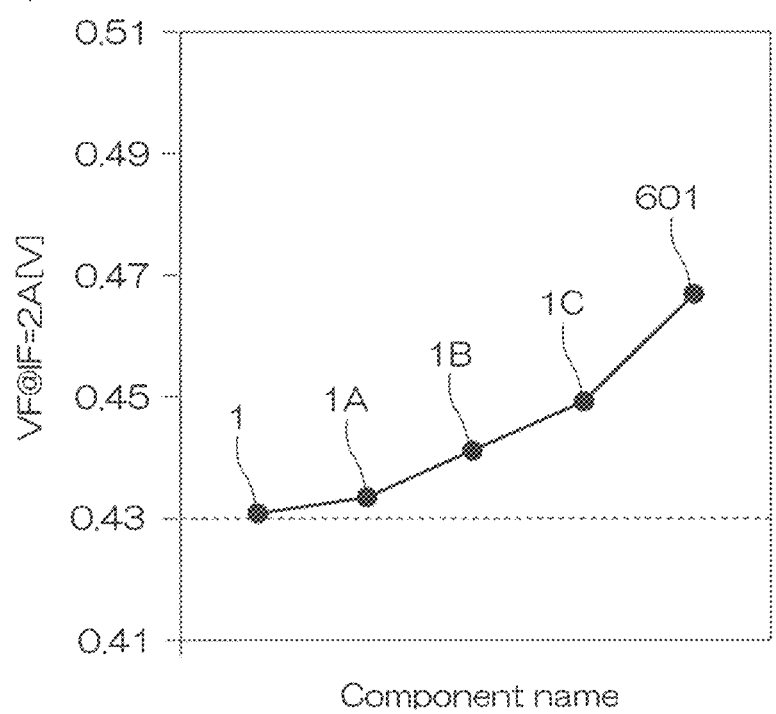
FIG. 27 is a graph of the forward voltages of the first evaluation element to the third evaluation element.

FIG. 27 is a graph of the forward voltages VF of the first evaluation element 1A, the second evaluation element 1B, and the third evaluation element 1C.

In FIG. 27, the ordinate is the forward voltage VF and the abscissa is the component name. The forward voltage VF is the voltage between the first external terminal 6 and the second external terminal 7 when the forward current IF is 2 A.

In FIG. 27, the forward voltage VF of the SBD chip 1 shown in FIG. 1 and the forward voltage VF of the SBD chip 601 according to the reference example are shown in addition to the forward voltages VF of the first evaluation element 1A, the second evaluation element 1B, and the third evaluation element 1C.

The thickness T of the n type epitaxial layer 18 of the SBD chip 601 according to the reference example is set to not less than 2.0 μm and not more than 2.5 μm. The specific resistance of the n type epitaxial layer 18 of the SBD chip 601 according to the reference example is set to approximately 0.7 Ω·cm.

Referring to FIG. 27, it was found that forward voltages VF that are lower than the forward voltage VF of the SBD chip 601 according to the reference example can be achieved with the SBD chip 1, the first evaluation element 1A, the second evaluation element 1B, and the third evaluation element 1C.

More specifically, with the SBD chip 601 according to the reference example, the forward voltage VF when the forward current IF is 2 A is greater than 0.47 V (VF>0.47 V).

On the other hand, with each of the SBD chip 1, the first evaluation element 1A, the second evaluation element 1B, and the third evaluation element 1C, the forward voltage VF when the forward current IF is 2 A is not more than 0.47 V (VF≤0.47 V). More specifically, the forward voltage VF in this state is not more than 0.45 V (VF≤0.45 V).

In particular, with the SBD chip 1, the first evaluation element 1A, and the second evaluation element 1B, the forward voltage VF when the forward current IF is 2 A is not more than 0.44 V (VF≤0.44 V).

Further, with each of the SBD chip 1 and the first evaluation element 1A, the forward voltage VF when the forward current IF is 2 A is less than 0.44 V (VF≤0.44 V).

It was thus found that, in the SBD chip 1, even if the shape of the first contact hole is changed in the state where the first contact hole 46A and the second opening 34 (second contact hole 46B) are separated, a forward voltage VF better than the forward voltage VF of the SBD chip 601 according to the reference example can be achieved.

Also, with the present preferred embodiment, three SBD chips 1, with which the shape of the first contact hole 46A is changed in a state where the first contact hole 46A and the second opening 34 (second contact hole 46B) are in communication, were prepared. The three SBD chips 1 include a fourth evaluation element 1D, a fifth evaluation element 1E, and a sixth evaluation element 1F.

Forms of the fourth evaluation element 1D, the fifth evaluation element 1E, and the sixth evaluation element 1F and the forward voltages VF thereof shall be described with reference to FIG. 28 to FIG. 31.

FIG. 28A is a plan view of the fourth evaluation element 1D for evaluating the forward voltage VF when the shapes of the contact holes 46A, 46B, and 46C are adjusted in the SBD chip 1 shown in FIG. 1. FIG. 28B is a sectional view taken along line B-B shown in FIG. 28A. In FIG. 28B, just the structure at the first major surface 14 side of the semiconductor layer 10 is shown.

With the exception that the first contact hole 46A does not include the first contact facing portions 53, the fourth evaluation element 1D has substantially the same arrangement as the arrangement of the SBD chip 1 shown in FIG. 1. In FIG. 28A and FIG. 28B, arrangements that are the same as those of the SBD chip 1 shown in FIG. 1 are provided with the same reference symbols and description thereof shall be omitted.

FIG. 29A is a plan view of the fifth evaluation element 1E for evaluating the forward voltage VF when the shapes of the contact holes 46A, 46B, and 46C are adjusted in the SBD chip 1 shown in FIG. 1. FIG. 29B is a sectional view taken along line B-B shown in FIG. 29A. In FIG. 29B, just the structure at the first major surface 14 side of the semiconductor layer 10 is shown.

With the exception that the first contact hole 46A does not include the first contact facing portions 53 and the exception that end portions of the pair of first contact line portions 54 at the side opposite the end portions at the cathode electrode layer 44 side face a central region of the first opening 33 in the short direction of the semiconductor layer 10, the fifth evaluation element 1E has substantially the same arrangement as the arrangement of the SBD chip 1 shown in FIG. 1. In FIG. 29A and FIG. 29B, arrangements that are the same as those of the SBD chip 1 shown in FIG. 1 are provided with the same reference symbols and description thereof shall be omitted.

FIG. 30A is a plan view of the sixth evaluation element 1F for evaluating the forward voltage VF when the shapes of the contact holes 46A, 46B, and 46C are adjusted in the SBD chip 1 shown in FIG. 1. FIG. 30*b*) is a sectional view taken along line B-B shown in FIG. 30A. In FIG. 30B, just the structure at the first major surface 14 side of the semiconductor layer 10 is shown.

With the exception of not including the first contact hole 46A, the sixth evaluation element 1F has substantially the same arrangement as the arrangement of the SBD chip 1 shown in FIG. 1. In FIG. 30A and FIG. 30B, arrangements that are the same as those of the SBD chip 1 shown in FIG. 1 are provided with the same reference symbols and description thereof shall be omitted.

FIG. 31 is a graph of the forward voltages VF of the fourth evaluation element 1D, the fifth evaluation element 1E, and the sixth evaluation element 1F.

In FIG. 31, the ordinate is the forward voltage VF and the abscissa is the component name. The forward voltage VF is the voltage between the first external terminal 6 and the second external terminal 7 when the forward current IF is 2 A.

In FIG. 31, the forward voltage VF of the SBD chip 1 shown in FIG. 1 and the forward voltage VF of the SBD chip 601 according to the reference example are shown in addition to the forward voltages VF of the fourth evaluation element 1D, the fifth evaluation element 1E, and the sixth evaluation element 1F.

The thickness T of the n type epitaxial layer 18 of the SBD chip 601 according to the reference example is set to not less than 2.0 µm and not more than 2.5 µm. The specific resistance of the SBD chip 601 according to the reference example is set to approximately 0.7 Ω·cm.

Referring to FIG. 31, it was found that forward voltages VF that are lower than the forward voltage VF of the SBD chip 601 according to the reference example can be achieved with the fourth evaluation element 1D, the fifth evaluation element 1E, and the sixth evaluation element IF as well.

More specifically, with each of the SBD chip 1, the fourth evaluation element 1D, the fifth evaluation element 1E, and the sixth evaluation element 1F, the forward voltage VF when the forward current IF is 2 A is not more than 0.47 V (VF≤0.47 V). Even more specifically, the forward voltage VF in this state is not more than 0.46 V (VF≤0.46 V).

In particular, with each of the SBD chip 1, the fourth evaluation element 1D, and the fifth evaluation element 1E, in each of which the first contact hole 46A includes the pair of first contact line portions 54, the forward voltage VF when the forward current IF is 2 A is less than 0.44 V (VF≤0.44 V).

It was thus found that even if the shapes of the contact holes 46A, 46B, and 46C are changed in the state where the first contact hole 46A and the second opening 34 (second contact hole 46B) are in communication, a forward voltage VF better than the forward voltage VF of the SBD chip 601 according to the reference example can be achieved.

In particular, it was found that with a structure in which the first contact hole 46A includes the pair of first contact line portions 54, a forward voltage VF less than 0.44 V can be achieved even if the entire first peripheral region 51 is not surrounded.

The respective characteristics of the reverse current IR, the breakdown voltage BV, the parasitic capacitance CT, and the electrostatic discharge resistance of the first evaluation element 1A, the second evaluation element 1B, the third evaluation element 1C, the fourth evaluation element 1D, the fifth evaluation element 1E, and the sixth evaluation element 1F are substantially the same as those of the SBD chip 1 shown in FIG. 1 and description thereof shall thus be omitted.

The electrical characteristics of the SBD chip 601 according to the reference example and the SBD chip 1 are summarized in Table 3 below.

TABLE 3

|  | SBD chip 601 | SBD chip 1 |
|---|---|---|
| Thickness T (µm) of n type epitaxial layer 18 | not less than 2.0 and not more than 2.5 | not less than 2.0 and not more than 2.5 |
| Specific resistance (Ω · cm) of n type epitaxial layer 18 | not less than 0.4 and not more than 0.7 | not less than 0.4 and not more than 0.7 |
| Forward voltage VF (V) @ IF = 2.0 A | exceeds 0.47 | not more than 0.47 |
| Reverse current IR (A) @ VR = 10 V | not less than $10^{-4}$ and not more than $10^{-5}$ | not less than $10^{-4}$ and not more than $10^{-5}$ |
| Breakdown voltage BV (V) @ IR = 1 mA | not less than 20 | not less than 20 |

Referring to Table 3 above, with the SBD chip 1, a forward voltage VF of not more than 0.47 V (VF≤0.47 V) can be realized at the same time as maintaining the reverse current IR at not less than $10^{-4}$ A and not more than $10^{-5}$ A and maintaining the breakdown voltage BV at not less than 20 V. The forward voltage VF (VF≤0.47 V) of the SBD chip 1 is lower than the forward voltage VF (VF>0.47 V) of the SBD chip 601 according to the reference example.

As described above, with the SBD chip 1, the first contact electrode layer 45A, having a specific resistance lower than the specific resistance of the semiconductor layer 10, is formed on the first peripheral region 51 that surrounds the anode electrode layer 43 on the first major surface 14 of the semiconductor layer 10.

A current flowing into the n type diode region 20 from the anode electrode layer 43 is guided from the n type diode region 20 to the first contact electrode layer 45A of comparative low specific resistance via the semiconductor layer 10 and flows to the cathode electrode layer 44. Reduction of resistance value in the current path between the first external terminal 6 and the second external terminal 7 (between the anode electrode layer 43 and the cathode electrode layer 44) can thereby be achieved.

In particular, the SBD chip 1 includes, in addition to the first contact electrode layer 45A, the second contact electrode layer 45B, formed on the second peripheral region 52 surrounding the cathode electrode layer 44, and the third contact electrode layer 45C, formed between the anode electrode layer 43 and the cathode electrode layer 44.

The resistance value in the current path between the first external terminal 6 and the second external terminal 7 (between the anode electrode layer 43 and the cathode electrode layer 44) can thus be reduced further by just an amount corresponding to the second contact electrode layer 45B and the third contact electrode layer 45C.

The SBD chip 1 further includes the first contact region 70A formed in the region in the surface layer portion of the first major surface 14 of the semiconductor layer 10 that faces the first contact electrode layer 45A and electrically connected to the first contact electrode layer 45A.

The SBD chip 1 further includes the second contact region 70B formed in the region in the surface layer portion of the first major surface 14 of the semiconductor layer 10 that faces the second contact electrode layer 45B and electrically connected to the second contact electrode layer 45B.

The SBD chip 1 further includes the third contact region 70C formed in the region in the surface layer portion of the first major surface 14 of the semiconductor layer 10 that faces the third contact electrode layer 45C and electrically connected to the third contact electrode layer 45C.

The first contact region 70A, the second contact region 70B, and the third contact region 70C are further electrically connected to the n type diode region 20 and the $n^+$ type impurity region 25.

Thereby, a portion of the current that flowed from the anode electrode layer 43 into the n type diode region 20 flows from the n type diode region 20 into the $n^+$ type impurity region 25.

The portion of the current that flowed into the n type diode region 20 from the anode electrode layer 43 flows, via the first contact region 70A, the second contact region 70B, and the third contact region 70C, which have lower resistance values than the n type diode region 20, into the first contact electrode layer 45A, the second contact electrode layer 45B, and the third contact electrode layer 45C.

The resistance value of the semiconductor layer 10 (n type epitaxial layer 18) can thereby be reduced more than in the case where the first contact region 70A, the second contact region 70B, and the third contact region 70C are not formed.

The resistance value of the current path between the first external terminal 6 and the second external terminal 7 (between the anode electrode layer 43 and the cathode electrode layer 44) can thus be reduced further.

Thus, with the SBD chip 1, the reduction of the resistance value in the current path between the first external terminal 6 and the second external terminal 7 (between the anode electrode layer 43 and the cathode electrode layer 44) can be achieved and therefore reduction of the forward voltage VF can be achieved.

One problem in reducing the forward voltage VF is how to secure a connection area of the anode electrode layer 43 with respect to the n type diode region 20 (hereinafter referred to simply as the "diode area") in the restricted region of the semiconductor layer 10. For example, if the anode electrode layer 43 is small, the diode area will also be small and therefore the forward voltage VF will be high.

Thus, with the SBD chip 1, the first contact region 70A is formed in the region of the first peripheral region 51 between the peripheral edge of the anode electrode layer 43 and the peripheral edge of the semiconductor layer 10.

The first contact region 70A can thereby be formed without sacrificing the anode electrode layer 43. Consequently, a diode area that is comparatively large in proportion with respect to the area of the semiconductor layer 10 can be secured. The reduction of the forward voltage VF can thus be achieved from such a standpoint as well.

Moreover, it suffices to form the first contact electrode layer 45A in the first peripheral region 51, which, on the first major surface 14 of the semiconductor layer 10, surrounds the anode electrode layer 43, and therefore it is not necessarily required to increase the area of the semiconductor layer 10 to achieve the reduction of the forward voltage VF between the first external terminal 6 and the second external terminal 7 (between the anode electrode layer 43 and the cathode electrode layer 44). The SBD chip 1 can thus be provided with which miniaturization and the reduction of the forward voltage VF can be achieved.

With the SBD chip 1, the n type diode region 20, formed in the surface layer portion of the first major surface 14 of the semiconductor layer 10, has a concentration profile with which the n type impurity concentration at the first major surface 14 side of the semiconductor layer 10 is lower than the n type impurity concentration at the second major surface 15 side of the semiconductor layer 10.

More specifically, the n type diode region 20 includes the surface layer region 21, formed in the surface layer portion of the n type diode region 20, and the lower layer region 22, formed at the side of the second major surface 15 of the semiconductor layer 10 with respect to the surface layer region 21.

The surface layer region 21 is an n type low concentration region, which includes the n type impurity and the p type impurity and with which the n type impurity concentration of the n type impurity is higher than the p type impurity concentration of the p type impurity. The surface layer region 21 has an n type impurity concentration that is lower than the n type impurity concentration of the lower layer region 22.

When the thickness of the n type diode region 20 (the thickness T of the n type epitaxial layer 18) is decreased, the n type impurity concentration of the n type diode region 20, particularly that of the surface layer portion of the n type diode region 20 increases readily due to the n type impurity diffusing from the $n^+$ type semiconductor substrate 17.

Consequently, there is a tendency for a leak current component to increase between the front surface electrode layer 12 and the n type diode region 20 and the reverse current IR between the first external terminal 6 and the second external terminal 7 (between the anode electrode layer 43 and the cathode electrode layer 44) to increase.

Thus, with the SBD chip 1, while forming the lower layer region 22 of comparatively high n type impurity concentration on one hand, the surface layer region 21, which is lower in n type impurity concentration than the lower layer region 22, is formed in the surface layer portion.

Therefore, reduction of the resistance value can be achieved in the lower layer region 22 in the n type diode region 20 and increase of the resistance value can be achieved in the surface layer region 21 in the n type diode region 20.

Thereby, the forward voltage VF can be improved by the lower layer region 22 in the n type diode region 20 and increase of the reverse current IR can be suppressed by the surface layer region 21 in the n type diode region 20. The SBD chip 1 can thus be provided with which the reduction of the forward voltage VF and suppression of increase of the reverse current IR can be achieved.

In particular, with the SBD chip 1, the n type epitaxial layer 18 has a comparatively small thickness T of not less than 2 μm and not more than 2.5 μm. It may therefore be considered that there is a possibility for the n type impurity concentration in the surface layer portion of the n type diode region 20 to increase due to the n type impurity diffusing from the $n^+$ type semiconductor substrate 17.

However, the surface layer region 21, which includes the p type impurity, is formed in the surface layer portion of the n type diode region 20 and therefore the n type impurity that enters into the surface layer region 21 is offset by the p type impurity inside the surface layer region 21.

Increase of the n type impurity concentration in the surface layer portion of the n type diode region 20 can thereby be suppressed and increase of the reverse current IR between the first external terminal 6 and the second external terminal 7 can be suppressed.

Also, with the present preferred embodiment, the SBD chip 1, with which a length of the long side surfaces 16A extending along the long direction of the semiconductor layer 10 is not more than 1.6 mm and a length of the short side surfaces 16B extending along the short direction of the semiconductor layer 10 is not more than 0.8 mm, can be provided.

The SBD chip 1, with which the length of the long side surfaces 16A extending along the long direction of the semiconductor layer 10 is not more than 1.0 mm and the length of the short side surfaces 16B extending along the short direction of the semiconductor layer 10 is not more than 0.6 mm, can also be provided.

Also, the SBD chip 1, with which the forward voltage VF between the first external terminal 6 and the second external terminal 7 (between the anode electrode layer 43 and the cathode electrode layer 44) is not more than 0.47 V when the forward current IF between the first external terminal 6 and the second external terminal 7 (between the anode electrode layer 43 and the cathode electrode layer 44) is 2 A, can be provided.

Also, the SBD chip 1, with which the forward voltage VF between the first external terminal 6 and the second external terminal 7 (between the anode electrode layer 43 and the cathode electrode layer 44) is not more than 0.45 V when the forward current IF between the first external terminal 6 and the second external terminal 7 (between the anode electrode layer 43 and the cathode electrode layer 44) is 2 A, can be provided.

Also, the SBD chip 1, with which the forward voltage VF between the first external terminal 6 and the second external terminal 7 (between the anode electrode layer 43 and the cathode electrode layer 44) is not more than 0.44 V when the forward current IF between the first external terminal 6 and the second external terminal 7 (between the anode electrode layer 43 and the cathode electrode layer 44) is 2 A, can be provided.

Also, the SBD chip 1, with which the forward voltage VF between the first external terminal 6 and the second external terminal 7 (between the anode electrode layer 43 and the cathode electrode layer 44) is less than 0.44 V when the forward current IF between the first external terminal 6 and the second external terminal 7 (between the anode electrode layer 43 and the cathode electrode layer 44) is 2 A, can be provided.

Also, the SBD chip 1, with which the reverse current IR between the first external terminal 6 and the second external terminal 7 (between the anode electrode layer 43 and the cathode electrode layer 44) is not more than $1.0 \times 10^{-3}$ A when the reverse voltage VR between the first external terminal 6 and the second external terminal 7 (between the anode electrode layer 43 and the cathode electrode layer 44) is 20 V, can be provided.

Also, the SBD chip 1, with which the reverse current IR between the first external terminal 6 and the second external terminal 7 (between the anode electrode layer 43 and the cathode electrode layer 44) is not more than $1.0 \times 10^{-4}$ A when the reverse voltage VR between the first external terminal 6 and the second external terminal 7 (between the anode electrode layer 43 and the cathode electrode layer 44) is 10 V, can be provided.

Also, the SBD chip 1, with which the parasitic capacitance CT between the first external terminal 6 and the second external terminal 7 (between the anode electrode layer 43 and the cathode electrode layer 44) is not more than 100 pF when the reverse voltage VR between the first external terminal 6 and the second external terminal 7 (between the anode electrode layer 43 and the cathode electrode layer 44) is not less than 5 V, can be provided.

Also, the SBD chip 1, with which the parasitic capacitance CT between the first external terminal 6 and the second external terminal 7 (between the anode electrode layer 43 and the cathode electrode layer 44) is not more than 50 pF when the reverse voltage VR between the first external terminal 6 and the second external terminal 7 (between the anode electrode layer 43 and the cathode electrode layer 44) is not less than 5 V, can be provided.

Also, the SBD chip 1, with which the breakdown voltage BV between the first external terminal 6 and the second external terminal 7 (between the anode electrode layer 43 and the cathode electrode layer 44) is not less than 20 V, can be provided.

Figure 32:
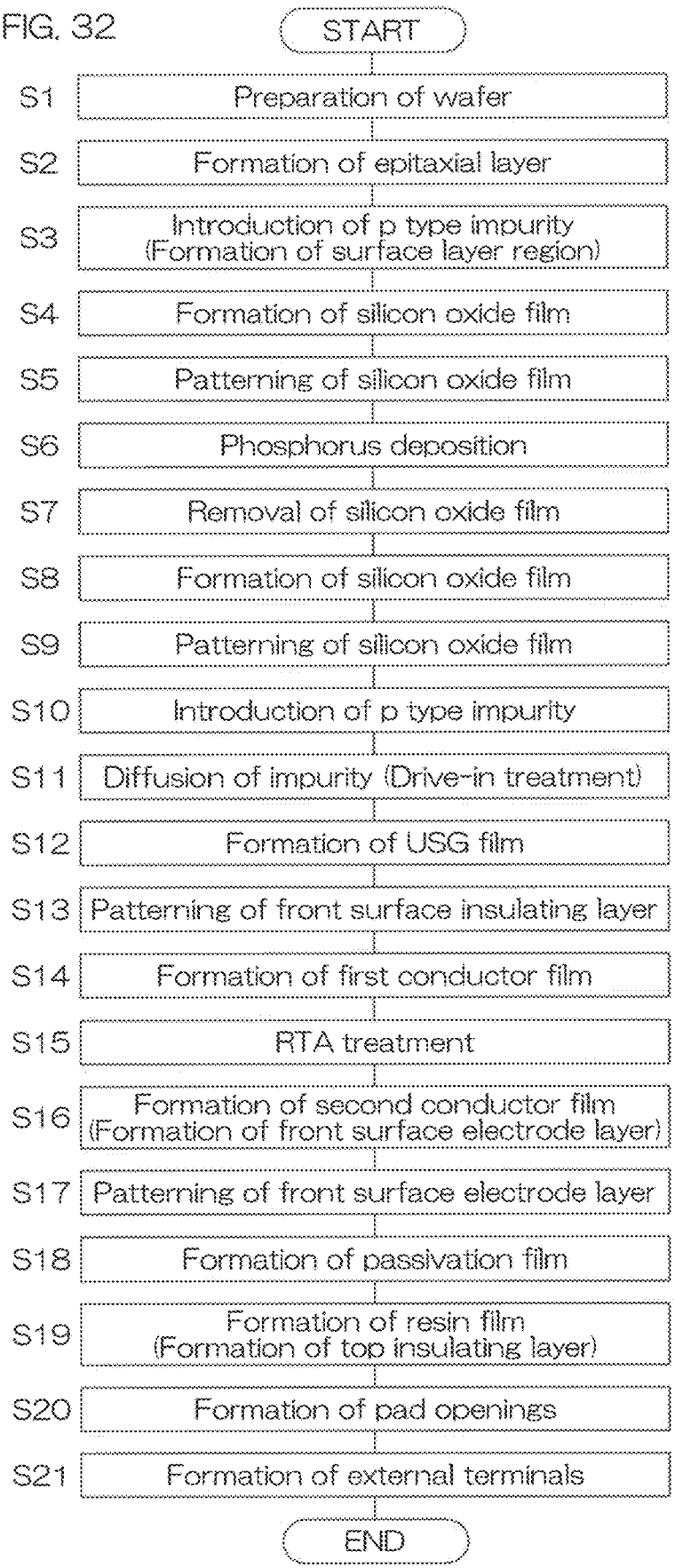
FIG. 32 is a process flowchart of an example of a method for manufacturing the SBD chip shown in FIG. 1.
Figure 33A:
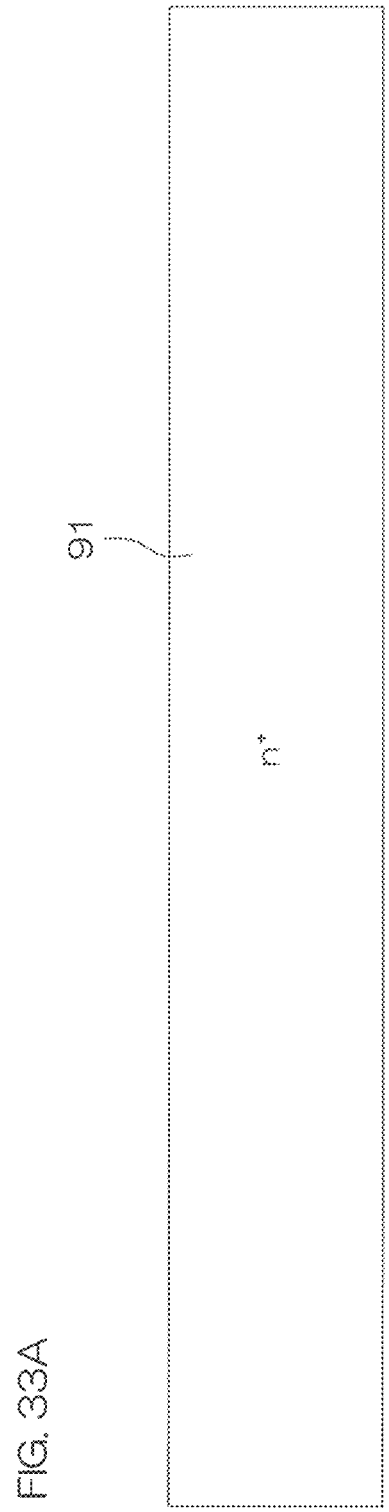
FIG. 33A to FIG. 33N are sectional views for describing the method for manufacturing the SBD chip shown in FIG. 1.
Figure 33:
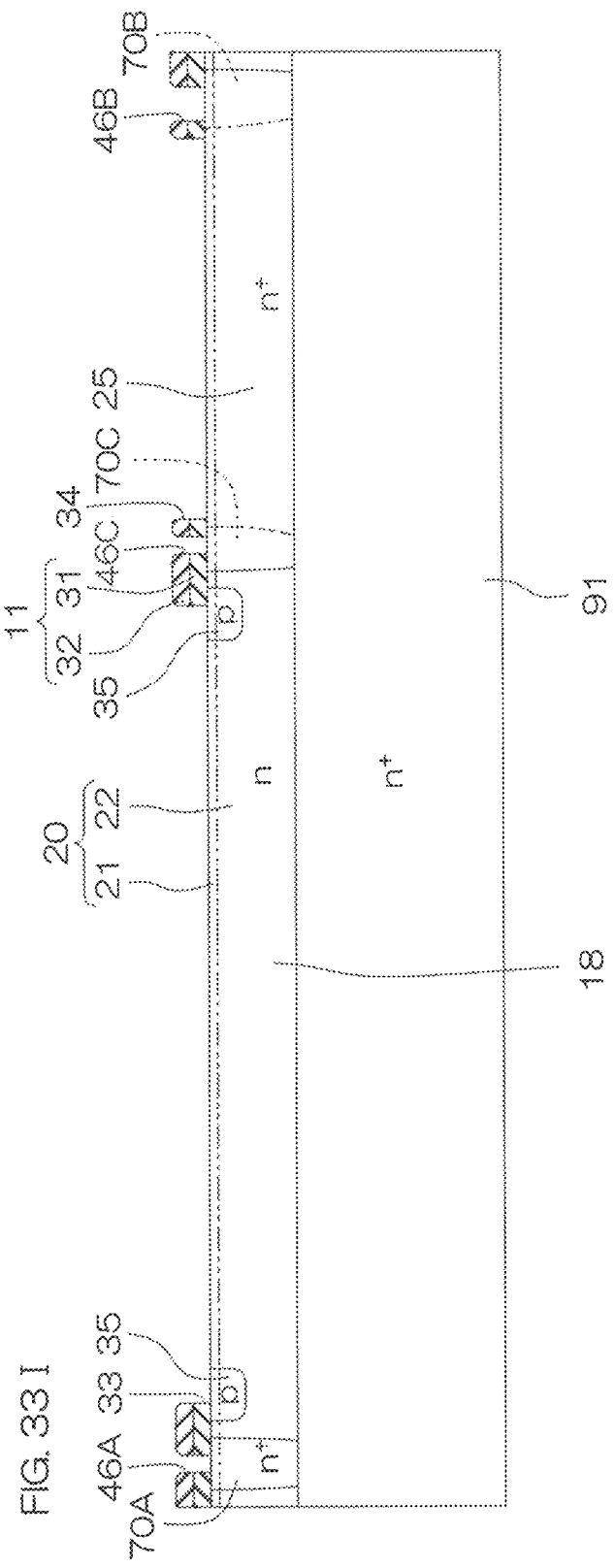
Figure 33N:
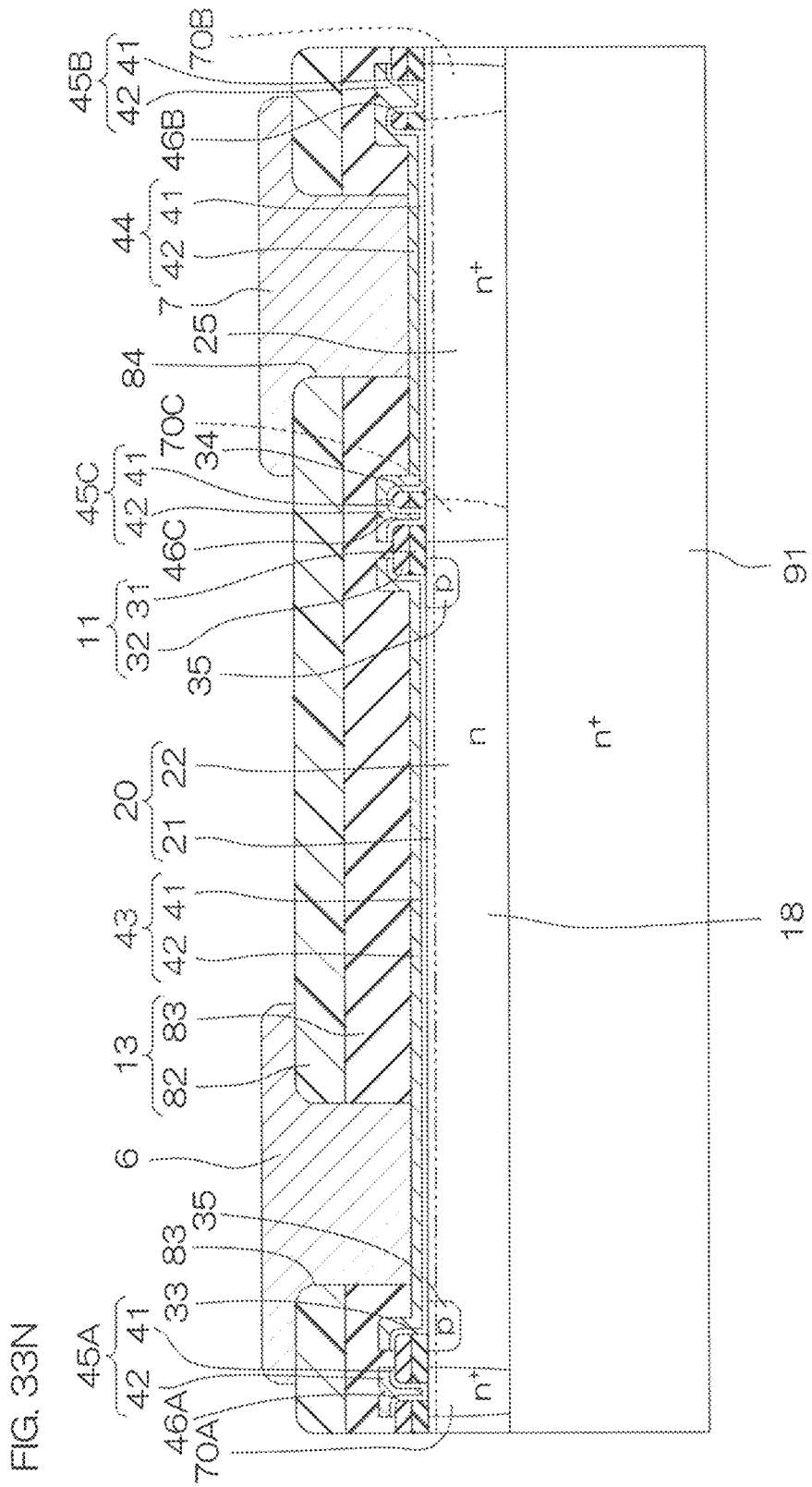

FIG. 32 is a process flowchart of an example of a method for manufacturing the SBD chip 1 shown in FIG. 1. FIG. 33A to FIG. 33N are sectional views for describing the example of the method for manufacturing the SBD chip 1 shown in FIG. 1.

First, as shown in FIG. 33A, a single $n^+$ type silicon wafer 91 is prepared (step S1 of FIG. 32). The $n^+$ type silicon wafer 91 becomes the base of the $n^+$ type semiconductor substrate 17. A specific resistance of the $n^+$ type silicon wafer 91 may be not less than 1.0 mΩ·cm and not more than 5.0 mΩ·cm (e.g. approximately 3.0 mΩ·cm).

The manufacture of the SBD chip 1 proceeds in the state of the $n^+$ type silicon wafer 91. Although a plurality of SBD chips 1 are cut out from the $n^+$ type silicon wafer 91, just a region in which a single SBD chip 1 is formed is shown in FIG. 33A (the same applies in FIG. 33B to FIG. 33N below).

Next, referring to FIG. 33B, silicon is grown epitaxially from a major surface of the $n^+$ type silicon wafer 91 (step S2 of FIG. 32). The epitaxial growth of silicon is performed in parallel to introduction of the n type impurity (e.g. phosphorus or arsenic, etc.).

The n type epitaxial layer 18 is thereby formed on the major surface of the $n^+$ type silicon wafer 91. The n type epitaxial layer 18 is formed to be of an n type impurity concentration that is lower than the n type impurity concentration of the $n^+$ type silicon wafer 91.

The n type epitaxial layer 18 may be formed so that its specific resistance is not less than 0.7 Ω·cm and not more than 1.0 Ω·cm (e.g. approximately 0.7 Ω·cm).

The thickness T of the n type epitaxial layer 18 may be not less than 2.0 μm and not more than 3.0 μm. The thickness T of the n type epitaxial layer 18 may be not less than 2.0 μm and not more than 3.5 μm. The thickness T of the n type epitaxial layer 18 may be not less than 2.0 μm and not more than 3.2 μm.

After the n type epitaxial layer 18 is formed, the p type impurity is introduced into the surface layer portion of the n type epitaxial layer 18 (step S3 of FIG. 32).

In FIG. 33B, the region in the surface layer portion of the n type epitaxial layer 18 into which the p type impurity is introduced is indicated by an alternate long and short dashed line (the same applies in FIG. 33C to FIG. 33N). The introduction of the p type impurity may be performed by an ion implantation method. The p type impurity concentration of the p type impurity introduced into the surface layer portion of the n type epitaxial layer 18 is lower than the n type impurity concentration of the surface layer portion of the n type epitaxial layer 18.

The surface layer region 21 is thereby formed in the surface layer portion of the n type epitaxial layer 18. The surface layer region 21 is a region, which includes the n type impurity and the p type impurity and in which the n type impurity concentration of the n type impurity is higher than the p type impurity concentration of the p type impurity.

The lower layer region 22, having an n type impurity concentration higher than the n type impurity concentration of the surface layer region 21 is formed in a layer in the n type epitaxial layer 18 below the surface layer region 21. A predetermined region of the n type epitaxial layer 18 that includes the surface layer region 21 and the lower layer region 22 is set as the n type diode region 20. In the present preferred embodiment, the n type diode region 20 is set to a quadrilateral shape in the plan view.

Next, referring to FIG. 33C, a silicon oxide film 92 is formed on a major surface of the n type epitaxial layer 18 (step S4 of FIG. 32). The silicon oxide film 92 may be formed by performing a thermal oxidation treatment method on the n type epitaxial layer 18. The silicon oxide film 92 may be formed by a CVD (Chemical Vapor Deposition) method instead of a thermal oxidation treatment method.

Next, portions of the silicon oxide film 92 corresponding to a region at which the n$^+$ type impurity region 25 is to be formed and a region at which the n$^+$ type contact regions 70A, 70B, and 70C are to be formed are removed (step S5 of FIG. 32). The unnecessary portions of the silicon oxide film 92 may be removed by photolithography and etching.

A first opening 93, exposing the region at which the n$^+$ type impurity region 25 is to be formed, and a second opening 94, exposing the region at which the n$^+$ type contact regions 70A, 70B, and 70C are to be formed, are thereby formed in the silicon oxide film 92.

Next, referring to FIG. 33D, a phosphorus deposition process is executed. In the phosphorus deposition process, first, a polycrystalline silicon 95 that includes phosphorus is deposited on the major surface of the n type epitaxial layer 18 (step S6 of FIG. 32).

More specifically, the polycrystalline silicon 95 is deposited on the major surface of the n type epitaxial layer 18 exposed from the first opening 93 of the silicon oxide film 92 and on the major surface of the n type epitaxial layer 18 exposed from the second opening 94 of the silicon oxide film 92.

Next, the phosphorus inside the polycrystalline silicon 95 is diffused into the surface layer portion of the n type epitaxial layer 18 by heat treatment. N$^+$ type regions 96, which become the bases of the n$^+$ type impurity region 25 and the n$^+$ type contact regions 70A, 70B, and 70C, are thereby formed in the surface layer portion of the n type epitaxial layer 18.

Next, referring to FIG. 33E, the silicon oxide film 92 is removed (step S7 of FIG. 32). In the phosphorus deposition process, a thin silicon oxide film (not shown) is further formed, through the heat treatment, at portions at which the polycrystalline silicon 95 and the major surface of the n type epitaxial layer 18 are in contact.

In the oxide film removing process (step S7 of FIG. 32), the thin silicon oxide film formed at the portions at which the polycrystalline silicon 95 and the major surface of the n type epitaxial layer 18 are in contact is also removed together with the silicon oxide film 92.

The portions of the major surface of the n type epitaxial layer 18 from which the thin silicon oxide film is removed become the first recess portion 26 and the second recess portion 71 (see FIG. 7A and FIG. 7B). As a matter of course, the introduction of phosphorus into the surface layer portion of the n type epitaxial layer 18 may be performed by the ion implantation method instead of the phosphorus deposition process.

Next, referring to FIG. 33F, the silicon oxide film 31 is formed on the major surface of the n type epitaxial layer 18 (step S8 of FIG. 32). The silicon oxide film 31 may be formed by performing a wet oxidation treatment method on the n type epitaxial layer 18. The silicon oxide film 31 may be formed by performing a thermal oxidation treatment on the n type epitaxial layer 18.

Next, a portion of the silicon oxide film 31 corresponding to a region at which the p type guard ring region 35 is to be formed is removed (step S9 of FIG. 32). The unnecessary portion of the silicon oxide film 31 may be removed by photolithography and etching. A third opening 97, exposing the region at which the p type guard ring region 35 is to be formed, is thereby formed in the silicon oxide film 31.

Next, the p type impurity is introduced in the surface layer portion of the n type epitaxial layer 18 exposed from the third opening 97 of the silicon oxide film 31 (step S10 of FIG. 32). The introduction of the p type impurity may be performed by the ion implantation method.

The p type impurity concentration of the p type impurity introduced into the surface layer portion of the n type epitaxial layer 18 is higher than the n type impurity concentration of the surface layer portion of the n type epitaxial layer 18. A p type region 98, which becomes the base of the p type guard ring region 35, is thereby formed in the surface layer portion of the n type epitaxial layer 18.

Next, referring to FIG. 33G, the n type impurity in the n$^+$ type region 96 and the p type impurity in the p type region 98 formed in the surface layer portion of the n type epitaxial layer 18 are diffused in the depth direction of the n type epitaxial layer 18 (step S11 of FIG. 32). This process may be performed by performing a heat treatment method (drive-in treatment method) on the n type epitaxial layer 18.

The n$^+$ type impurity region 25 and the n$^+$ type contact regions 70A, 70B, and 70C are thereby formed in the n type epitaxial layer 18 and, at the same time, the p type guard ring region 35 is formed in the surface layer portion of the n type epitaxial layer 18. In this process, the n$^+$ type impurity region 25 and the n$^+$ type contact regions 70A, 70B, and 70C that are comparatively high in n type impurity concentration become connected to the n$^+$ type silicon wafer 91.

With the method for manufacturing the SBD chip 1, the thickness T of the n type epitaxial layer 18 is set to not less than 2.0 μm and not more than 2.5 μm. The n$^+$ type impurity region 25, the n$^+$ type contact regions 70A, 70B, and 70C, and the p type guard ring region 35 can thus be formed diffusively in the depth direction of the n type epitaxial layer 18 at the same time.

For example, if the thickness T of the n type epitaxial layer 18 exceeds 3 μm (thickness T>3 μm), the n type impurity that forms the n$^+$ type impurity region 25 and the n$^+$ type contact regions 70A, 70B, and 70C is unlikely to reach the n$^+$ type silicon wafer 91.

Therefore, a heat treatment (drive-in treatment) must be applied to the n$^+$ type region 96 to form the n$^+$ type impurity region 25 and the n$^+$ type contact regions 70A, 70B, and 70C and thereafter, the p type region 98 that is to become the base of the p type guard ring 35 must be formed and a heat treatment (drive-in treatment) must further be performed on the p type region 98 to form the p type guard ring region 35.

If, in forming the n$^+$ type impurity region 25 and the p type guard ring region 35, drive-in treatments are applied in multiple stages, undesired diffusion of the n type impurity becomes a problem.

For example, the drive-in treatment performed when forming the p type guard ring region 35 will increase a risk of diffusion of the n type impurity from the n$^+$ type silicon wafer 91 into the n type epitaxial layer 18. A risk of diffusion of the n type impurity from the n$^+$ type impurity region 25, etc., into an unintended region of the n type epitaxial layer 18 is also increased at the same time.

Such undesired diffusion of the n type impurity leads to undesired increase of the n type impurity concentration of the n type epitaxial layer 18 and may thus become a cause that gives rise to increase of the reverse current IR, etc., described in FIG. 10 to FIG. 15.

On the other hand, with the method for manufacturing the SBD chip 1, the n+ type impurity region 25, the n+ type contact regions 70A, 70B, and 70C, and the p type guard ring region 35 can be formed by a single heat treatment (drive-in treatment).

With such a manufacturing method, the undesired diffusion of the n type impurity due to heat treatment can be suppressed and therefore a thermal history of the n type epitaxial layer 18 can be suppressed and a merit is provided in terms of realizing satisfactory electrical characteristics. In the point that such a manufacturing method can be applied, the SBD chip 1 may be said to have a merit in a structural aspect.

Next, referring to FIG. 33H, the USG film 32 is formed so as to embed the third opening 97 and cover the entire silicon oxide film 31 (step S12 of FIG. 32). The USG film 32 may be formed by the CVD method. The front surface insulating layer 11, including the silicon oxide film 31 and the USG film 32, is thereby formed on the major surface of the n type epitaxial layer 18.

Next, referring to FIG. 33I, portions of the front surface insulating layer 11 corresponding to regions, at which the first opening 33, exposing the n type diode region 20, the second opening 34, exposing the n+ type impurity region 25, and the contact holes 46A, 46B, and 46C, exposing the n+ type contact regions 70A, 70B, and 70C are to be formed, are removed (step S13 of FIG. 32).

The unnecessary portions of the front surface insulating layer 11 may be removed by photolithography and etching. The first opening 33, the second opening 34, and the contact holes 46A, 46B, and 46C are thereby formed in the front surface insulating layer 11.

Next, referring to FIG. 33J, the first conductor film 41, which includes a titanium nitride layer and/or a titanium layer, is formed on the front surface of the front surface insulating layer 11. The first conductor film 41 (titanium nitride layer and/or titanium layer) may be formed by a sputtering method.

More specifically, the first conductor film 41 is formed along the major surface of the n type epitaxial layer 18, exposed from the first opening 33, the second opening 34, and the contact holes 46A, 46B, and 46C, and the front surface of the front surface insulating layer 11, including inner wall surfaces of the first opening 33, the second opening 34, and the contact holes 46A, 46B, and 46C (step S14 of FIG. 32).

Next, a titanium silicide layer (not shown) is formed at portions of the n type epitaxial layer 18 in contact with the first conductor film 41 (step S15 of FIG. 32). The titanium silicide layer (not shown) may be formed by an RTA (Rapid Thermal Annealing) treatment method.

The titanium silicide layer is formed in a boundary region between the n type epitaxial layer 18 and the first conductor film 41 that includes the surface layer portion of the n type epitaxial layer 18.

The first conductor film 41 that is in contact with the n type diode region 20 inside the first opening 33 of the front surface insulating layer 11 forms a Schottky junction with the n type diode region 20. More specifically, the first conductor film 41 forms a Schottky junction with the surface layer region 21 of the n type diode region 20.

The first conductor film 41 that is in contact with the n+ type impurity region 25 inside the second opening 34 of the front surface insulating layer 11 forms an ohmic junction with the n+ type impurity region 25. The first conductor film 41 that is in contact with the n+ type contact regions 70A, 70B, and 70C inside the contact holes 46A, 46B, and 46C of the front surface insulating layer 11 forms ohmic junctions with the n+ type contact regions 70A, 70B, and 70C.

Next, the second conductor film 42, which includes an aluminum-copper alloy (Al—Cu alloy), is formed on the first conductor film 41. The second conductor film 42 may be formed by the sputtering method. The front surface electrode layer 12 that includes the first conductor film 41 and the second conductor film 42 is thereby formed.

Next, referring to FIG. 33K, unnecessary portions of the front surface electrode layer 12 are removed in a manner such that portions corresponding to the anode electrode layer 43, the cathode electrode layer 44, and the contact electrode layers 45A, 45B, and 45C remain (step S17 of FIG. 32).

The unnecessary portions of the front surface electrode layer 12 may be removed by photolithography and etching. The front surface electrode layer 12 that includes the anode electrode layer 43, the cathode electrode layer 44, and the contact electrode layers 45A, 45B, and 45C is thereby formed.

Next, referring to FIG. 33L, silicon nitride is deposited on the front surface electrode layer 12 to form the passivation film 81 that covers the front surface electrode layer 12 (step S18 of FIG. 32). The passivation film 81 may be formed by the CVD method.

Next, a photosensitive polyimide is coated so as to cover the passivation film 81 and form the resin film 82 (step S19 of FIG. 32). The top insulating layer 13 that includes the passivation film 81 and the resin film 82 is thereby formed.

Next, the resin film 82 is selectively exposed and developed to form a fourth opening 99 for the anode pad opening 83 and a fifth opening 100 for the cathode pad opening 84 in the resin film 82 (step S20 of FIG. 32).

Next, referring to FIG. 33M, unnecessary portions of the passivation film 81 are removed, for example, by etching using the resin film 82 as a mask. The anode pad opening 83, exposing the anode electrode layer 43, and the cathode pad opening 84, exposing the cathode electrode layer 44, are thereby formed in the top insulating layer 13.

Next, referring to FIG. 33N, an Ni film, a Pd film and an Au film are formed successively on the anode electrode layer 43, exposed from the anode pad opening 83, and the cathode electrode layer 44, exposed from the cathode pad opening 84, for example, by a plating treatment (step S21 of FIG. 32).

The first external terminal 6 and the second external terminal 7 that include Ni/Pd/Au laminated films are thereby formed. Thereafter, the n+ type silicon wafer 91 is cut selectively to cut out a plurality of individual pieces of SBD chips 1. The SBD chips 1 are manufactured thus.

Although a preferred embodiment of the present invention has been described above, the present invention may be implemented in yet other modes.

An SBD chip 101 having the structure shown in FIG. 34A and FIG. 34B may be adopted. FIG. 34A is a plan view of the SBD chip 101 according to a first modification example. FIG. 34B is a sectional view taken along line B-B shown in FIG. 34A.

In FIG. 34B, just the structure at the first major surface 14 side of the semiconductor layer 10 is shown. In FIG. 34A and FIG. 34B, arrangements corresponding to arrangements of the SBD chip 1 are provided with the same reference symbols and description thereof shall be omitted.

With the SBD chip 101, the first contact hole 46A does not include the first contact facing portion 53 and has just the pair of first contact line portions 54. The first contact electrode layer 45A does not include the first electrode facing portion 61 and has just the pair of first electrode line portions 62.

In the SBD chip 101, the structure besides the above is substantially the same as that of the SBD chip 1. The reduction of the forward voltage VF can be achieved with the SBD chip 101 of such a structure as well.

In the present modification example, a structure may be adopted where the first contact hole 46A has just one of either of the pair of first contact line portions 54. Also, in the present modification example, a structure may be adopted where the first contact electrode layer 45A has just one of either of the pair of first electrode line portions 62.

Also, in the present modification example, a structure may be adopted where the first contact hole 46A has just the first contact facing portion 53 and one first contact line portion 54. Also, in the present modification example, a structure may be adopted where the first contact electrode layer 45A has just the first electrode facing portion 61 and one first electrode line portion 62.

An SBD chip 102 having the structure shown in FIG. 35A and FIG. 35B may be adopted. FIG. 35A is a plan view of the SBD chip 102 according to a second modification example. FIG. 35B is a sectional view taken along line B-B shown in FIG. 35A.

In FIG. 35B, just the structure at the first major surface 14 side of the semiconductor layer 10 is shown. In FIG. 35A and FIG. 35B, arrangements corresponding to arrangements of the SBD chip 1 are provided with the same reference symbols and description thereof shall be omitted.

With the SBD chip 102, the first contact hole 46A is formed to be separated from the third contact hole 46C by the front surface insulating layer 11. The first contact electrode layer 45A is formed to be separated from the third contact electrode layer 45C. The first contact electrode layer 45A is electrically connected to the third contact electrode layer 45C (second contact electrode layer 45B) via the n⁺ type contact regions 70A, 70B, and 70C.

The first contact hole 46A has the first contact facing portion 53 and the pair of first contact line portions 54, and the first contact electrode layer 45A has the first electrode facing portion 61 and the pair of first electrode line portions 62. In the first peripheral region 51, the first contact electrode layer 45A is formed just along the non-facing region at which the anode electrode layer 43 does not face the cathode electrode layer 44.

In the SBD chip 102, the structure besides the above is substantially the same as that of the SBD chip 1. The reduction of the forward voltage VF can be achieved with the SBD chip 101 of such a structure as well.

In the present modification example, a structure may be adopted where the first contact hole 46A has just the first contact facing portion 53 and one first contact line portion 54. In the present modification example, a structure may be adopted where the first contact electrode layer 45A has just the first electrode facing portion 61 and one first electrode line portion 62.

In the present modification example, a structure may be adopted where the first contact hole 46A has just the first contact facing portion 53 or the pair of first contact line portions 54. In the present modification example, a structure may be adopted where the first contact electrode layer 45A has just the first electrode facing portion 61 or the pair of first electrode line portions 62.

An SBD chip 103 having the structure shown in FIG. 36A and FIG. 36B may be adopted. FIG. 36A is a plan view of the SBD chip 103 according to a third modification example. FIG. 36B is a sectional view taken along line B-B shown in FIG. 36A.

In FIG. 36B, just the structure at the first major surface 14 side of the semiconductor layer 10 is shown. In FIG. 36A and FIG. 36B, arrangements corresponding to arrangements of the SBD chip 1 are provided with the same reference symbols and description thereof shall be omitted.

With the SBD chip 103, one of the pair of first contact line portions 54 of the first contact hole 46A is formed so as to be continuous to the third contact hole 46C (second contact hole 46B). The other of the pair of first contact line portions 54 of the first contact hole 46A is formed to be separated from the third contact hole 46C (second contact hole 46B).

One of the pair of first electrode line portions 62 of the first contact electrode layer 45A is formed so as to be continuous to the third contact electrode layer 45C (second contact electrode layer 45B). The other of the pair of first electrode line portions 62 of the first contact electrode layer 45A is formed to be separated from the third contact electrode layer 45C (second contact electrode layer 45B).

The other first electrode line portion 62 of the first contact electrode layer 45A that is formed to be separated from the third contact electrode layer 45C (second contact electrode layer 45B) is electrically connected to the third contact electrode layer 45C (second contact electrode layer 45B) via the n⁺ type contact regions 70A, 70B, and 70C.

In the SBD chip 103, the structure besides the above is substantially the same as that of the SBD chip 1. The reduction of the forward voltage VF can be achieved with the SBD chip 103 of such a structure as well.

An SBD chip 104 having the structure shown in FIG. 37A and FIG. 37B may be adopted. FIG. 37A is a plan view of the SBD chip 104 according to a fourth modification example. FIG. 37B is a sectional view taken along line B-B shown in FIG. 37A.

In FIG. 37B, just the structure at the first major surface 14 side of the semiconductor layer 10 is shown. In FIG. 37A and FIG. 37B, arrangements corresponding to arrangements of the SBD chip 1 are provided with the same reference symbols and description thereof shall be omitted.

The first contact hole 46A does not have the first contact facing portion 53. One of the pair of first contact line portions 54 of the first contact hole 46A is formed so as to be continuous to the third contact hole 46C (second contact hole 46B).

The other of the pair of first contact line portions 54 of the first contact hole 46A is formed to be separated from the one first contact line portion 54 and the third contact hole 46C (second contact hole 46B).

The first contact electrode layer 45A does not have the first electrode facing portion 61. One of the pair of first electrode line portions 62 of the first contact electrode layer 45A is formed so as to be continuous to the third contact electrode layer 45C (second contact electrode layer 45B).

The other of the pair of first electrode line portions 62 of the first contact electrode layer 45A is formed to be separated from the one first electrode line portion 62 and the third contact electrode layer 45C (second contact electrode layer 45B).

The other first electrode line portion 62 of the first contact electrode layer 45A that is formed to be separated from the third contact electrode layer 45C (second contact electrode layer 45B) is electrically connected to the third contact electrode layer 45C (second contact electrode layer 45B) via the n⁺ type contact regions 70A, 70B, and 70C.

In the SBD chip 103, the structure besides the above is substantially the same as that of the SBD chip 1. The reduction of the forward voltage VF can be achieved with the SBD chip 103 of such a structure as well.

With the present modification example, the first contact hole 46A may include the first contact facing portion 53 and the first contact facing portion 53 may have a structure that is in communication with just the one first contact line portion 54 that is continuous to the third contact hole 46C (second contact hole 46B).

With the present modification example, the first contact hole 46A may include the first contact facing portion 53 and the first contact facing portion 53 may have a structure that is in communication with just the other first contact line portion 54 that is separated from the third contact hole 46C (second contact hole 46B).

With the present modification example, the first contact electrode layer 45A may include the first electrode facing portion 61 and the first electrode facing portion 61 may have a structure that is connected to just the one first electrode line portion 62 that is continuous to the third contact electrode layer 45C (second contact electrode layer 45B).

With the present modification example, the first contact electrode layer 45A may include the first electrode facing portion 61 and the first electrode facing portion 61 may have a structure that is connected to just the other first electrode line portion 62 that is separated from the third contact electrode layer 45C (second contact electrode layer 45B).

An SBD chip may be adopted that has a structure that combines the respective arrangements of the SBD chip 101, the SBD chip 102, the SBD chip 103, and the SBD chip 104 in any mode.

Further, an SBD chip 105 having the structure shown in FIG. 38A and FIG. 38B may be adopted. FIG. 38A is a plan view of the SBD chip 105 according to a fifth modification example. FIG. 38B is a sectional view taken along line B-B shown in FIG. 38A.

In FIG. 38B, just the structure at the first major surface 14 side of the semiconductor layer 10 is shown. In FIG. 38A and FIG. 38B, arrangements corresponding to arrangements of the SBD chip 1 are provided with the same reference symbols and description thereof shall be omitted.

The SBD chip 105 has substantially the same structure as the SBD chip 1 with the exception of not including the contact electrode layers 45A, 45B, and 45C and the contact holes 46A, 46B, and 46C and the exception that reduction of resistance value between the n type diode region 20 and the $n^+$ type impurity region 25 is achieved just by the $n^+$ type contact regions 70A, 70B, and 70C formed in the surface layer portion of the first major surface 14 of the semiconductor layer 10 (that is, the n type epitaxial layer 18). In FIG. 38A, the $n^+$ type contact regions 70A, 70B, and 70C are indicated by dot hatching.

With the SBD chip 105, the reduction of the resistance value between the n type diode region 20 and the $n^+$ type impurity region 25 can be achieved by the $n^+$ type contact regions 70A, 70B, and 70C, which are formed so as to surround the n type diode region 20, and the $n^+$ type impurity region 25.

Therefore, an effect of reducing the forward voltage VF can be obtained. The forward voltage VF can also be adjusted by just forming any single region or two regions selected from among the $n^+$ type contact regions 70A, 70B, and 70C.

Figure 39:
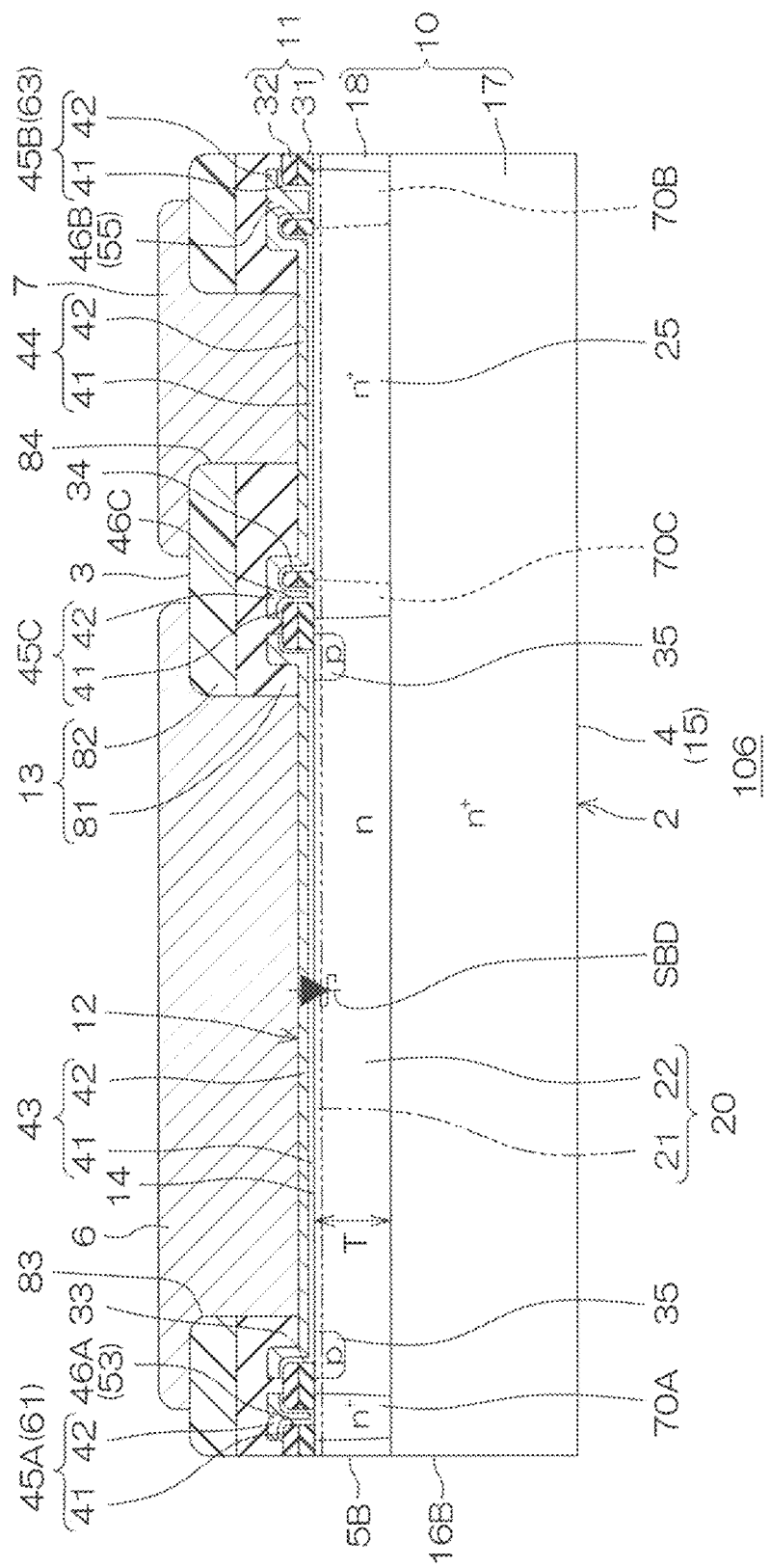
FIG. 39 is a sectional view of an SBD chip according to a sixth modification example.

An SBD chip 106 having the structure shown in FIG. 39 may be adopted. FIG. 39 is a sectional view of the SBD chip 106 according to a sixth modification example. In FIG. 39, arrangements corresponding to arrangements of the SBD chip 1 are provided with the same reference symbols and description thereof shall be omitted.

With the SBD chip 106, the anode pad opening 83 is formed so as to expose an inner region of the anode electrode layer 43 besides its peripheral edge. The anode pad opening 83 has a larger area than the area of the cathode pad opening 84.

The first external terminal 6 formed inside the anode pad opening 83 has, in the plan view, a larger area than the area of the second external terminal 7 formed inside the cathode pad opening 84. The first external terminal 6 faces substantially the entire n type diode region 20 in the plan view.

The same effects as the effects of the SBD chip 1 can be exhibited by the SBD chip 106 as well. Also, with the SBD chip 106, heat dissipation by the first external terminal 6 can be increased because the first external terminal 6 has a comparatively large area.

With each of the preferred embodiments described above, an arrangement in which the conductivity types of the respective semiconductor portions are inverted may be adopted. That is, a p type portion may be of an n type and an n type portion may be of a p type.

Also, the Schottky barrier diode according to the present invention is not restricted to an SBD chip (chip part) but may also be applied to a region of a portion of a semiconductor chip or as a semiconductor chip in a semiconductor device with a structure where a semiconductor chip is sealed (packaged) together with lead terminals by a molding resin.

A diode element according to the present invention may be applied to a region of a portion of a semiconductor chip in a semiconductor device that includes a semiconductor chip with various integrated circuits, such as an LSI (Large Scale Integration), SSI (Small Scale Integration), MSI (Medium Scale Integration), VLSI (Very Large Scale Integration), ULSI (Ultra-Very Large Scale Integration), etc., formed therein.

Examples of features extracted from the present specification and drawings are indicated below.

Electrical characteristics of a Schottky barrier diode include forward voltage and reverse current. An operating speed of a Schottky barrier diode becomes faster as the value of the forward voltage decreases and becomes slower as the value of the forward voltage increases.

A loss of a Schottky barrier diode increases as the value of the reverse current increases and decreases as the value of the reverse current decreases. A Schottky barrier diode having a forward voltage of comparatively low value and a reverse current of comparatively low value is thus demanded.

The forward voltage of a Schottky barrier diode increases and decreases in accordance with increase and decrease of a resistance value of a region in a semiconductor layer that forms a Schottky junction with an electrode, that is, a diode region. It may therefore be considered that by increasing an impurity concentration of the diode region, the resistance value of the diode region can be reduced and therefore the forward voltage can be reduced. However, there is a tradeoff that, when the impurity concentration of the diode region is increased, increase of leak current occurs in a region between the electrode and the diode region, and consequently, the reverse current increases.

The following Clause 1 to Clause 30 indicate an example of a Schottky barrier diode, having a feature of being made with one object being to achieve reduction of the forward voltage and suppression of increase of the reverse current, and a method for manufacturing the Schottky barrier diode.

[Clause 1] A Schottky barrier diode including a semiconductor layer having a first major surface at one side and a second major surface at another side, a diode region of a first conductivity type that is formed in a surface layer portion of the first major surface of the semiconductor layer and that has a concentration profile where a first conductivity type impurity concentration at a side of the first major surface of the semiconductor layer is lower than a first conductivity type impurity concentration at a side of the second major surface of the semiconductor layer, a first conductivity type impurity region formed in the surface layer portion of the semiconductor layer and electrically connected to the diode region, a first electrode layer formed on the first major surface of the semiconductor layer and forming a Schottky junction with the diode region, and a second electrode layer formed on the first major surface of the semiconductor layer and forming an ohmic junction with the first conductivity type impurity region.

The Schottky barrier diode according to Clause 1 includes the diode region of the first conductivity type that is formed in the surface layer portion of the first major surface of the semiconductor layer. The diode region has the concentration profile where the first conductivity type impurity concentration at the side of the first major surface of the semiconductor layer is lower than the first conductivity type impurity concentration at the side of the second major surface of the semiconductor layer.

Reduction of resistance value can thus be achieved in a region of the diode region at the side of the second major surface of the semiconductor layer at which the first conductivity type impurity concentration is comparatively high. Also, increase of resistance value can be achieved in a region of the diode region at the side of the first major surface of the semiconductor layer at which the first conductivity type impurity concentration is comparatively low.

Forward voltage can thereby be improved by the region of the diode region at the side of the second major surface of the semiconductor layer. Also, increase of reverse current can be suppressed by the region of the diode region at the side of the first major surface of the semiconductor layer. A Schottky barrier diode can thus be provided with which the reduction of the forward voltage and the suppression of increase of the reverse current can be achieved.

[Clause 2] The Schottky barrier diode according to Clause 1, wherein the diode region includes a surface layer region formed in a surface layer portion of the diode region and being relatively low in the first conductivity type impurity concentration, and a lower layer region formed at the side of the second major surface of the semiconductor layer with respect to the surface layer region and having a first conductivity type impurity concentration that is higher than the first conductivity type impurity concentration of the surface layer region.

[Clause 3] The Schottky barrier diode according to Clause 2, wherein the surface layer region of the diode region is a region, which includes a first conductivity type impurity and a second conductivity type impurity and with which the first conductivity type impurity concentration of the first conductivity type impurity is higher than a second conductivity type impurity concentration of the second conductivity type impurity.

[Clause 4] The Schottky barrier diode according to Clause 2 or 3, wherein the surface layer region of the diode region has a concentration profile where a slope of a tangent to the first conductivity type impurity concentration decreases from the first major surface toward the second major surface of the semiconductor layer and the lower layer region of the diode region has a concentration profile where the slope of the tangent to the first conductivity type impurity concentration increases from the first major surface toward the second major surface of the semiconductor layer.

[Clause 5] The Schottky barrier diode according to any one of Clauses 2 to 4, wherein the diode region has a concentration profile that includes a inflection point at which the slope of the tangent to the first conductivity type impurity concentration changes from decreasing to increasing in a boundary region between the surface layer region and the lower layer region.

[Clause 6] The Schottky barrier diode according to any one of Clauses 2 to 5, wherein the first conductivity type impurity concentration of the surface layer region is less than $1.0 \times 10^{16}$ cm$^{-3}$, and the first conductivity type impurity concentration of the lower layer region is not less than $1.0 \times 10^{16}$ cm$^{-3}$ and not more than $1.0 \times 10^{20}$ cm$^{-3}$.

[Clause 7] The Schottky barrier diode according to any one of Clauses 1 to 6, wherein the semiconductor layer has a laminated structure including a first conductivity type semiconductor substrate, and a first conductivity type semiconductor layer formed on the first conductivity type semiconductor substrate and having a first conductivity type impurity concentration lower than a first conductivity type impurity concentration of the first conductivity type semiconductor substrate, the diode region is formed using a region of a portion of the first conductivity type semiconductor layer, and the first conductivity type impurity region is formed in the first conductivity type semiconductor layer.

[Clause 8] The Schottky barrier diode according to Clause 7, wherein the first conductivity type semiconductor layer has a thickness of not less than 2.0 μm and not more than 3.0 μm.

[Clause 9] The Schottky barrier diode according to Clause 7, wherein the first conductivity type semiconductor layer has a thickness of not less than 2.0 μm and not more than 2.5 μm.

[Clause 10] The Schottky barrier diode according to Clause 7, wherein the first conductivity type semiconductor layer has a thickness of not less than 2.0 μm and not more than 2.2 μm.

[Clause 11] The Schottky barrier diode according to any one of Clauses 7 to 10, wherein the first conductivity type semiconductor layer has a specific resistance of not less than 0.4 Ω·cm and not more than 1.0 Ω·cm.

[Clause 12] The Schottky barrier diode according to any one of Clauses 7 to 10, wherein the first conductivity type semiconductor layer has a specific resistance of not less than 0.7 Ω·cm and not more than 1.0 Ω·cm.

[Clause 13] The Schottky barrier diode according to any one of Clauses 7 to 12, wherein the first conductivity type semiconductor substrate has a specific resistance of not less than 1.0 Ω·cm.

[Clause 14] The Schottky barrier diode according to any one of Clauses 1 to 13, further including a guard ring region of a second conductivity type that is formed in the semiconductor layer so as to surround the diode region.

[Clause 15] The Schottky barrier diode according to any one of Clauses 1 to 14, further including a contact electrode layer, which is formed on a peripheral region of the first major surface of the semiconductor layer that surrounds the first electrode layer, is electrically connected to the diode region via the semiconductor layer, and is electrically connected to the second electrode layer.

[Clause 16] The Schottky barrier diode according to Clause 15, wherein the peripheral region includes a region between a peripheral edge of the first electrode layer and a peripheral edge of the semiconductor layer, and the contact electrode layer is formed in the region, between the peripheral edge of the first electrode layer and the peripheral edge of the semiconductor layer, of the peripheral region.

[Clause 17] The Schottky barrier diode according to Clause 15 or 16, wherein the contact electrode layer is formed as a band in the peripheral region.

[Clause 18] The Schottky barrier diode according to any one of Clauses 15 to 17, further including a contact region of a first conductivity type, which is formed in a region of the surface layer portion of the semiconductor layer that faces the contact electrode layer and is electrically connected to the diode region and the contact electrode layer.

[Clause 19] The Schottky barrier diode according to any one of Clauses 1 to 17, further including a contact region of a first conductivity type, which is formed in a region of the surface layer portion of the semiconductor layer at a periphery of the diode region and is electrically connected to the diode region.

[Clause 20] The Schottky barrier diode according to Clause 18 or 19, wherein the contact region has a first conductivity type impurity concentration higher than the first conductivity type impurity concentration of the diode region.

[Clause 21] The Schottky barrier diode according to any one of Clauses 18 to 20, wherein the contact region has a first conductivity type impurity concentration equal to the first conductivity type impurity concentration of the first conductivity type impurity region.

[Clause 22] The Schottky barrier diode according to any one of Clauses 1 to 21, wherein the first conductivity type impurity region has a first conductivity type impurity concentration higher than the first conductivity type impurity concentration of the diode region.

[Clause 23] The Schottky barrier diode according to any one of Clauses 1 to 22, further including a first external terminal electrically connected to the first electrode layer, and a second external terminal electrically connected to the second electrode layer.

[Clause 24] The Schottky barrier diode according to any one of Clauses 1 to 23, where the semiconductor layer is formed in a rectangular shape in plan view, a length of a long side surface extending along a long direction of the semiconductor layer is not more than 1.6 mm, and a length of a short side surface extending along a short direction of the semiconductor layer is not more than 0.8 mm.

[Clause 25] The Schottky barrier diode according to any one of Clauses 1 to 24, wherein, a forward voltage between the first electrode layer and the second electrode layer is not more than 0.47 V when a forward current between the first electrode layer and the second electrode layer is 2 A.

[Clause 26] The Schottky barrier diode according to any one of Clauses 1 to 25, wherein, a reverse current between the first electrode layer and the second electrode layer is not more than $1.0 \times 10^{-3}$ A when a reverse voltage between the first electrode layer and the second electrode layer is 20 V.

[Clause 27] A method for manufacturing a Schottky barrier diode including a concentration thinning step of setting a diode region in a first conductivity type semiconductor layer and decreasing a first conductivity type impurity concentration in a surface layer portion of the diode region by introducing a second conductivity type impurity into the surface layer portion of the diode region, a step of forming a first conductivity type impurity region electrically connected to the diode region by introducing a first conductivity type impurity into a region of the first conductivity type semiconductor layer outside the diode region and thereafter making the first conductivity type impurity diffuse by a heat treatment, a step of forming a first electrode layer forming a Schottky junction with the diode region on the first conductivity type semiconductor layer, and a step of forming a second electrode layer forming an ohmic junction with the first conductivity type impurity region on the first conductivity type semiconductor layer.

With the method for manufacturing the Schottky barrier diode according to Clause 27, the concentration thinning step of decreasing the first conductivity type impurity concentration in the surface layer portion of the diode region by introducing the second conductivity type impurity into the surface layer portion of the diode region is executed.

The diode region is thereby formed that has a concentration profile where the first conductivity type impurity concentration at one major surface side of the first conductivity type semiconductor layer is lower than the first conductivity type impurity concentration at another major surface side of the first conductivity type semiconductor layer.

With the present diode region, reduction of resistance value can be achieved in a region of the diode region at a side of the other major surface of the first conductivity type semiconductor layer at which the first conductivity type impurity concentration is comparatively high, and increase of resistance value can be achieved in a region of the diode region at a side of the one major surface of the semiconductor layer at which the first conductivity type impurity concentration is comparatively low.

The forward voltage can thereby be improved by the region of the diode region at the side of the other major surface of the first conductivity type semiconductor layer. Also, the increase of the reverse current can be suppressed by the region of the diode region at the side of the one major surface of the first conductivity type semiconductor layer. A Schottky barrier diode, with which the reduction of the forward voltage and the suppression of increase of the reverse current can be achieved, can thus be manufactured and provided.

[Clause 28] The method for manufacturing a Schottky barrier diode according to Clause 27, further including a step where, after the concentration thinning step, the second conductivity type impurity is introduced into the surface layer portion of the first conductivity type semiconductor layer so as to surround the diode region and thereafter the second conductivity type impurity is made to diffuse by a heat treatment to form a guard ring region of the second conductivity type that surrounds the diode region.

[Clause 29] The method for manufacturing a Schottky barrier diode according to Clause 28, wherein the heat treatment for forming the first conductivity type impurity region and the heat treatment for forming the guard ring region are executed at the same time to form the first conductivity type impurity region and the guard ring region at the same time.

[Clause 30] The method for manufacturing a Schottky barrier diode according to any one of Clauses 27 to 29, further including a step of preparing, prior to the concentration thinning step, a first conductivity type semiconductor substrate, and a step of forming the first conductivity type semiconductor layer having a first conductivity type impurity concentration lower than the first conductivity type impurity concentration of the first conductivity type semiconductor substrate and having a thickness of not less than 2.0 μm and not more than 3.0 μm on the first conductivity type semiconductor substrate.

The present application corresponds to Japanese Patent Application No. 2016-231798 filed in the Japan Patent Office on Nov. 29, 2016, Japanese Patent Application No. 2016-231799 filed in the Japan Patent Office on Nov. 29, 2016, and Japanese Patent Application No. 2017-206209 filed in the Japan Patent Office on Oct. 25, 2017 and the entire disclosures of these applications are incorporated herein by reference.

While preferred embodiments of the present invention have been described in detail above, these are merely specific examples used to clarify the technical content of the present invention, and the present invention should not be interpreted as being limited to these specific examples, and the scope of the present invention shall be limited only by the appended claims.

What is claimed is:

1. A Schottky barrier diode comprising:
a semiconductor layer, having a major surface;
a diode region of a first conductivity type, formed in a surface layer portion of the semiconductor layer;
a first conductivity type impurity region, formed in the surface layer portion of the semiconductor layer and electrically connected to the diode region;
a first electrode layer, formed on the major surface of the semiconductor layer and forming a Schottky junction with the diode region;
a second electrode layer, formed on the major surface of the semiconductor layer and forming an ohmic junction with the first conductivity type impurity region; and
a contact electrode layer, formed on a peripheral region of the major surface of the semiconductor layer surrounding the first electrode layer so as to be electrically connected to the diode region via the semiconductor layer and being electrically connected to the second electrode layer;
wherein a breakdown voltage between the first electrode layer and the second electrode layer is not less than 20 V.

2. The Schottky barrier diode according to claim 1, wherein the peripheral region includes a region between a peripheral edge of the first electrode layer and a peripheral edge of the semiconductor layer, and
the contact electrode layer is formed in the region, between the peripheral edge of the first electrode layer and the peripheral edge of the semiconductor layer, of the peripheral region.

3. The Schottky barrier diode according to claim 1, wherein the contact electrode layer is continuous to the second electrode layer and is directly connected to the second electrode layer.

4. The Schottky barrier diode according to claim 3, wherein the contact electrode layer is led out as a band from the second electrode layer so as to sandwich the first electrode layer.

5. The Schottky barrier diode according to claim 3, wherein the contact electrode layer is led out as a band from the second electrode layer so as to surround the first electrode layer, and
an endless electrode film, surrounding the first electrode layer, is formed by the second electrode layer and the contact electrode layer.

6. The Schottky barrier diode according to claim 1, wherein the contact electrode layer is formed across an interval from the second electrode layer and is electrically connected to the second electrode layer via the semiconductor layer.

7. The Schottky barrier diode according to claim 6, wherein the first electrode layer includes a facing region, facing the second electrode layer, and a non-facing region, not facing the second electrode layer, and
the contact electrode layer is formed so as to at least conform to the non-facing region of the first electrode layer.

8. The Schottky barrier diode according to claim 6, wherein the contact electrode layer includes a facing portion, facing the second electrode layer across the first electrode layer, and a line portion, led out toward the second electrode layer side from the facing portion and conforming to a peripheral edge of the first electrode layer.

9. The Schottky barrier diode according to claim 6, wherein the contact electrode layer extends as a band along the peripheral edge of the first electrode layer.

10. The Schottky barrier diode according to claim 1, wherein the contact electrode layer includes a first portion, continuous to the second electrode layer and directly connected to the second electrode layer, and a second portion, formed across an interval from the first portion and the second electrode layer and electrically connected to the second electrode layer via the semiconductor layer.

11. The Schottky barrier diode according to claim 10, wherein the first portion and the second portion of the contact electrode layer are respectively formed as bands along the peripheral edge of the first electrode layer.

12. The Schottky barrier diode according to claim 1, further comprising: a contact region of a first conductivity type, formed in a region of the surface layer portion of the semiconductor layer at a periphery of the diode region and electrically connected to the diode region.

13. The Schottky barrier diode according to claim 12, wherein the contact region is formed at least in a region of the surface layer portion of the semiconductor layer facing the contact electrode layer and is electrically connected to the diode region and the contact electrode layer.

14. The Schottky barrier diode according to claim 12, wherein the contact region is electrically connected to the first conductivity type impurity region, and
the contact electrode layer is electrically connected to the second electrode layer via the contact region and the first conductivity type impurity region.

15. The Schottky barrier diode according to claim 12, wherein the contact region has a first conductivity type impurity concentration higher than a first conductivity type impurity concentration of the diode region.

16. The Schottky barrier diode according to claim 12, wherein the contact region has a first conductivity type impurity concentration equal to a first conductivity type impurity concentration of the first conductivity type impurity region.

17. The Schottky barrier diode according to claim 1, wherein the first conductivity type impurity region has a first conductivity type impurity concentration higher than a first conductivity type impurity concentration of the diode region.

18. The Schottky barrier diode according to claim 1, further comprising: a first external terminal, electrically connected to the first electrode layer; and
a second external terminal, electrically connected to the second electrode layer.

19. The Schottky barrier diode according to claim 1, wherein the semiconductor layer is formed in a rectangular shape in plan view,
a length of a long side surface extending along a long direction of the semiconductor layer is not more than 1.6 mm, and a length of a short side surface extending along a short direction of the semiconductor layer is not more than 0.8 mm.

20. The Schottky barrier diode according to claim 1, wherein the semiconductor layer is formed in a rectangular shape in plan view,
a length of a long side surface extending along a long direction of the semiconductor layer is not more than 1.0 mm, and
a length of a short side surface extending along a short direction of the semiconductor layer is not more than 0.6 mm.

21. The Schottky barrier diode according to claim 1, wherein, when a forward current between the first electrode layer and the second electrode layer is 2 A, a forward voltage between the first electrode layer and the second electrode layer is not more than 0.47 V.

22. The Schottky barrier diode according to claim 1, wherein, when a forward current between the first electrode layer and the second electrode layer is 2 A, a forward voltage between the first electrode layer and the second electrode layer is not more than 0.45 V.

23. The Schottky barrier diode according to claim 1, wherein, when a forward current between the first electrode layer and the second electrode layer is 2 A, a forward voltage between the first electrode layer and the second electrode layer is not more than 0.44 V.

24. The Schottky barrier diode according to claim 1, wherein, when a forward current between the first electrode layer and the second electrode layer is 2 A, a forward voltage between the first electrode layer and the second electrode layer is less than 0.44 V.

25. The Schottky barrier diode according to claim 1, wherein, when a reverse voltage between the first electrode layer and the second electrode layer is 20 V, a reverse current between the first electrode layer and the second electrode layer is not more than $1.0 \times 10^{-3}$ A.

26. The Schottky barrier diode according to claim 1, wherein, when a reverse voltage between the first electrode layer and the second electrode layer is 10 V, a reverse current between the first electrode layer and the second electrode layer is not more than $1.0 \times 10^{-4}$ A.

27. The Schottky barrier diode according to claim 1, wherein, when a reverse voltage between the first electrode layer and the second electrode layer is not less than 5 V, a parasitic capacitance between the first electrode layer and the second electrode layer is not more than 100 pF.

28. The Schottky barrier diode according to claim 1, wherein, when a reverse voltage between the first electrode layer and the second electrode layer is not less than 5 V, a parasitic capacitance between the first electrode layer and the second electrode layer is not more than 50 pF.

* * * * *